US012813013B2

(12) United States Patent
Wang et al.

(10) Patent No.: US 12,813,013 B2
(45) Date of Patent: Nov. 24, 2026

(54) MICROSTRUCTURE ENHANCED ABSORPTION PHOTOSENSITIVE DEVICES

(71) Applicant: W&WSens Devices, Inc., Los Altos, CA (US)

(72) Inventors: Shih-Yuan Wang, Palo Alto, CA (US); Shih-Ping Wang, Los Altos, CA (US)

(73) Assignee: W&WSens Devices, Inc., Los Altos, CA (US)

(*) Notice: Subject to any disclaimer, the term of this patent is extended or adjusted under 35 U.S.C. 154(b) by 0 days.

(21) Appl. No.: 19/036,506

(22) Filed: Jan. 24, 2025

(65) Prior Publication Data

US 2025/0194293 A1 Jun. 12, 2025

Related U.S. Application Data

(60) Division of application No. 18/822,880, filed on Sep. 3, 2024, now Pat. No. 12,243,948, which is a division
(Continued)

(51) Int. Cl.
*H10F 77/122* (2025.01)
*H10F 30/223* (2025.01)
(Continued)

(52) U.S. Cl.
CPC ......... *H10F 77/703* (2025.01); *H10F 30/223* (2025.01); *H10F 77/122* (2025.01);
(Continued)

(58) Field of Classification Search
CPC .. H10F 39/014; H10F 39/024; H10F 39/8027; H10F 39/806; H10F 39/8067;
(Continued)

(56) References Cited

U.S. PATENT DOCUMENTS 5,315,147 A 5/1994 Solomon
5,759,292 A 6/1998 Arimoto et al.
(Continued)

FOREIGN PATENT DOCUMENTS

CN 1802758 A 7/2006
CN 101675532 A 3/2010
(Continued)

OTHER PUBLICATIONS

Photoconverter with quantum efficiency adaptations (Year: 2022).*
(Continued)

*Primary Examiner* — Eduardo A Rodela
(74) *Attorney, Agent, or Firm* — Wissing Miller LLP

(57) ABSTRACT

Techniques for enhancing the absorption of photons in semiconductors with the use of microstructures are described. The microstructures, such as pillars and/or holes, effectively increase the effective absorption length resulting in a greater absorption of the photons. Using microstructures for absorption enhancement for silicon photodiodes and silicon avalanche photodiodes can result in bandwidths in excess of 10 Gb/s at photons with wavelengths of 850 nm, and with quantum efficiencies of approximately 90% or more.

15 Claims, 48 Drawing Sheets

Related U.S. Application Data of application No. 18/385,213, filed on Oct. 30, 2023, now Pat. No. 12,087,871, which is a continuation-in-part of application No. 18/113,474, filed on Feb. 23, 2023, which is a division of application No. 17/707,429, filed on Mar. 29, 2022, now Pat. No. 11,621,360, which is a division of application No. 17/532,831, filed on Nov. 22, 2021, now Pat. No. 11,309,444, which is a continuation-in-part of application No. 17/182,954, filed on Feb. 23, 2021, now Pat. No. 11,791,432, which is a division of application No. 16/528,958, filed on Aug. 1, 2019, now Pat. No. 11,121,271, which is a continuation-in-part of application No. 15/797,821, filed on Oct. 30, 2017, now Pat. No. 10,446,700, which is a continuation-in-part of application No. 14/947,718, filed on Nov. 20, 2015, now Pat. No. 10,622,498, which is a continuation of application No. PCT/US14/39208, filed on May 22, 2014.

(60) Provisional application No. 61/826,446, filed on May 22, 2013, provisional application No. 61/843,021, filed on Jul. 4, 2013, provisional application No. 61/905,109, filed on Nov. 15, 2013, provisional application No. 61/834,873, filed on Jun. 13, 2013.

(51) Int. Cl.
*H10F 77/1226* (2025.01)
*H10F 77/14* (2025.01)
*H10F 77/40* (2025.01)
*H10F 77/70* (2025.01)

(52) U.S. Cl.
CPC ......... *H10F 77/1226* (2025.01); *H10F 77/14* (2025.01); *H10F 77/1437* (2025.01); *H10F 77/147* (2025.01); *H10F 77/413* (2025.01)

(58) Field of Classification Search
CPC ............... H10F 71/121; H10F 71/1212; H10F 71/1215; H10F 77/14; H10F 77/147; H10F 77/40; H10F 77/413; H10F 77/488; H10F 77/70; H10F 77/703; H10F 30/223; H10F 77/122; H10F 77/1226; H10F 77/1437; H10F 77/143
See application file for complete search history.

(56) References Cited

U.S. PATENT DOCUMENTS 6,879,014 B2 4/2005 Wagner et al.
7,276,749 B2 10/2007 Martin et al.
7,396,696 B2 7/2008 Kim et al.
7,525,170 B2 4/2009 Hsu et al.
7,646,943 B1 1/2010 Wober
8,022,390 B1 9/2011 Kim et al.
8,106,289 B2 * 1/2012 Dutta .................... H10F 77/148 136/258
8,129,710 B2 3/2012 Cho et al.
8,207,064 B2 6/2012 Bandyopadhyay et al.
8,274,122 B2 9/2012 Shimotsusa
8,357,960 B1 * 1/2013 Dutta ..................... B82Y 20/00 257/292
8,378,339 B2 2/2013 Nomura et al.
8,390,036 B2 3/2013 Goto
8,558,336 B2 10/2013 Su et al.
8,680,591 B2 3/2014 Haddad et al.
8,946,675 B2 2/2015 Yu et al.
9,000,492 B2 4/2015 Suzuki et al.
9,184,202 B2 11/2015 Dutta
9,209,320 B1 12/2015 Webster
9,263,519 B2 2/2016 Lal et al.
9,299,865 B2 3/2016 Marty et al.
9,331,116 B2 5/2016 Webster
9,406,824 B2 * 8/2016 Hazeghi .................. H10F 10/12
9,515,218 B2 12/2016 Yu et al.
9,871,147 B2 1/2018 Kotani et al.
9,876,045 B2 1/2018 Komori et al.
10,411,053 B2 9/2019 Yokogawa
10,522,582 B2 12/2019 Maruyama et al.
10,600,930 B2 3/2020 Suzuki et al.
11,037,794 B2 * 6/2021 Xu ...................... H01L 21/3083
11,211,419 B2 * 12/2021 Wu ....................... H10F 39/199
11,309,444 B1 4/2022 Wang et al.
11,594,657 B2 2/2023 Dheeraj et al.
11,621,360 B2 * 4/2023 Wang ..................... G02B 1/005 257/431
11,728,457 B2 8/2023 Sung
11,830,954 B2 * 11/2023 Wang .................... H10F 77/122
2004/0157354 A1 8/2004 Kuriyama et al.
2005/0145779 A1 7/2005 Mochizuki et al.
2007/0049028 A1 * 3/2007 Subramanian ......... B82Y 40/00 438/689
2008/0083963 A1 * 4/2008 Hsu ....................... H10F 77/147 257/431
2008/0157141 A1 7/2008 Han
2008/0259981 A1 10/2008 Wang et al.
2010/0116332 A1 5/2010 Counil et al.
2010/0193022 A1 8/2010 Hong et al.
2010/0271524 A1 10/2010 Venezia et al.
2010/0308428 A1 12/2010 Okamoto et al.
2010/0320444 A1 12/2010 Dutta
2011/0156195 A1 6/2011 Tivarus et al.
2011/0297214 A1 12/2011 Kim et al.
2011/0309331 A1 12/2011 Yu et al.
2012/0012741 A1 1/2012 Vasylyev
2012/0033119 A1 2/2012 Shinohara
2012/0049044 A1 3/2012 Kuboi
2012/0126286 A1 5/2012 Na et al.
2012/0153124 A1 6/2012 Yu et al.
2012/0153127 A1 6/2012 Hirigoyen et al.
2012/0153416 A1 6/2012 Tanaka et al.
2012/0196401 A1 8/2012 Graham et al.
2012/0255603 A1 10/2012 Yu et al.
2012/0313204 A1 12/2012 Haddad et al.
2013/0014814 A1 1/2013 Han et al.
2013/0094865 A9 4/2013 Pinguet et al.
2013/0125965 A1 5/2013 Hazeghi et al.
2013/0167915 A1 7/2013 Moslehi et al.
2014/0016660 A1 1/2014 Lunev et al.
2014/0167066 A1 6/2014 Kashima et al.
2015/0096613 A1 4/2015 Tjahjono et al.
2016/0126381 A1 * 5/2016 Wang ...................... H10F 77/14
2016/0181309 A1 * 6/2016 Uehira ................ H10F 39/8063 257/432
2016/0240579 A1 8/2016 Sun et al.
2016/0254407 A1 * 9/2016 Wang ...................... H10F 77/14
2017/0141153 A1 5/2017 Lee et al.
2017/0141243 A1 5/2017 Kotani et al.
2017/0263798 A1 9/2017 Suzuki et al.
2018/0012918 A1 1/2018 Na et al.
2018/0033895 A1 2/2018 Mazzillo et al.
2018/0102442 A1 4/2018 Wang et al.
2018/0182806 A1 * 6/2018 Jin ........................ H10F 39/805
2019/0019899 A1 1/2019 Wang et al.
2019/0166317 A1 5/2019 Tanaka et al.
2020/0006407 A1 1/2020 Yokogawa
2020/0006416 A1 1/2020 Baba et al.
2020/0075656 A1 3/2020 Lee et al.
2020/0083389 A1 3/2020 Wu et al.
2020/0083390 A1 3/2020 Wu et al.
2020/0135776 A1 4/2020 Finkelstein
2020/0266231 A1 8/2020 Cheng et al.
2020/0266232 A1 8/2020 Cheng et al.
2021/0305440 A1 9/2021 Zang et al.
2022/0102563 A1 * 3/2022 Wang ..................... G02B 1/005
2022/0320174 A1 * 10/2022 Yang ..................... H10F 39/811

(56) References Cited

U.S. PATENT DOCUMENTS

| | | | | |
|---|---|---|---|---|
| 2023/0238468 A1* | 7/2023 | Kim | H10F 77/488 | |
| | | | 136/256 | |
| 2024/0170519 A1* | 5/2024 | Sakamoto | H10F 39/8027 | |

FOREIGN PATENT DOCUMENTS

| | | | | |
|---|---|---|---|---|
| CN | 106129169 A | 11/2016 | | |
| CN | 103956403 | 2/2017 | | |
| CN | 109155340 A | 1/2019 | | |
| EP | 0940854 | 9/1999 | | |
| EP | 2172974 | 4/2010 | | |
| JP | 02502326 | 7/1990 | | |
| JP | 2002314116 | 10/2002 | | |
| JP | 2007013065 | 1/2007 | | |
| JP | 2007129024 | 5/2007 | | |
| JP | 2018508970 | 3/2018 | | |
| KR | 20080101301 | 11/2008 | | |
| WO | 8905043 | 6/1989 | | |
| WO | 0103255 | 1/2001 | | |
| WO | 2011085297 | 7/2011 | | |
| WO | 2019018846 | 1/2019 | | |
| WO | 2019089437 | 5/2019 | | |
| WO | WO-2022209249 A1 * | 10/2022 | | H10F 39/8027 |

OTHER PUBLICATIONS

Yahaya, NA, Characterization of light absorption in thin-film silicon with periodic nanohole arrays, Mar. 11, 2013/vol. 21, No. 5/Optics Express 5924-5930. (7 pages).

Tom J. Savenije, Photogeneration and transport of charge carriers in a porphyrin p/n heterojunction, Physical Review B, vol. 55, No. 15 (Apr. 1997), pp. 9685-9692.

Omit Salan et al., Synthesis, characterization, electrical and dielectric permittivity measurements of 2,9,16,23-tetra(4-ferrocenylimino-3-nitrophenoxy)phthalocyanines, Journal of Porphyrins and Phthalocyanines, vol. 10 (2006), pp. 1263-1270.

Teresa M. Figueira-Duarte et al., Pyrene-Based Materials for Organic Electronics, Chemical Reviews, vol. 111 (2011), pp. 7260-7314.

Zhihong Huang et al., Microstructured silicon photodetector, Applied Physics Letter, vol. 89 (2006), pp. 033506-1 to -3.

Richard A Myers et al., Enhancing near-infrared avalanche photodiode performance by femtosecond laser microstructuring, Applied Optics, vol. 45, No. 35 (Dec. 2006), pp. 8825-8831.

Abbas El Gamal et al., CMOS Image Sensors, IEEE Circuits & Devices Magazine (2005), pp. 6-20.

Eric R. Fossum, CMOS Image Sensors: Electronic Camera-On-A-Chip, IEEE Transactions on Electron Devices, vol. 44, No. 10 (Oct. 1997), pp. 1689-1698.

Sunetra Mendis et al., CMOS Active Pixel Image Sensor, IEEE Transactions on Electron Devices, vol. 41, No. 3 (Mar. 1994), pp. 452-453.

Renato Turchetta et al., Introduction to CMOS Image Sensors, Molecular ExpressionsTM Optical Microscopy Primer: Digital Imaging in Optical Microscopy-Introduction to CMOS Image Sensors (Jul. 16, 2004), pp. 1-9, available at https://web.archive.org/web/20120508153832/https://micro.magnet.fsu.edu/primer/digitalimaging/cmosimagesensors.html.

Electrical Engineering Dictionary—CRCnetBase (Phillip A Laplante editor-in-chief, CRC Press LLC 2000), pp. 1-6.

S.M. Sze et al., Semiconductor Devices—Physics and Technology (John Wiley & Sons, Inc. 3d ed. 2012), pp. 205-210, 325-26, 392-400, 416-417, 466-67.

John P. Uyemura, CMOS Logic Circuit Design (Kluwer Academic Publishers 2002), pp. 64, 74-102, 315-17, 458-60.

Khalil Jumah Tawfiq Hamam, Organic Solar Cells Based on High Dielectric Constant Materials: An Approach to Increase Efficiency (Jun. 2013) (Ph.D. dissertation, Western Michigan University), pp. 1-122.

P. Kalugasalam et al., Dielectric and AC Conduction Studies of Lead Phthalocyanine Thin Film, Chalcogenide Letters, vol. 6, No. 9 (Sep. 2009), pp. 469-476.

Leonard Rubin et al., Ion Implantation in Silicon Technology, Industrial Physicist, 9(3), (Jun./Jul. 2003), pp. 12-15.

Jurgen Michel et al., Advances in fully CMOS integrated photonic devices, Proceedings of SPIE, vol. 6477 (2007), p. 64770P-1 to -11.

Mark Beals et al., Process Flow Innovations for Photonic Device Integration in CMOS, Proceedings of SPIE, vol. 6898 (2008), pp. 689804-1 to-14.

Donald A Neaman, Semiconductor Physics and Devices - Basic Principles (McGraw Hill 3d ed. 2003), pp. 247-250, 260-61.

Matthew Sauceda, Porphyrin Thin Film Dielectrics, SUNFEST Technical Report TR-CST01NOV04, Center for Sensor Technologies, Univ. of Pennsylvania, Philadelphia, PA (2004), pp. 181-198.

N. Venkatramaiah et al., Spectroscopic and dielectric studies of meso-tetrakis(p. sulfonatophenyl) porphyrin doped hybrid borate glasses, Journal of Alloys and Compounds, vol. 509 (2011), pp. 2797-2803.

M.E. Azim-Araghi et al., Electrical and optical properties of an organic semiconductor metal-free phthalocyanine (C32H18N8), Eur. Phys. J. Appl. Phys. (2012), vol. 58, pp. 30201-p. 1 to 30201-p. 6.

M.M. El-Nahas et al., Structural and optical properties of thermally evaporated zinc phthalocyanine thin films, Proc. 2nd Saudi Sc. Conf. (Mar. 2004), pp. 277-293.

M.M. El-Nahas et al., Structural and optical properties of Ni (II) tetraphenyl porphyrin thin films, Eur. Phys. J. Appl. Phys. (2012), vol. 57, pp. 30201-p. 1 to 30201-p. 13.

Horst Zimmerman, Integrated Silicon Optoelectronics (Springer. 2d ed. 2010), pp. 1-7.

Martin A Green, Self-consistent optical parameters of intrinsic silicon at 300K including temperature coefficients, Solar Energy Materials & Solar Cells, vol. 92, (2008), pp. 1305-1310.

P.A. Lane et al., Electroabsorption studies of phthalocynine/perylene solar cells, Solar Energy Materials & Solar Cells, vol. 63, (2000), pp. 3-13.

Rei Kitamura et al., Optical constants of silica glass from extreme ultraviolet to far infrared at near room temperature, Applied Optics, vol. 46, No. 33 (Nov. 20, 2007), pp. 8118-8133.

H. H. Li, Refractive Index of Silicon and Germanium and Its Wavelength and Temperature Derivatives, J. Phys. Chem. Ref. Data, vol. 9, No. 3 (1980), pp. 561-658.

Chen ShuoFu et al., A comprehensive consideration of bias voltage and temperature to extract the intrinsic frequency response of photodiodes, Chinese Science Bulletin, vol. 55, No. 32 (2010), pp. 3727-3733.

Richard S. Quimby, Photonics and Lasers—An Introduction (John Wiley & Sons, Inc. 2006), pp. 249-279.

A Vandenbroucke et al., Influence of temperature and bias voltage on the performance of a high resolution PET detector built with position sensitive avalanche photodiodes, IOP Publishing for Sissa Medialab (2012), pp. 1-30.

Electrical Engineering Dictionary—CRCnetBase (Phillip A Laplante editor-in-chief, CRCPress LLC 2000), pp. 1-10.

Richard Rhoad et al., Geometry for Enjoyment and Challenge (Houghton Mifflin 1997), p. 236.

Japanese Office Action in corresponding Japanese application No. 2020-131831, dated Oct. 7, 2024.

B. F. Levin et al., 1 GB/s Si High Quantum Efficiency Monolithically Integrable, Applied Physics Letters, AIP Publishing LLC, vol. 66, No. 22, May 29, 1995, pp. 2984-2986.

Beausoleil, Nanoelectronic and Nanophotonic Interconnect, The emerging integrated circuit interconnection bottleneck may be overcome if tiny, efficient photon-transport waveguides and small transceivers for photon-electron information exchange can be developed, 18 pages, Jan. 29, 2007; revised Sep. 25, 2007.

Chang-Fu Han et al., Deep Trench Isolation and Inverted Pyramid Array Structures Used to Enhance Optical Eciency of Photodiode in CMOS Image Sensor via Simulations, Department of Mechanical Engineering, National Cheng Kung University, Tainan 701, Taiwan, May 28, 2020, pp. 1-14.

(56) References Cited

OTHER PUBLICATIONS

E. Ponizovskaya Devine et al., Single Microhole per Pixel in CMOS Image Sensors with Enhanced Optical Sensitivity in Near-Infrared, IEEE Sensors Journal, 2021, pp. 1-7.
Gao Yang et al., Photon-trapping Microstructures Enable High-speed High-efficiency Silicon Photodiodes, Nature Photonics, vol. 11, No. 5, Apr. 3, 2017, pp. 301-308.
Jonghoon Park et al., Pixel Technology for Improving IR Quantum Efficiency of Backside-illuminated CMOSImage Sensor, 1System LSI Division, Samsung Electronics Co., Ltd, 2Foundry Division, Samsung Electronics Co., Ltd. Yongin-city, Gyeonggi-do, Korea, 4 pages. Year Published: 2019.
Sozo Yokogawa et al., IR Sensitivity Enhancement of CMOS Image Sensor with Diffractive Light Trapping Pixels, Scientific Reports, Sony Semiconductor Solutions Corporation, Atsugi Tee., 4-14-1 Asahi-cho, Atsugi, Kanagawa, 243-0014, Japan, Jun. 19, 2017, 9 page.
Sozo Yokogawa, Nanophotonics Contributions to State-of-the-art CMOS Image Sensors, Sony Semiconductor Solutions Corporation, Kanagawa, Japan, 2019, 4 pages.
Weishuai Chen, Surface silicon nanostructure for enhancement of blue light absorption, Physics 32 (2022), Published by Elsevier B.V., pp. 2211-3797, 2021.
Takashi Takemoto, A 50-GB/s High-Sensitivity (-9.2 dBm) Low-Power (7.9 pJ/bit) Optical Receiver Based on 0.18-μm SiGe BiCMOS Technology, IEEE Journcal of Solid-State Circuits, vol. 53, No. May 2018, pp. 1518-1538.
Dhruv Patel, A 112 GB/s -8.2 dBm Sensitivity4-PAM LinearTIA in 16nm CMOS with Co-Packaged Photodiodes Dhruv Patel, IEEE CICC 2022, 2 pages.
A. Sammak, A 270x1 Ge-on-Si photodetector array for sensitive infrared imaging, Optical Sensing and Detection III, vol. 9141, 2014, 7 pages.
Shou-Gwo Wuu, A Review of 3-Dimensional Wafer Level Stacked Backside Illuminated CMOS Image Sensor Process Technologies, IEEE Transactions on Eelctron Devices, 2022, pp. 1-13.
Michael Oehme, Backside Illuminated "Ge-on-Si" NIR Camera, IEEE Sensors Journal, vol. 21, No. 17, Sep. 1, 2021, pp. 18696-18705.
Densely packed 1.1 um-band vertical cavity surface emitting laser array for co-packaged optics, Japanese Journal of Applied Physics, 2022, pp. 1-16.
Anastassios Mavrokefalos, Efficient Light Trapping in Inverted Nanopyramid Thin Crystalline Silicon Membranes for Solar Cell Applications, NANO Letters, Department of Mechanical Engineering, Massachusetts Institute of Technology, 2012, vol. 12, pp. 2792-2796.
Jinwen Song, High-efficiency and high-speed germanium photodetector enabled by multiresonant photonic crystal, Nanophotonics 2020, pp. 1-25.
Hilal Cansizoglu, IEEE PTL-Dramatically Enhanced Efficiency Ultra-fast Silicon MSM Photodiodes Photon-trapping Structures, IEEE Photonics Technology Letter, 2019, pp. 1-4.
Eli Yablonovitch, Intensity Enhancement Textured Optical Sheets Solar Cells, IEEE Transactions on Electron Devices, vol. ED-29, No. 2, Feb. 1982, pp. 300-305.
Jun Yang, Light Trapping in Conformal Graphene/Silicon Nanoholes for High Performance Photodetectors, Applied Materials & Interfaces, 2019, vol. 11, pp. 30421-30429.
William Shockley, Detailed Balance Limit-of-efficiency of pn Junction Solar Cells, Journal of Applied Physics, vol. 32, No. 3, Mar. 1961, pp. 510-519.
Y. Ebiko, Low Power Consumption and High Resolution 1280X960 Gate Assisted Photonic Demodulator Pixel for Indirect Time of Flight, IEEE, 2020, pp. 721-724.
Clifford King, Monolithic Germanium SWIR Imaging Array, Research Gate, Infrared Technology and Applications XXXI, 2008, vol. 6940, 10 pages.
Willie Padilla, Imaging with Metamaterials, Nature Reviews Physics, https://www.nature.com/natrevphys, 16 pages.
Orit Skorka, Tradeoffs With RGB-IR Image Sensors, IEEE Transaction on Electron Devices, 2022, pp. 1-9.
Sungbong Park, A 64Mpixel CMOS Image Sensor with 0.56μm Unit Pixels Separated by Front Deep-Trench Isolation, IEEE, ISSCC, 2022, 3 pages.
Jae Hyeon Park, Optimization of Photodiode Design through Analysis of Full-Well Capacity and Image Lag in 0.5 μm CMOS Image Sensors with Vertical Transfer Gates, IEEE Electron Device Letters, 2022, pp. 1-4.

* cited by examiner

FIG. 42A
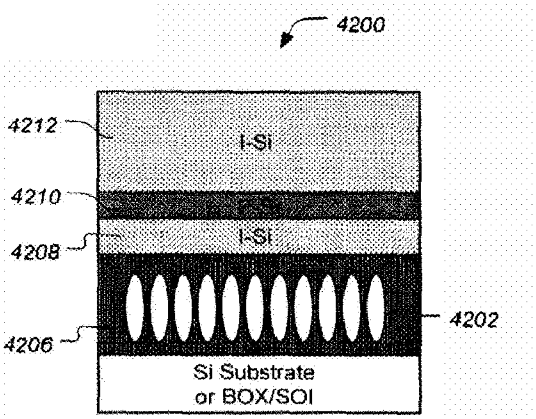
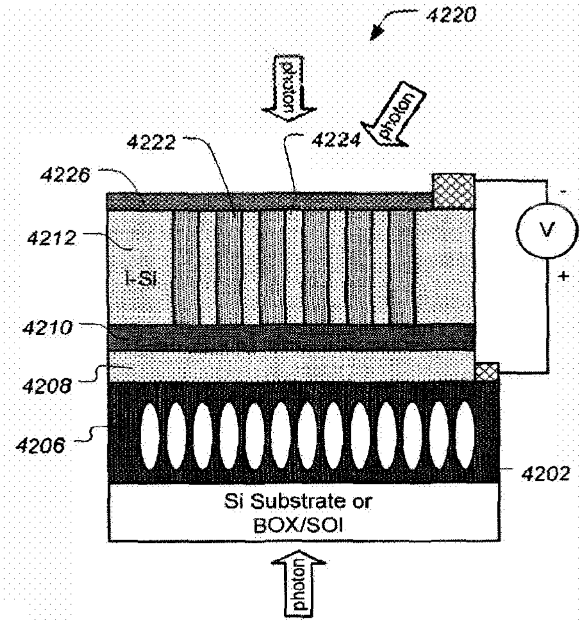
FIG. 42B

MICROSTRUCTURE ENHANCED ABSORPTION PHOTOSENSITIVE DEVICES

REFERENCE TO RELATED APPLICATIONS

This patent application is a divisional of U.S. application Ser. No. 18/822,880 filed Sep. 3, 2024 (now U.S. Pat. No. 12,243,948), which is a divisional of U.S. application Ser. No. 18/385,213 filed Oct. 30, 2023 (now U.S. Pat. No. 12,087,871), which is a continuation-in-part of U.S. application Ser. No. 18/113,474 filed Feb. 23, 2023, which is a divisional of U.S. application Ser. No. 17/707,429 filed Mar. 29, 2022 (now U.S. Pat. No. 11,621,360), which is a divisional of U.S. application Ser. No. 17/532,831 filed Nov. 22, 2021(now U.S. Pat. No. 11,309,444), which is a continuation-in-part of U.S. application Ser. No. 17/182,954 filed Feb. 23, 2021 (now U.S. Pat. No. 11,791,432), which is divisional of U.S. application Ser. No. 16/528,958 filed Aug. 1, 2019 (now U.S. Pat. No. 11,121,271), which is a continuation-in-part of U.S. application Ser. No. 15/797,821 filed Oct. 30, 2017 (now U.S. Pat. No. 10,466,700), which is a continuation-in-part of U.S. application Ser. No. 14/947,718 filed Nov. 20, 2015 (now U.S. Pat. No. 10,622,498), which is a continuation of PCT Application No. PCT/US14/39208 filed May 22, 2014, which claims the benefit of U.S. Provisional Application No. 61/826,446 filed May 22, 2013, and U.S. Provisional Application No. 61/843,021 filed Jul. 4, 2013, and U.S. Provisional Application No. 61/905,109 filed Nov. 15, 2013, and U.S. Provisional Application No. 61/834,873 filed Jun. 13, 2013.

Ser. No. 18/113,474 is a division of Ser. No. 17/707,429, now U.S. Pat. No. 11,621,360.

Ser. No. 17/707,429 is a continuation in-part of Ser. No. 17/182,954, now U.S. Pat. No. 11,791,432.

Ser. No. 17/182,954 is a division of Ser. No. 16/528,958, now U.S. Pat. No. 11,121,271, which claims priority to U.S. Provisional Patent.

Ser. No. 16/528,958 is a continuation in-part of Ser. No. 15/797,821, now U.S. Pat. No. 10,446,700

Ser. No. 16/528,958 claims priority to U.S. Provisional Pat. Applns. 62/713,455, 62/716,310, 62/717,750, 62/719,689, 62/724,449, 62/733,476, 62/737,062, 62/750,016, 62/770,656, 62/772,498, 62/777,157, 62/779,693, 62/784,342, 62/794,330, 62/797,141, 62/797,263, 62/800,371, 62/802,171, 62/802,718, 62/805,850, 62/808,949, 62/819,604, 62/819,669, 62/820,695, 62/828,976, 62/841,798, 62/843,206, 62/846,554, 62/853,280, 62/860,115, 62/863,231, 62/863,852, 62/867,186, 62/868,911, 62/870,533, 62/873,891, 62/874,418

Ser. No. 15/797,821 is a continuation in-part of Ser. No. 14/947,718, now U.S. Pat. No. 10,622,498.

Ser. No. 14/947,718 is a continuation of Int'l Pat. Appln. PCT/US14/39208.

PCT/US14/39208 claim priority to:

U.S. Prov. Ser. No. 61/826,446 filed May 22, 2013;

U.S. Prov. Ser. No. 61/834,873 filed Jun. 13, 2013;

U.S. Prov. Ser. No. 61/843,021 filed Jul. 4, 2013; and

U.S. Prov. Ser. No. 61/905,109 filed Nov. 15, 2013.

Ser. No. 17/974,325 is a continuation in-part of said Ser. No. 17/182,954.

The chain of parents and siblings of this patent application includes U.S., International, and provisional patent applications that are in addition to those listed above but are identified in the ADS filed concurrently herewith.

This patent application incorporates by reference the subject matter of each of the patent applications listed above as well as of each of the additional U.S., International, and provisional patent applications listed in the concurrently filed ADS.

The above-referenced provisional patent applications are collectively referenced herein as "the commonly assigned incorporated applications."

FIELD

The present invention generally relates mainly to photosensitive devices. More particularly, some embodiments relate to photosensitive devices having microstructure enhanced absorption characteristics.

BACKGROUND

Fiber-optic communication is widely used in applications such as telecommunications and communication within large data centers. Because of attenuation losses associated with using shorter optical wavelengths most fiber-optic communication uses optical wavelengths of 800 nm and longer. Commonly used transmission windows exist between 1260 nm and 1675 nm. A main component of optical receivers used in fiber-optic communication system is the photo detector, usually in the form of a photodiode (PD) or avalanche photodiode (APD).

High-quality low-noise APDs can be made from silicon. However, while silicon will absorb light in the visible and near infrared range, it becomes more transparent at longer optical wavelengths. Silicon PDs and APDs can be made for optical wavelengths of 800 nm and longer by increasing the thickness of the absorption "I" region of the device. FIG. 2 is a cross section of a conventional PIN photodiode 200, where "d" is the length of the absorption "I" region 220. FIGS. 3A and 3B show bandwidth and quantum efficiency a conventional silicon photodiode with a 30-micron diameter at 850 nm optical wavelength. As can be seen, in order to obtain a quantum efficiency of 90% the thickness "d" of the "I" region is over 30 microns. This leads to a maximum bandwidth of less than 2.5 Gb/s, which is too low for many current and future telecom and data center applications.

To avoid the inherent problem that silicon PDs and APDs have with longer wavelengths and higher bandwidths, other materials are used. Germanium (Ge) detects infrared out to a wavelength of 1700 nm, but has relatively high multiplication noise. InGaAs can detect out to longer than 1600 nm, and has less multiplication noise than Ge but still has far greater noise than silicon. InGaAs is known to be used as the absorption region of a heterostructure diode, most typically involving InP as a substrate and as a multiplication layer. This material system is compatible with an absorption window of roughly 900 to 1700 nm. However both InGaAs and Ge devices are relatively expensive and have relatively high multiplication noise when compared with silicon.

The subject matter claimed herein is not limited to embodiments that solve any specific disadvantages or that operate only in environments such as those described above. Rather, this background is only provided to illustrate one exemplary technology area where some embodiments described herein may be practiced.

SUMMARY

According to some embodiments, a photodetector with microstructure-enhanced photoabsorption is described. The photodetector (e.g. photodiode or avalanche photodiode) includes: a cathode region; an anode region; reverse biasing circuitry configured to apply a voltage between the cathode and anode regions such that the cathode region is driven to a more positive voltage than the anode region; and a microstructure-enhanced photon absorbing semiconductor region configured to absorb photons from a source signal. The absorbing region includes a plurality of microstructures that are dimensioned and positioned to increase absorption of photons at a range of wavelengths that includes a wavelength of the source signal. According to some embodiments the microstructures have at least one dimension that is equal to or shorter than a longest signal wavelength. According to some embodiments the microstructures are pillars, holes and/or voids. The microstructures can be arranged into a periodically-spaced array, a non-periodically-spaced array, a randomly-spaced array or a multiperiodically-spaced array. According to some embodiments the microstructures have a major longitudinal axis that is normal to the upper surface of the underlying substrate material. According to some other embodiments, the microstructures have major longitudinal axes that are not parallel to one another. According to some embodiments, the microstructures are oriented so as to reduce sensitivity to any single direction of the source signal.

According to some embodiments, the microstructures increase absorption at least in part by forming an absorbing mode high contrast grating that makes use of resonance effects, scattering effects, near field effects, subwavelength effects, and/or interference effects.

According to some embodiments, the absorbing region and the microstructures are formed of silicon. According to some embodiments, a silicon photodiode is provided that can detect source signals at a data bandwidth of greater than 5 gigabits per second, at wavelengths of 850 nanometers with a quantum efficiency of at least 60%. According to some embodiments, a silicon photodiode is provided that can detect source signals at a data bandwidth of greater than 10 gigabits per second, at signal wavelengths of 850 nanometers with a quantum efficiency of at least 60%. According to some embodiments a silicon avalanche photodiode is provided that can detect source signals at a data bandwidth of greater than 5 gigabits per second, at wavelengths of 850 nanometers, while having a gain of greater than 2. According to some embodiments a silicon APD has a multiplication region with microstructures that extend into the P multiplication layer, N multiplication layer and/or charge layer. According to some embodiments a silicon photodiode is provided that can detect source signals at a data bandwidth of greater than 1 gigabit per second, at wavelengths of 980 nanometers with a quantum efficiency of at least 40%. According to some embodiments a silicon photodiode is provided that can detect source signals at a data bandwidth of greater than 0.5 gigabits per second, at wavelengths of 1000 nanometers with a quantum efficiency of at least 30%. According to some embodiments, the microstructures effectively reduce capacitance of the photodetector when compared to a microstructure-free device having a similar photon absorbing length.

According to some embodiments, the absorbing semiconductor region and the microstructures are formed of silicon and germanium. According to some embodiments, the microstructures are formed by etching away portions of silicon and using a selective area growth process to grow germanium in the etched away portions. According to some embodiments, the absorbing semiconductor region and the microstructures are formed of germanium. According to some embodiments, the photo detector is configured to receive the source signal from the substrate-side. The anode region can include a germanium P layer formed by an epitaxial lateral overgrowth process. The device can be configured such that the source signal to passes through the absorbing region a first time, reflects from a surface and thereafter passes through the absorbing region a second time. The device can also be configured to receive the source signal the top-side and the anode region can be made of a silicon P layer. According to some embodiments, a avalanche photodiode is provided that detects source signals at a data bandwidth of greater than 1 gigabit per second, at source signal wavelengths of 1750 nanometers or shorter, and having a gain of greater than 2. According to some embodiments, the absorbing semiconductor region and the microstructures are formed of III-V family material(s) such as InP, GaAs, InGaAs, GaN, InGaN, InGaAsP, AlGaAs, AlGaN, GaP, InSb or InAs.

According to some embodiments, the microstructures include voids buried within the absorbing semiconductor region. According to some embodiments, voids are buried in a layer of material so as to effectively lower the refractive index at the signal wavelength(s) and as well as lower the capacitance of the layer of material.

According to some embodiments, a photovoltaic device is described that includes a semiconductor material having a plurality of voids buried therein. The semiconductor material being configured to convert solar radiation into direct current electricity. According to some embodiments, the voids are microstructured voids and are configured to enhance absorption of the semiconductor material thereby increasing conversion efficiency of the device. According to some embodiments, the voids are sized and/or spaced apart by less than 3 microns, and are configured to alter an effective refractive index of the semiconductor material near a surface, for example to reduce reflection of incident sunlight from the device and/or increase internal reflections within the semiconductor material.

According to some embodiments a glass material is described in which the glass has a plurality of buried voids dimensioned between 0.01 microns to 1000 microns. In some examples the glass forms a part of a photovoltaic device. According to some embodiments, the buried voids are filled with a material gel, polymer and gas. The buried voids can provide flexibility of the glass material, and/or increased resistance of the glass material to physical damage and/or damage propagation.

According to some embodiments, a microwave transmission line structure is described that includes: a semiconductor substrate material having a plurality of high-density dielectric-filled voids configured to reduce a dielectric constant of the semiconductor substrate material; and a plurality of metallic microwave transmission lines, least one of which is positioned above the semiconductor substrate material. According to some embodiments, the dielectric-filled voids are filled a material such as: nitrogen, argon, vacuum, air, helium, polymer, metal oxides, silicon dioxide, silicon nitride, calcium fluoride, or zinc oxide. According to some embodiments, the voids are further configured to reduce dispersion and reduce loss associated with the microwave transmission lines at least in part by reducing current loop flow and/or eddy currents.

According to some embodiments, an optical waveguide structure is described that includes: an optical mode region; and a supporting semiconductor material adjacent to the optical mode region. The supporting material includes a plurality of microstructured voids that are configured to alter an effective index of refraction of the supporting material based on the size, shape, density, etc. of the microstructured voids.

According to some embodiments, a heat exchanger system is described that includes: a heat generating device; a heat sink configured to dissipate heat to a surrounding medium; and an intermediate material mounted between the heat generating device and the heat sink. The intermediate material includes a plurality of buried voids configured to effect thermal conductivity of the intermediate material. According to some embodiments, some of the buried voids are filled with thermally conductive material and others are filled with a thermally isolating material. The two types of voids being positioned to conduct heat from the heat generating device to the heat sink and to reduce thermal cross talk with other heat sensitive devices mounted on the intermediate material.

BRIEF DESCRIPTION OF THE DRAWINGS

To further clarify the above and other advantages and features of the subject matter of this patent specification, specific examples of embodiments thereof are illustrated in the appended drawings. It should be appreciated that these drawings depict only illustrative embodiments and are therefore not to be considered limiting of the scope of this patent specification or the appended claims. The subject matter hereof will be described and explained with additional specificity and detail through the use of the accompanying drawings in which:

FIGS. 42A-42D are cross sections showing aspects of an APD with microstructured pillar/hole arrays above an N—Si layer having buried microstructured voids, according to some embodiments;

DETAILED DESCRIPTION

Figure 1:
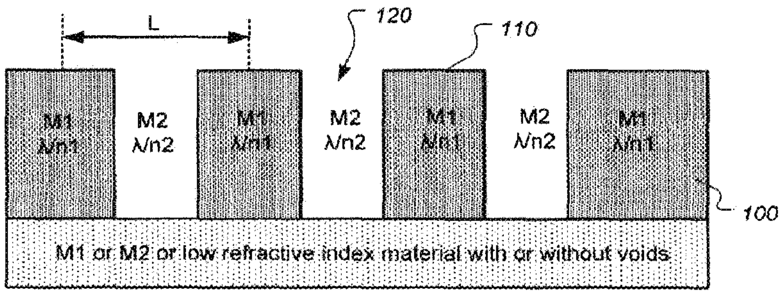
FIG. 1 is schematic side cross section of three dimensional micro structures that enhance bulk absorption coefficient in photo sensitive devices, according to some embodiments.

A detailed description of examples of preferred embodiments is provided below. While several embodiments are described, it should be understood that the new subject matter described in this patent specification is not limited to any one embodiment or combination of embodiments described herein, but instead encompasses numerous alternatives, modifications, and equivalents. In addition, while numerous specific details are set forth in the following description in order to provide a thorough understanding, some embodiments can be practiced without some or all of these details. Moreover, for the purpose of clarity, certain technical material that is known in the related art has not been described in detail in order to avoid unnecessarily obscuring the new subject matter described herein. It should be clear that individual features of one or several of the specific embodiments described herein can be used in combination with features or other described embodiments. Further, like reference numbers and designations in the various drawings indicate like elements.

According to some embodiments, microstructures are used to enhance the bulk absorption constant (also referred to as absorption coefficient) to achieve high quantum efficiency (QE) while maintaining an absorption length suitable for high data rate applications. As used herein, "QE" refers to internal quantum efficiency (IQE). IQE is equal to external quantum efficiency (EQE) in cases where reflection and transmission are negligible.

According to some embodiments, microstructures are used to improve bulk absorption constant at wavelengths in the proximity of the semiconductor material's band gap. This allows for extending the operating optical wavelengths and/or operating spectrum of the photosensor. The enhanced bulk absorption constant (or coefficient) is called the effective absorption constant (or coefficient). The term "effective" is used since absorption constant or coefficient is an inherent material property. However, with resonance effects, plasmonic effects, field enhancement effects, scattering effects, near field and sub wavelength effects, the effective absorption constant or coefficient can be greater than the bulk or material absorption constant or coefficient. As used herein, the following terms are used interchangeably: enhanced absorption constant, enhanced absorption coefficient; enhanced effective absorption constant; enhanced effective absorption coefficient; enhanced absorption; enhanced effective absorption; and effective absorption constant; and effective absorption coefficient.

According to some embodiments, enhanced absorption can also have drastic effects on path length. In one bulk absorption example, the path length for the photons to be absorbed to 1/e of its original amplitude is, for example 100 micrometers (μm), whereas under enhanced absorption according to some embodiments, the path length is 1 micrometer for the optical amplitude to decay to 1/e of its original amplitude. Equivalently, if path length is kept constant to one micrometer then the enhanced absorption coefficient is 100 times greater than the bulk absorption coefficient.

This is seen by the relationship $A=A_0 e^{-\alpha L}$ where A is the decaying amplitude of the incident photon flux $A_0$ and $\alpha$ is the absorption coefficient and L the path length for absorption to take place. So, rather than have L be 100 times longer, an effective a can be defined such that it is 100 times greater than a non enhanced absorption coefficient such as the bulk absorption coefficient. The resonance/scattering/near field effects of microstructures for example gives the equivalence of the path length that is 100 times longer where the resonant/scattering/near field microstructure is just one micron long. To put it another way, in a very simplistic view, the photons in the resonant structures make 50 round trips before reaching the 1/e value of its original amplitude, so the equivalent linear length is 100 times the length of the resonant structure. For simplicity, resonance/scattering/near field effects will collectively be referred to herein as "resonant" which can include, resonant, scattering, near field, plasmonic, nonlinear and linear optical effects.

As used herein the terms "microstructures" and "microstructured" refer to: pillars, voids, holes and mesas, of various shapes and sizes having at least one dimension in the micrometer scale, submicrometer scale, and/or sub-wavelength scale.

According to some embodiments, properties of the microstructures can also be explained as the absorption mode of high contrast grating (HCG) being used to enhance the effective absorption constant/coefficient or enhanced absorption. Conventionally, HCG uses material that is transparent at the optical wavelength of interest. In contrast, according to some embodiments, at least one of the microstructures is absorbing or weakly absorbing at the optical wavelength of interest. According to some embodiments a low-Q absorbing mode HCG enhances absorption (e.g. Q values in the range of 2-200).

According to some embodiments, a low index material is used such as buried oxide (BOX), silicon on insulator (SOI), silicon on sapphire (SOS), low-density semiconductors such as amorphous semiconductor, nanowire semiconductors, voids and holes to lower the effective refractive index. Refractive index is an inherent property of a material. However, according to some embodiments, when structures such as voids, air gaps, and/or holes (which can be filled with low index material, and/or regrowth) have dimensions on the order of the optical wavelength, the optical electromagnetic field will see an average refractive index consisting of the material refractive index and the structures (which can be filled by a low refractive index material). This average is referred to herein as the effective refractive index. According to some embodiments, a low index or effective low index material need not be used in the microstructures.

According to some embodiments, the techniques for enhancing effective absorption can be applied to various materials including: silicon, germanium, III-V material such as InP, GaAs, GaN, InGaAs, and any combination of the III-V material family. As used herein, the term "material family" of a III-V material is defined as any material that is lattice matched or approximately lattice matched (within a few percent) to GaAs, InP, GaN, InSb semiconductors. For example, the InP material family can include InGaAs, InGaAsP, InAlAs. According to some embodiments, in the case of microstructures, regrowth such as selective area growth (SAG) of Ge, InGaAs, or other III-V material in silicon microstructures can be carried out without the detrimental effects of lattice mismatch since the dimension of the footprint of the lattice mismatched material on silicon is small (approximately a few micrometers to sub-micrometers). This allows Ge and other III-V materials to be integrated with silicon without the use of a conventional buffer layer (such as amorphous Ge in the case of Ge on Si growth). The heterogeneous integration of materials can be homo or hetero structures, combination of crystalline and microcrystalline and amorphous semiconductor, conductor such as carbon, graphene, insulator, dielectrics, solid, gaseous, liquid such as glass or polymer that can be semiconducting.

Due to the microstructures, the capacitance can also be represented by an effective capacitance which is a parallel capacitance of (1) the dielectric constant of one semiconductor, and (2) the dielectric constant of another material, which can be a semiconductor, dielectric, gas, vacuum, partial vacuum, liquid such as glass or polymer (polyimide, mylar, or other organic compound). The effective capacitance of the device is the combination of the capacitance of the parallel capacitors, which can be two or more. An advantage of the use of microstructure according to some embodiments, is that the effective capacitance can be significantly lower than the capacitance of a homogeneous material such as a semiconductor. The lower capacitance allows a device to have a larger area while still maintaining suitably high data rate bandwidth, and/or increase the data rate bandwidth by reducing the thickness of the device to reduce the transit time.

According to some embodiments, the photosensor can be a photodiode (PD), avalanche photodiode (APD), photovoltaic (PV) or solar cell, or any optoelectronic device that converts photons to electrons. According to some embodiments, emitters such as lasers and light emitting diodes that convert electrons/holes to photons can also be implemented using microstructures.

According to some embodiments, the enhanced absorption allows the APD/PD to: (1) extend the sensitivity of the APD/PD to photons with energies (or wavelength) closer to the material band gap with QE greater than 60% and data bandwidth greater than 3 Gb/s; (2) operate at a high data rate bandwidth (e.g. >10 Gb/s), due to shorter absorption length therefore shorter transit time; (3) increase quantum efficiency with enhanced absorption; (4) be manufactured of silicon which has superior APD properties with low excess noise; (5) be compatible with Si Photonics and CMOS processes. According to some embodiments, the PD/APD can be integrated with ASIC (application specific integrated circuits) such as signal processing, signal amplification, memory, cpu, electrical transmitter, optical waveguides, integrated optics, and other ICs for specific applications. This is advantageous for mass production using CMOS foundries.

According to some embodiments, microstructures such as voids are used to reduce effective refractive index to create resonant structures to enhance the absorption. In microstructures where selective area growth are used to integrate Ge or III-V material with silicon, voids can be made in the silicon microstructure such that the absorbing region is a resonant structure to enhance the effective absorption coefficient by 2 to over 100 times.

According to some embodiments, silicon is used for avalanche gain. Silicon has the lowest excess noise for an avalanche photodiode. By integrating Ge and/or III-V material with silicon, the absorption takes place in Ge and/or III-V material and the electronic gain occurs in silicon.

Depending on the optical wavelengths, for example shorter than 1100 nm, silicon may be used for both absorption and electronic gain with the use of microstructures.

According to some embodiments, microstructures such as buried voids can reduce lateral electrical and thermal conductivity. In situations where directional conductivity of electrical or thermal (phonons) is preferred, voids can be used to confine the flow of electrical current and/or heat.

According to some embodiments, the absorption of photons in semiconductors is enhanced with the use of microstructures. The microstructures can have effects such as resonance, field enhancement, near field and sub wavelength effects, scattering, plasmonics, photonic crystal, absorption mode in high contrast grating at the near field regime, which are both linear and non linear effects that can effectively increase the effective absorption length resulting in a greater absorption of the photons for a given length.

According to some embodiments, microstructures used for absorption enhancement for silicon photodiodes and silicon avalanche photodiodes can result in silicon PD and APD with bandwidths in excess of 10 Gb/s (or equivalently 6.75 GHz approximately depending of the digital coding format) at photons with wavelengths of 850 nm approximately (which is the current datacom preferred wavelength) with quantum efficiencies of approximately 90% or more.

Silicon optical detectors are very robust due to the maturity of the material and processing techniques, the surfaces can be easily passivated to eliminate dangling bonds that can cause surface states and carrier recombination centers, they have excellent carrier lifetimes due to low defects and high material purity, and for APD applications, the noise is low due to the small ionization ratio between holes and electrons (k factor, silicon have the lowest k factor than any III-V material) and such detectors are CMOS compatible for integration with electronics for signal processing and with Si photonics.

According to some embodiments, other material such as germanium, III-V, a-Si (amorphous silicon) may also be used singly or together with other materials such that a multiple bandgap in parallel can be fabricated with enhanced absorption.

According to some embodiments, microstructures and voids are used to reduce the effective refractive index and capacitance to achieve the absorption mode high contrast grating effect and to reduce the effective capacitance of the device for lower RC time constants.

In addition, according to some embodiments, microstructures buried in the semiconductor can reduce lateral electrical and thermal conduction. Microwave transmission lines are possible for example where high-density voids are buried in Si to reduce the dielectric constant and also eddy currents in the semiconductor resulting in low loss and dispersion. Voids can also be used for thermal isolation and to improve thermal conductivity by filling the voids with thermal conductors. This is useful in thermal management of components on a silicon substrate.

The enhancement using nanowires (Garnett et al, Light trapping in silicon nanowire solar cells, Nano Letters, 2010, 10, 1082-1087; Kelzenberg et al, Enhanced absorption and carrier collection in Si wire arrays for photovoltaic applications, Nature Materials, vol. 9, March 2010, 239-244) and nanoholes (Lin et al, Optical absorption enhancement in silicon nanowire and nanohole arrays for photovoltaic applications, Proceeding of SPIE, Vol. 7772, 77721G-1, 2010) have been reported. Nanowire is known to be used for light trapping in photovoltaic applications where the photogenerated carriers diffuse to the anode or cathode of a P-N junction with zero external bias operating at DC (direct current).

According to some embodiments, the photogenerated carriers are swept out with an external reverse bias in the absorbing "i" region of a P-I-N diode (PD) or P-I-P-I—N diode (APD) for high modulation bandwidth (greater than or equal to 10 Gb/s bandwidth) and high quantum efficiency and for APD for high current gain, with gain greater than 3 dB.

The cause or causes of the enhancement of the absorption coefficient are believed to include one or more of the following: an increase in optical field concentration, resonance effects, constructive and destructive optical interferences (amplitude and phase) effects, scattering, and high contrast grating (HCG) effects. See, e.g. Chang-Hasnain et al, High contrast gratings for integrated optoelectronics, Advances in Optics and Photonics 4, 379-440 (2012), hereinafter "Chang-Hasnain." The HCG effects are at the near-wavelength regime (See, Chang-Hasnain) where the optical wavelength in the material of the grating and the optical wavelength in the surrounding material of the grating is the range of the period of the grating.

FIG. 1 is schematic side cross section of three dimensional micro structures that enhance bulk absorption coefficient in photo sensitive devices, according to some embodiments. Microstructured pillars 110 and/or holes 120 are etched into the "I" Si layer 100. The optical wavelength in material $M_1$ is $\lambda/n_1$ where $n_1$ is the refractive index of $M_1$ and the optical wavelength in material $M_2$ is given by $\lambda/n_2$ where $n_2$ is the refractive index of material $M_2$. The center to center distance L of the structures 110 can be between $\lambda/n_1$ and $\lambda/n_2$ or approximately 100-2000 nm, which is referred to as the near-wavelength regime. The diffraction regime is where L (one cycle) is greater than the wavelength, while the subwavelength regime is where L is less than the wavelength. The cross section of FIG. 1 shows the 3D (dimension) microstructured pillar/hole array, which enhances the bulk film absorption coefficient by factors of 1.5 to over 100. The period of the 3D pillar/hole microstructured array can be seen as a 3D high contrast grating, whose period of the grating $\Lambda$ can lie between $\lambda n_1$ where $n_1$ is the optical refractive index of material $M_1$ and $\lambda/n_2$ where $n_2$ is the optical refractive index of material $M_2$. If $n_1>n_2$ then $\lambda/n_1<\Lambda<\lambda/n_2$ where $\lambda$ is the optical wavelength of the light to be absorbed by the microstructured pillar/hole array typically in the "I" region of a P-I-N PD or for APD, the absorbing "I" region P-I-P-I—N where the second "I" region is the multiplication region, or the wavelength of the optical signal to be detected by the PD and APD. At this near-wavelength regime of the 3D HCG microstructured pillar/hole array, the resonance Q (quality factor, or proportional to the ratio of the energy stored in the resonator/energy losses per cycle; where it is the optical cycle, the optical frequency impinging on the resonator or in the resonator) can be as high as $10^7$ (see, Chang-Hasnain) if the HCG has minimal absorption loss as is known. In addition, in most cases the ratio of the index of the HCG to the surrounding material index need only be approximately 1.1 to observe the effects of the HCG.

The HCG effect that may explain the high enhancement of the absorption coefficient of the bulk material is that a single or multiple HCG layer (or a single microstructured pillar/hole array layer) due to its resonance effects and/or due to a varying of the microstructured pillar/hole period spacing, the optical signal resonating in the HCG/microstructured pillar-hole array can be directed to propagate in the plane of the HCG/microstructured pillar-hole array rather than normal to the surface. Together with resonance and in-plane propagation this can greatly increase the absorption path length in the HCG/microstructured pillar-hole array. According to some embodiments, the absorbing HCG mode is operated with a reverse voltage bias for PD/APD and a built-in bias (zero applied bias) in photovoltaic devices.

Using the phenomenon of near-wavelength and also deep-wavelength where the HCG period is much less than the optical wavelength, and the diffraction regime where the HCG period is greater than the optical wavelength (See, Chang-Hasnain) the microstructured pillar-hole-void array can have enhanced absorption coefficient over the bulk absorption coefficient by a factor of 1.1 to over 100.

Figure 49:
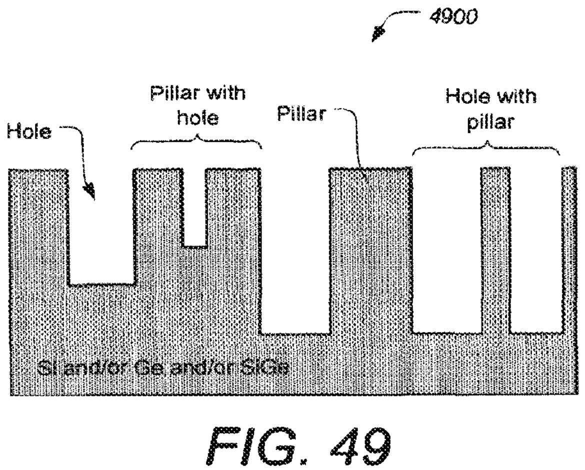
FIG. 49 shows a microstructured surface having a combination of both pillars and holes, according to some embodiments.

According to some embodiments, the HCG effect is also used in the absorbing mode or lossy mode or low Q of 1-10000 (compared with known HCG that are in the non-absorbing mode or non-lossy mode to achieve high Q of greater than 1,000,000 and high reflectivity), in both buried/embedded (not fully buried) Ge microstructures in Si and buried/embedded void microstr FIG. 49: "Pillar with hole structures in either Ge or Si to improve the quantum efficiency (QE) and operating wavelength range of Si (400-1100 nm) and Ge (400 to 1800 nm) and Ge on Si photodiodes and avalanche photodiodes operated in a reverse bias mode of the pn, pin, pinip junctions (p and n can be switched for certain device configurations) that can be homo or heterojunction, crystalline or amorphous or any combinations thereof. In addition, the substrate can be on SOI or BOX or voids to reduce the index of refraction or effective index of refraction and the dielectric constant or effective dielectric constant (a dielectric with many voids can be represented as an effective dielectric constant, or equivalently effective capacitance).

Known silicon photodetectors have been limited to wavelength ranges of 200 to 1000 nm due to indirect bandgap of 1.1 eV. In particular, near the band gap wavelengths of 800-1000 nm, the frequency response of the silicon photodetector to a modulated optical signal at Gb/s rate is limited to 1.5 Gb/s approximately or less due to the weak absorption constant of Si at those wavelengths which are approximately 760 $cm^{-1}$ at 850 nm and 67 $cm^{-1}$ and 63 $cm^{-1}$ at 980 and 1000 nm respectively, resulting in long absorption lengths of material, 30 microns or more, which results in low frequency response for the PD/APD. The wavelengths 850 nm is of interest since this is the standard wavelength for short distance (few meters to a few kilometers) multimode fiber optical data communication.

The amount of incident photons absorbed is approximately given by $\eta=1-e^{\alpha L}$ where $\eta$ (also the quantum efficiency if reflection off the surface of the PD is negligible) is the amount absorbed and "$\alpha$" is $\alpha$ the absorption constant and "L" is the length of the absorber. Using this equation and the absorption constant of Si at 850 nm, 90% of the incident photons are absorbed at a depth of approximately 30 μm. Known high speed photodetectors typically have an absorption region of approximately 2 μm in length. The reason for this is that transit time and RC time of the photodiode need to be considered to have a bandwidth of 20 GHz (or approximately 30 Gb/s) or more and still have an external quantum efficiency of 80-90% or better.

Figure 2:
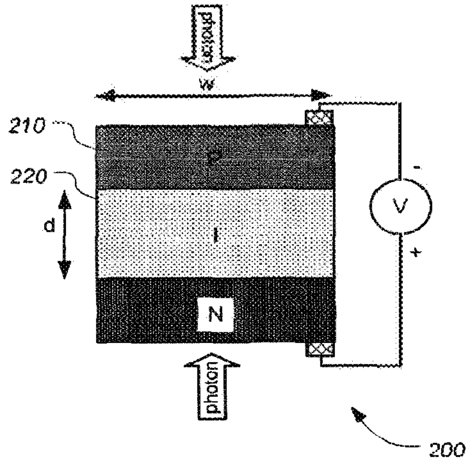
FIG. 2 (prior art)
FIG. 2 is a cross section diagram showing aspects of a typical structure of a conventional PIN photodiode.

Efficiency and bandwidth (transit and RC time): At a field strength of $6\times10^4$ V/cm the electron drift velocity is $1\times10^7$ cm/s at a temperature of 300 K. The 3 dB bandwidth of the photodetector due to transit time is given by: f(3 dB)=0.45/t (transit) where t (transit) is the transit time for the carriers to cross the depleted high field region. FIG. 2 is a cross section diagram showing aspects of a typical structure of a PIN photodiode structure. Assuming negligible photocarriers generated in the P region 210 of the PIN 200 and mostly generated in the "i" region 220, the transit time is determined by the electron drift velocity and "d" (the high field "i" region). The PIN 200 is reversed biased (e.g. between −4 and −25 V). The "i" region 220 is fully depleted in this case. The RC time of the PIN structure 200 is determined by the capacitance, which is the ratio of the area ($\pi w^2/4$) of the PIN 220 to d.

According to conventional techniques, a 30 μm thick absorption layer ('i") to achieve 90% absorption for Si at 850 nm wavelength will give a transit time limited 3 dB bandwidth of 1.5 GHZ (approximately 2.2 Gb/s) which is too low for many current applications. Many current applications are in the 10-20 Gb/s range and in the near future 40 Gb/s. A d of 2 μm or less is desirable for current high-speed photodiodes in optical datacom applications to give over 30 Gb/s bandwidth.

RC time is another time to consider in photodiodes (applies to both APD and PD). The 3 dB bandwidth due to RC time is given by f(RC)=1/(2πRC); where C is the capacitance of the photodiode and R is the load resistance which is typically 50 ohms (and occasionally 25 ohms). Capacitance in the case of a conventional PIN structure photodiode with the "i" region fully depleted by the reverse bias, is just a parallel plate capacitance given by εA/d where ε is the dielectric constant of the material (multiplied by vacuum permittivity of $8.854\times10^{-14}$ farads/cm) which is 11.9 for Si, A is the area of the capacitor ($\pi(w/2)^2$), and d is the depleted "i" (i and I are used herein interchangeably). The f(RC) becomes larger as d increases since the capacitance is decreasing with increasing d and a fixed area, where the diode diameter for example is 30 μm (diameters of high frequency PD/APD range from 5 to 60 μm). Diameter of diode for calculating the RC time is the total capacitive area of the diode that includes the photosensitive area and any metallization that may contribute to the overall capacitance.

The overall frequency bandwidth of the photodiode is a sum of the squares of the transit time and the RC time. This is given by the equation:

$$f=1/(2\pi(RC)^2+(\tau/2.4)^2)^{1/2}).$$

Figure 3A:
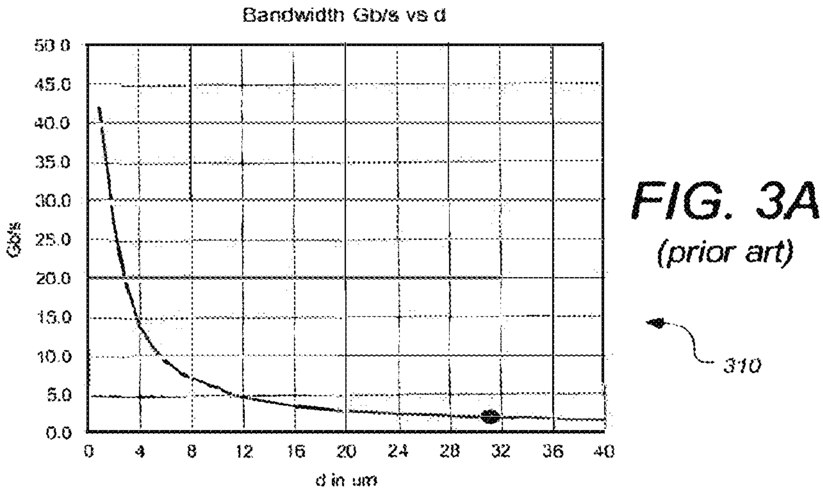
FIG. 3A (prior art)
FIGS. 3A and 3B a plots showing bandwidth and quantum efficiency (QE), respectively, of a bulk conventional silicon photodiode versus "d" in microns.
Figure 3B:
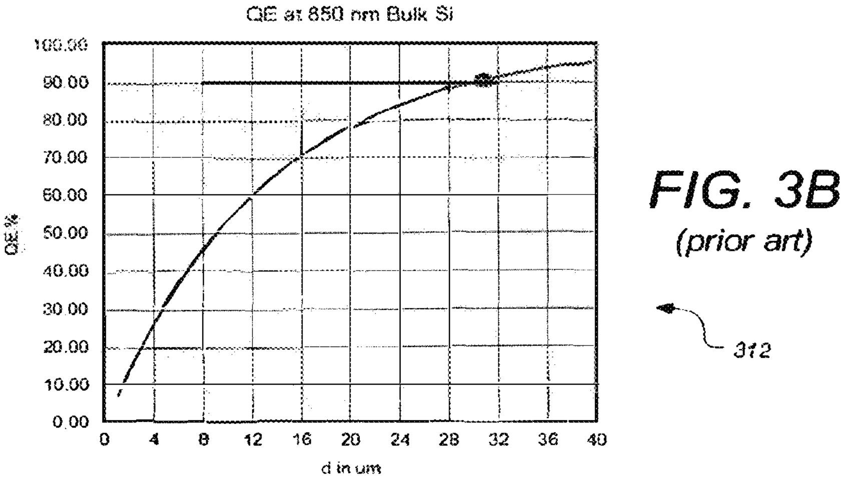
FIG. 3B (prior art)

FIGS. 3A and 3B are plots showing bandwidth and QE, respectively, of a bulk conventional Silicon photodiode versus "d" in microns. From plots 310 and 312 in FIGS. 3A and 3B, for the combined f(3 dB) of the transit time and RC time and the quantum efficiency $\eta$ (assuming negligible reflection losses) we see that for bulk silicon to reach 10 Gb/s, the quantum efficiency (QE) is less than 40%, for a 30 μm diameter PD, which is too low for most datacom applications.

According to some embodiments, to overcome the relatively weak absorption of semiconductors with radiation energies near the bandgap and indirect bandgap semiconductors, for example Si at 850-1100 nm, a microstructured array is used that is etched into silicon that is grown by conventional methods epitaxially such as chemical vapor deposition (CVD) or metal organic chemical vapor deposition (MOCVD), atomic layer deposition (ALD), molecular beam epitaxy (MBE). Note that according to some embodiments, non semiconductors can be used: such as polymers, glass, ceramics, hybrid material such as transition metal oxides, hydrides, chlorides, sulfides embedded with semiconductor, metal, carbon nanoparticles and or atoms, which may or may not have a bandgap. The microstructured array of silicon consists of pillars of Si and/or holes in Si. See, Garnett and Yang, *Light Trapping in Silicon Nanowire Solar Cells, Nano Lett.* 2010, 10, 1082-1087 (hereinafter "Garnett et al.") that experimentally demonstrates that an ordered array of silicon nanowires increased the optical path length of the incident optical radiation by 73 times greater than that of bulk silicon.

According to some embodiments, as described earlier, the concept of effective absorption coefficient is introduced. The effective absorption coefficient of the ordered array of Si nanowires is 73× that of bulk silicon; bulk a for Si is 760/cm and nanowire Si a is $5.548\times10^4$/cm at 850 nm which is higher than direct bandgap III-V material.

It should be noted that the microstructures can also be epitaxially grown using methods such as VLS (vapor liquid solid epitaxial grown) nanowires or microwires (some nanowires have the largest dimension, such as the diameter, in the micron range, so that it can be called a microwire) with or without catalysts, or using a dielectric mask for selective area growth (SAG) epitaxy.

The nanowire array described in Garnett et al. has a diameter of the nanowire of approximately 390 nm using an array of beads of 530 nm as a dry etch mask. Roughly ½ of the Si material is etched away; the effective capacitance for the nanowire array is less than that of the bulk. The effective capacitance can be estimated as two parallel capacitors, one with Si and another with polyimide (filler) whose dielectric constants are 11.9 and 3.4 respectively. The area of each capacitor will be ½ that of a 30 μm diameter parallel plate.

Figure 4A:
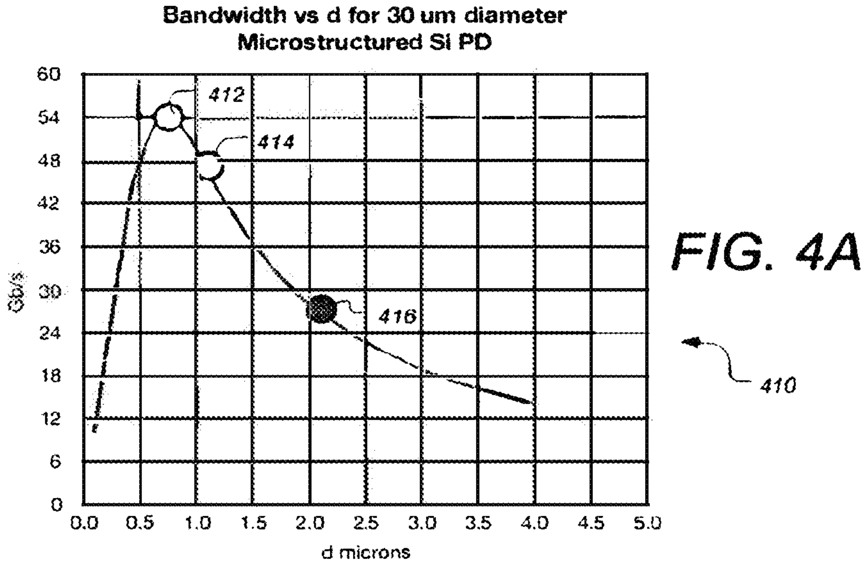
FIGS. 4A-4D are graphs showing the enhancement of bulk absorption coefficient vs bandwidth and QE for a microstructured Si photodetector, according to some embodiments.
Figure 4B:
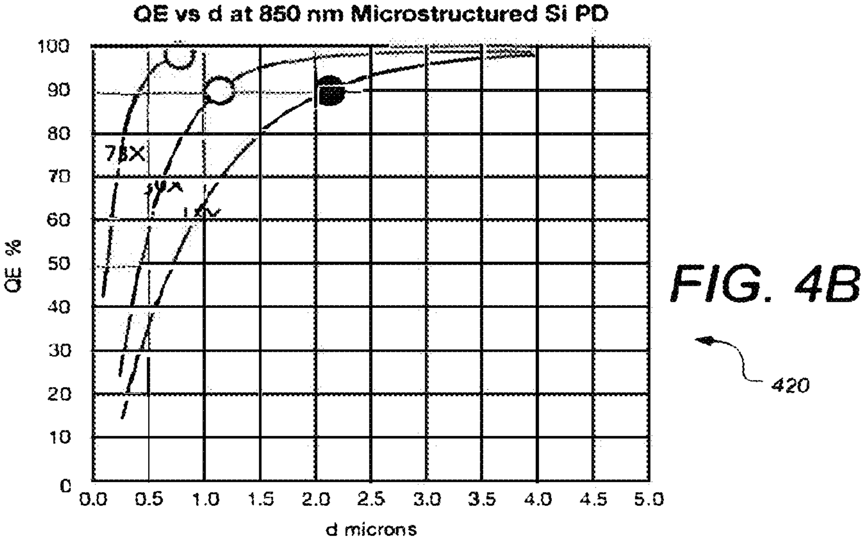
Figure 4C:
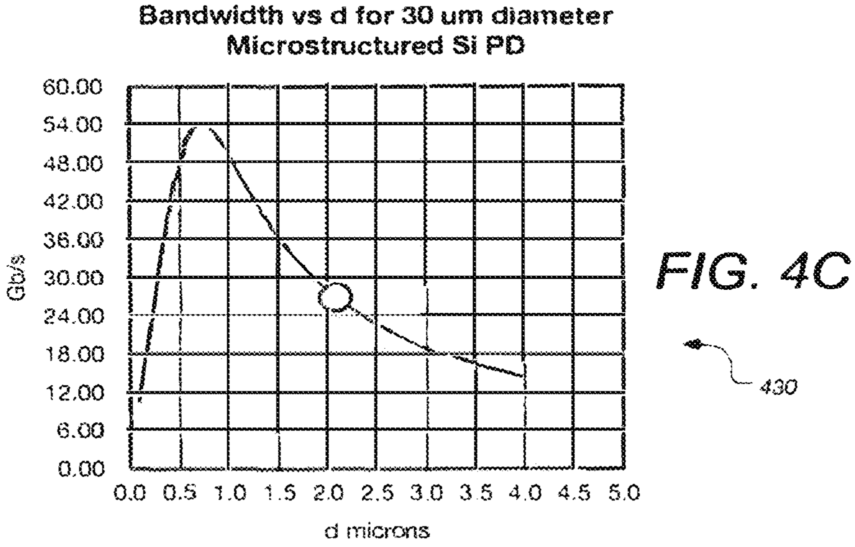
Figure 4D:
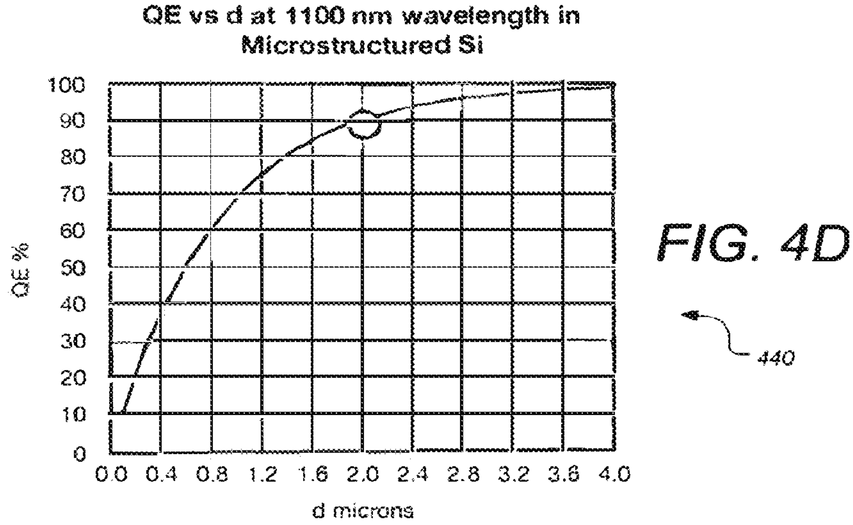

With the effective capacitance lower, the overall 3 dB bandwidth for a 30 μm diameter device is significantly higher. FIGS. 4A-4D are graphs showing the enhancement of bulk absorption coefficient vs bandwidth and QE for a microstructured Si photodetector, according to some embodiments. FIGS. 4A and 4B shows the bandwidth (plot 410) and quantum efficiency (plot 420) of a microstructured Si photodiode (PD) or avalanche photodiode (APD) at 850 nm wavelength photons impinging on the PD/APD either single or double pass. With an effective absorption coefficient (EAC) of 73× (412), 30× (414) or 15× (416) over bulk absorption coefficient (BAC), the bandwidth and QE are 54 Gb/s, 98%; 49 Gb/s 90%, 28 Gb/s 90% respectively for a 30 micrometer diameter PD/APD for example. At 1100 nm, shown in plots 430 and 440 of FIGS. 4C and 4D, with enhancement, for example, of 172×QE of 90% and bandwidths of 26 Gb/s can be attained using Si microstructured PD/APD. Both PD and APD operate at a reverse bias of −2 to −50 volts range. APDs in general will have less bandwidth than PDs for the same geometry due to the added multiplication layer of the APD. In addition, APDs have a gain-bandwidth product. For simplicity, APD and PD are shown to be approximately the same.

According to some embodiments, a combination of low capacitance due to the gaps between the microstructured pillars and the enhanced absorption allows the silicon photodiode and avalanche photodiode to operate at bandwidths greater than 10 Gb/s with high quantum efficiencies (>90%) at 850 nm wavelength. This has not been demonstrated by conventional silicon PD/APD at these wavelengths. 850 nm is chosen as the nominal wavelength, but according to some embodiments, wavelengths can have values from 700 to 1100 nm.

According to some embodiments, the weak absorption in the bulk can be taken advantage of for photodetector applications since this will allow light at 850 nm and longer to pass through Si substrate and epitaxial layers toward the microstructured silicon with minimal optical loss and minimal photocurrent outside of the high field region, which can diffuse to the i-region and can cause the photodetector to have a degradation in frequency response.

According to some embodiments, the techniques described herein are applied to other semiconductors, polymers, organic films, glass, dielectrics, hybrid material such as glass, dielectrics, polymers embedded with nanoparticles of metal, semiconductors. According to some embodiments, one or more of the following are used: Ge, III-V material family such as InP, GaAs, GaN, InGaN; II-VI material family such as ZnSe, and also heterostructure material such as III-V grown on Si, Ge grown on Si. For example, for Ge on Si, microstructures are fabricated on the Ge to increase absorption which allows a shorter length of Ge to be used resulting in higher speed due to lower effective capacitance and shorter transit time for the carriers.

Figure 5A:
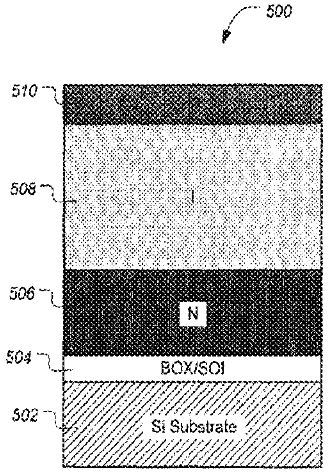
FIGS. 5A and 5B are cross sections showing aspects of a top illuminated microstructered PIN silicon photodiode, according to some embodiments.
Figure 5B:
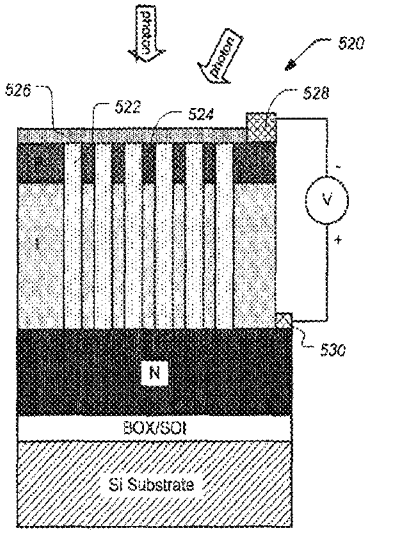
Figure 6A:
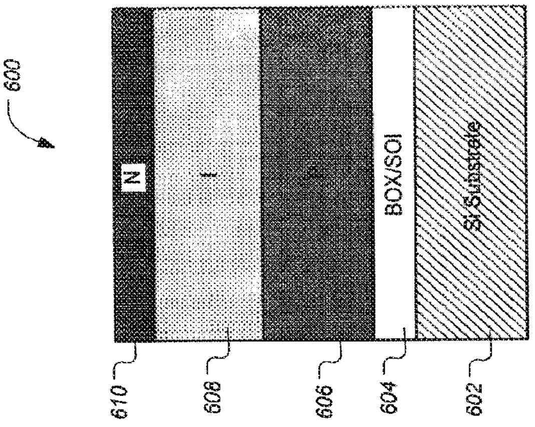
FIGS. 6A and 6B are cross sections showing aspects of a bottom illuminated microstructered NIP silicon photodiode, according to some embodiments.
Figure 6B:
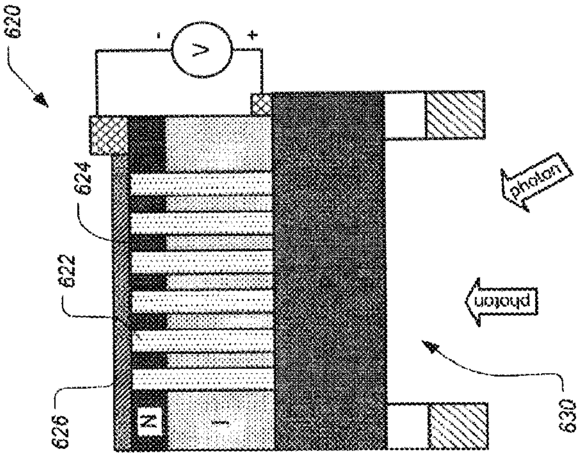

FIGS. 5A and 5B are cross sections showing aspects of a top illuminated microstructered PIN silicon photodiode, according to some embodiments. FIG. 5A shows the starting basic material structure 500. In FIG. 5B, silicon epitaxial structure is shown for a high-speed high efficiency microstructured photodiode 520. The photophoto diode 520 in FIG. 5B is designed for top illumination. According to some embodiments, BOX/SOI layer 504 may not be used. FIGS. 6A-B, infra show an example for bottom illumination. Note that with minor modifications the n and p doping can be switched and the direction of illumination may also be affected. According to some embodiments, the illumination can be either perpendicular to the surface of the PD/APD or at an angle off perpendicular to the surface. According to some embodiments, in integrated structures where the optical signal is guided in an optical waveguide, the microstructured absorption region can also be illuminated edge wise, directly into the microstructures or evanescently coupled to the microstructured i region.

FIG. 5B shows a microstructured pillar and or hole PD 520 in silicon with the starting material 500 consisting of a P-I-N Si layer grown on an Si substrate 502 that can be N doped or low doped in which case an extra $N^+$ layer is first grown on the substrate to minimize series resistance. The dimensions and doping of the layers can range as follows; $N^+$ cathode contact layer 506 (or a thin layer on top of 506, between 506 and 508) with N doping of greater than $5\cdot10^{17}/cm^3$, and thickness ranging approximately from 0.1 to 10 micrometers or more; N layer 506 with N doping greater than $5\cdot10^{17}/cm^3$, and thickness ranging approximately from 0.1 to 10 micrometers or more; I high field absorption region 508 with background doping of less than $5\times10^{16}/cm^3$ and thickness ranging approximately from 0.1 to 5 micrometers depending on applications; and $P^+$ anode layer 510 with P doping greater than $5\cdot10^{18}/cm^3$ and thickness ranging approximately from 0.1 to 5 micrometers or more. The PD (and APD) photosensitive area (defined by the P-I-N or P-I-P-I—N junction area) is nominally 30 micrometers (10-80 micrometers in diameter are possible ranges) in diameter for 20 Gb/s or more bandwidth operation. According to some embodiments, the area can be larger for lower bandwidth or smaller for higher bandwidth operation. The Si microstructures of arrays of holes 522 and/or pillars 524 shown in FIG. 5B, which can be random, patterned or pseudo-random, are for enhancing the bulk absorption coefficient of Si to detect photons with wavelengths from 300-1100 nm. In the case of datacom applications, according to some embodiments, the optical signal wavelengths range from 750-1100 nm. A transparent conducting oxide and P-ohmic layer 526 is also provided.

The PD 520 is operated in a reverse bias mode, with negative voltage on the anode ($P^+$ layer 510 via P-ohmic and bond contact metal 528) and positive voltage on the cathode ($N^+$ layer 506 with N-ohmic bond contact metal 530) ranging from −1 to −20 volts. According to some embodiments, the PD structure 520 shown in FIG. 5B (and PD structure 620 in FIG. 6B, infra) can also be used for photovoltaic (PV) operation without any external bias.

As shown in FIG. 5B, the optical signal can impinge normal to the surface or at an angle off normal. In certain cases, optical signal coming in at an angle off normal can have a higher QE and can also be at a certain rotation about the axis normal to the surface. This is to avoid the bald spot effect where some photons travelling normal to the surface can "see" bald spots whereas for photons illuminating at an angle off normal to the surface, the bald spots are hidden by other microstructures. This is not the case in near field optics where the spacing of the microstructures are of the order of the optical wavelength or subwavelength, the bald spots are not a significant issue.

FIGS. 6A and 6B are cross sections showing aspects of a bottom illuminated microstructered NIP silicon photodiode, according to some embodiments. The optical signal impinges on the photodiode 620 from the substrate side or bottom. The substrate 602 can be thinned to 10 microns or less by etching for example a via and stopping at the P layer or the photodiode can be fabricated on a BOX (buried oxide) or silicon on insulator (SOI) silicon wafer and the etch via can stop at the BOX layer 604 which can also be selectively etched to the silicon layer 606, the via 630 is as wide or wider as the photosensitive area of the photodiode 620. An antireflection layer (not shown) is applied to the silicon remaining layer 606 or the BOX layer 604 (the BOX layer 604 can be designed as a part of the antireflection layer for example) to minimize reflection (the BOX layer 604 can also be selectively etched off such that antireflection layer can be applied to the silicon P layer 606 to minimize multiple reflections). The back illuminated photodiode 620 has the advantage that a reflector 626 can be applied on the N layer 610 to reflect any light not absorbed on the first pass, in effect doubling the length of the "I" layer 608. The QE can be increased due to the extra length. In addition the reflector 626 on the N layer 610 can be smooth of textured to scatter (non-specular or diffused reflection) the light (optical signal) to optimize absorption by the microstructures (arrays of pillars 624 or holes 622). Since the length of the "I" region is effectively doubled, the transit time can effectively be reduce since only half of "I" is needed.

Bottom illuminated PDs such as PD 620 in FIG. 6B are also sometimes referred to back/substrate illuminated PDs, and top illuminated PDs such as PD 520 in FIG. 5B are also sometimes referred to front/surface illuminated PDs.

According to some embodiments, the basic structure of a microstructured Si photodiode such as shown in in FIGS. 5A, 5B, 6A and 6B, is fabricated from a bulk thin film epitaxially grown silicon with a P-I-N structure on a silicon wafer which can be doped N type or not intentionally doped or low doped N type Si substrate with (100) orientation or other orientation such as (111).

According to some embodiments, the basic layer structures (such as layers 502, 504, 506, 508 and 510 of structure 500 of FIG. 5A, and layers 602, 604, 606, 608 and 610 in structure 600 of FIG. 6A) are all grown epitaxially using one or more of the following methods: chemical vapor deposition (CVD), metal organic chemical vapor deposition (MOCVD), plasma enhanced chemical vapor deposition (PECVD), molecular beam epitaxy (MBE), atomic layer deposition (ALD), pulsed laser deposition (PLD) on Si substrate of either P or N or low doped or undoped) or BOX/SOI substrates.

Processing details have been left out for simplicity. According to some embodiments the following basic steps are carried out: first (for pillars, not necessary for holes), depositing the p ohmic contact metal layer using e-beam, thermal or sputtering deposition; second, photolithographically (or imprint lithography) defining the microstructure pattern either pillars or holes and forming the etch mask for either dry or wet etching; third, etching of microstructure patterns on the P and I layers partially or fully and can extend into the N layer; fourth, passivating the sidewalls of the microstructure patterns (pillars or holes) with thermal oxide to minimize surface recombination of the photogenerated carriers via surface states due to dangling bonds and other surface imperfections (other passivation techniques may also be applied such as ALD (atomic layer deposition) of Si oxides and Si nitrides); fifth, planarization (filler step) using either spin on glass, polyimide, or plasma enhanced chemical vapor deposition (PECVD) of dielectrics such as Si oxides and Si nitrides; sixth, etch back to expose the P layer or P ohmic metal layer (polyimide or spin-on glass may partially fill the holes or space between the pillars/microstructures); and seventh, ohmic and/or bond contacts formed on the P and N layers. In the case of top illuminated photodetectors, where the optical signal enters on the epitaxial surface where the microstructure patterns are fabricated, a transparent conducting oxide is deposited to connect all the P ohmic metal layers (for pillars). In the case where the microstructures are holes or voids the transparent conducting oxide layer is not used, according to some embodiments. A voltage bias is applied between the P layer (anode) and the N layer (cathode) of −1 to −20 V, and the photodiode is operated in a reverse bias mode to deplete as much as possible the "I" layer, preferably the entire I layer.

Figure 7B:
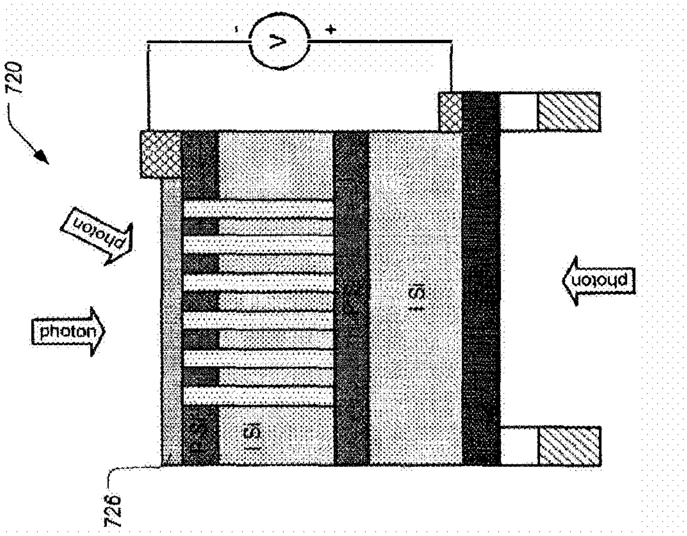
FIGS. 7A and 7B are cross sections showing aspects of a microstructered avalanche photodiode, according to some embodiments.
Figure 7A:
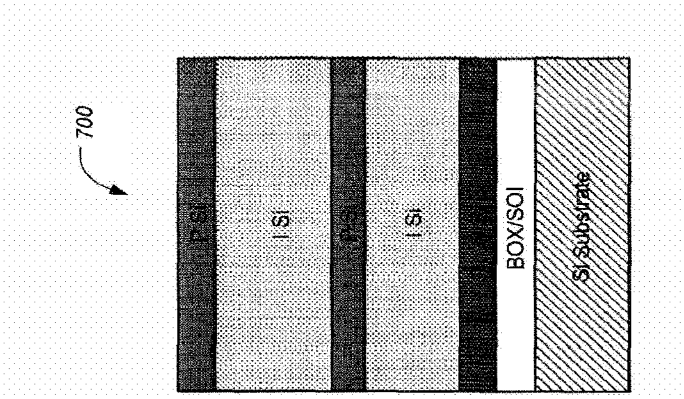

FIGS. 7A and 7B are cross sections showing aspects of a microstructered avalanche photodiode, according to some embodiments. As in the Si microstructured photodiodes shown in FIGS. 5A, 5B, 6A and 6B, the epitaxial layers 700 for the APD 720 are grown first followed by microstructure processing. The microstructured avalanche photodiode 720 can be illuminated (e.g. with 300-1100 nm) from the top with transparent metal oxide P ohmic contact 726, or the P ohmic contact 726 can be a mirror to reflect the photons illuminating from the bottom (e.g. with 950-1100 nm) to have a double pass absorption. The double pass absorption greatly improves the RC time and the Transit time of the APD for a higher frequency response.

Figure 8:
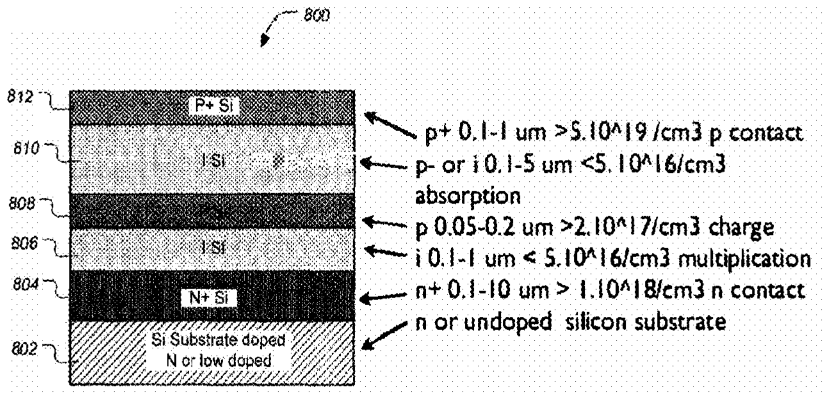
FIG. 8 is a cross section showing a silicon epitaxial structure for a high-speed high-efficiency microstructured APD, according to some embodiments.

FIG. 8 is a cross section showing a silicon epitaxial structure for a high-speed high-efficiency microstructured APD, according to some embodiments.

Layers 800 are shown prior to microstructure processing. With minor modifications, the n and p doping can be switched and the direction of illumination may also be affected. Starting with a N silicon substrate 802 (or low doped or silicon on sapphire or a BOX/SOI wafer depending on the application and packaging considerations), an $N^+$ layer 804 (N ohmic contact layer) is formed with doping concentration of greater than $10^{18}$ $cm^{-3}$ (typically phosphorous) with layer thickness ranging approximately from 0.1 to 10 μm. A non-intentionally doped layer "i" 806 or a P (very low doping level P layer) has a doping concentration less than $5\times10^{16}$ $cm^{-3}$ (this is the multiplication or electronic gain layer of the APD) with thickness ranging approximately from 0.1 to 2.0 μm depending on gain and bandwidth of the APD. A P charge layer 808 is grown with an approximate thickness 0.05-0.2 μm and doping concentration of greater than $2\times10^{17}$ $cm^{-3}$. An absorption layer 810 is grown (P or "i") ("I" and "i" are used interchangeably herein) with doping less than $5\times10^{16}$ $cm^{-3}$ with thickness ranging approximately from 0.1 to 5 μm. Finally a $P^+$ contact layer 812 is grown with doping greater than $5\times10^{19}$ $cm^{-3}$ with layer thickness ranging approximately from 0.1 to 1.0 μm. According to some embodiments, all layers 800 are grown epitaxially using CVD or MOCVD reactors. Doping and thickness are approximate and are adjusted depending on applications.

For best noise performance of the Si APD, photogenerated electrons should dominate in the multiplication process; i.e. holes diffuse/drift toward p (anode) and electrons diffuse/drift toward the n (cathode) with reverse bias. The Si layers 800 are grown epitaxially using chemical vapor deposition, plasma enhanced chemical vapor deposition, molecular beam epitaxy, atomic layer deposition (can be a combination of these methods to generate the optimal layer structure in doping and interface quality) on doped or undoped substrates. The total length for the electrons to transit range from approximately 0.25 to 7.2 microns. This can be, for example, 0.5 μm for absorption, 0.1 μm for charge, 0.5 μm for multiplication, with a total of 1.1 μm for the APD layer structure 800 shown. According to some embodiments, for higher QE, the absorption region can be lengthened to one μm for a total transit length of 1.6 μm for example. Other layer thickness and doping concentrations can be adjusted to optimize device characteristics for different wavelength, integration with CMOS, application requirements, operating conditions such as bias voltage, gain and noise.

Also, the APD can be illuminated with modulated optical signal from the bottom, where using BOX or SOI, the bulk of the substrate can be removed to minimize optical losses and thus can use the double pass of the photons in the enhanced absorbing microstructured layer.

Figure 9A:
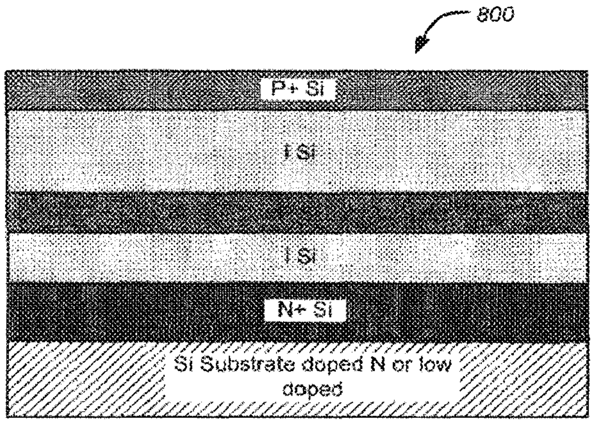
FIGS. 9A-9E are a series of cross sections showing some basic microstructure processing steps, for a high-speed APD, according to some embodiments.
Figure 9B:
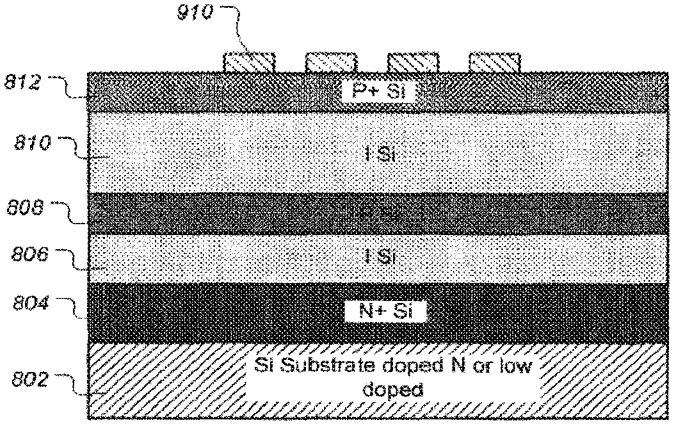
Figure 9C:
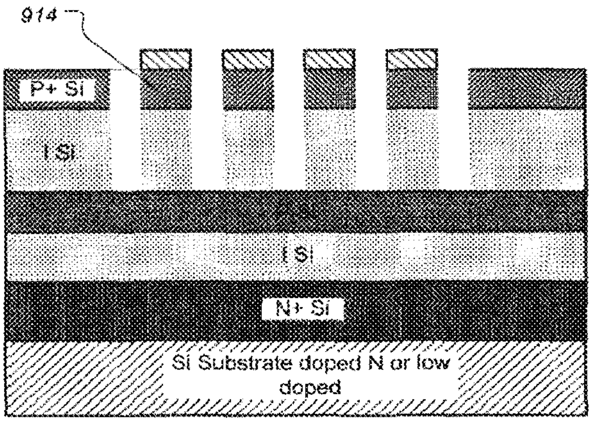
Figure 9D:
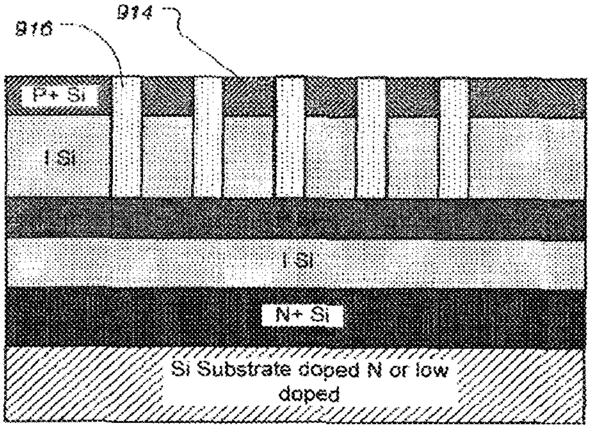
Figure 9E:
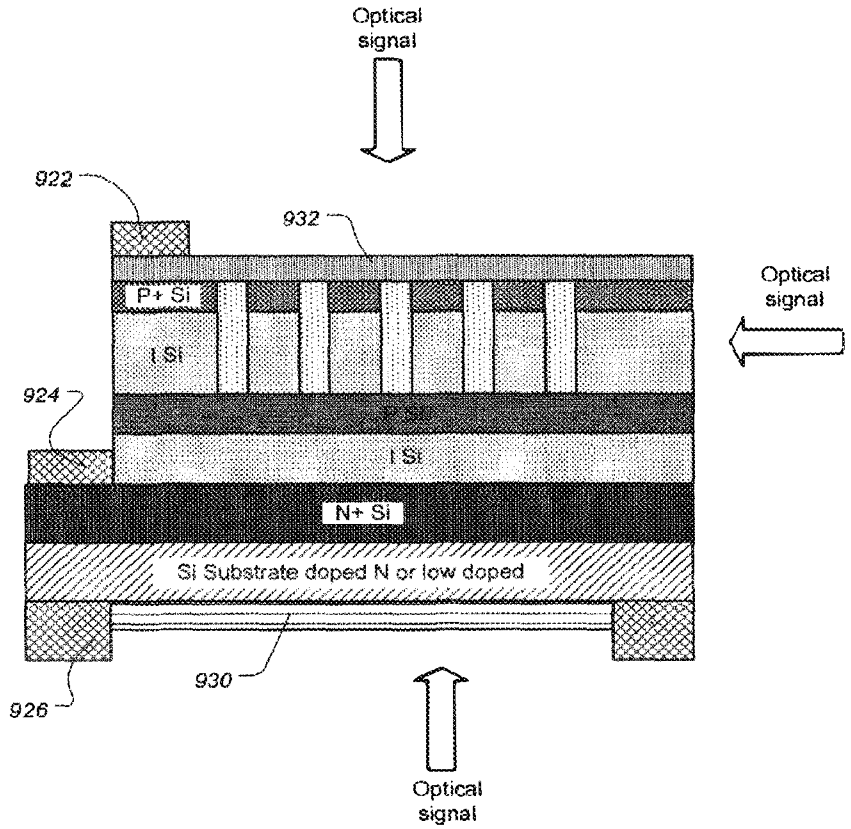

FIGS. 9A-9E are a series of cross sections showing some basic microstructure processing steps, for a high-speed APD, according to some embodiments. FIG. 9A shows the high speed APD epi structure 800 as described with respect to FIG. 8. In FIG. 9B, as in the PD process, a P-ohmic metallization or dielectric mask 910 can be deposited first on the Player 812 for the microstructured pillars. In the case of holes and/or voids this step may not be carried out. Dry etch mask 910 is deposited on the surface using photolithography, metal/dielectric deposition techniques and wet/dry etching. In FIG. 9C, according to some embodiments, reactive ion etching (RIE) or deep reactive ion etching (DRIE), wet etching using chemicals and oxidation of the Si are used to generate the microstructured pillars 914. Native silicon oxide for surface passivation can be provided by thermal oxidation (which is preferred in some cases), electrochemical anodization, and/or plasma enhanced chemical vapor deposition. According to some embodiments, the thermal oxidation of the pillars 914 can also be used to fine tune the diameter of the pillar since the oxide is created from the Si material. Thermal oxidation also smooths the surface which is favorable for electrical properties. In FIG. 9D a filler 916 is used to fill or partially fill the space between the Si pillars 914 to support subsequent contact layers to be deposited. The filler 916 can be spin on glass, polyimide, dielectric such as silicon nitride, or silicon oxide, that can be deposited for example using plasma enhanced chemical vapor deposition. Once the contacts are made the fillers can be left in place or removed by dissolving the filler with an etchant or solvent. Removing the filler has an advantage of further reducing the capacitance of the device since air has a dielectric constant of 1. The reduction of the capacitance allows the device to operate at higher bandwidth due to reduction of the RC time. In FIG. 9E, the anode and cathode ohmic contact metallizations 922, 924 and 926 are made. Depending on the direction of illumination, transparent conducting oxide TCO 932 (such as indium tin oxide ITO) can be used. In the case of top illumination, a dry etch can be used to expose the pillars if they are buried in the filler. The TCO 932 can then be used to contact the $P^+$ silicon pillars at the tip or the P ohmic metallization 922. Ohmic contact metallization is then applied to the cathode ($N^+$) layer either on the surface (924) or bottom (926) depending on integration topology.

In the case of the optical signal coming from the substrate side (the bottom), the wafer is thinned. If the thinning is carried out by etching it can include a buried silicon dioxide layer such as silicon on insulator, SOI/BOX, such that the oxide layer can act as an etch stop layer. The wafer can be thinned first by chemical mechanical polishing to 100 μm followed by a via etch to the oxide layer which can be selectively etched off, such that the optical signal only need to traverse a few micrometers of Si bulk material. Anti-reflection coating 930 is applied to the Si surface to minimize reflection loss. Ohmic metallization is applied to the $N^+$ layer followed by bond metal 924. On the microstructured pillars, ohmic metallization is applied to the $P^+$ tips (if its not applied already in the preliminary steps), followed by bond metal 922. According to some embodiments, an advantage of the optical signal entering from the substrate surface (i.e. the bottom) is that the light will bounce and travel twice within the pillar structures, thus increasing the quantum efficiency. According to some other embodiments, the pillars can be made shorter to improve the transit time.

Figure 52:
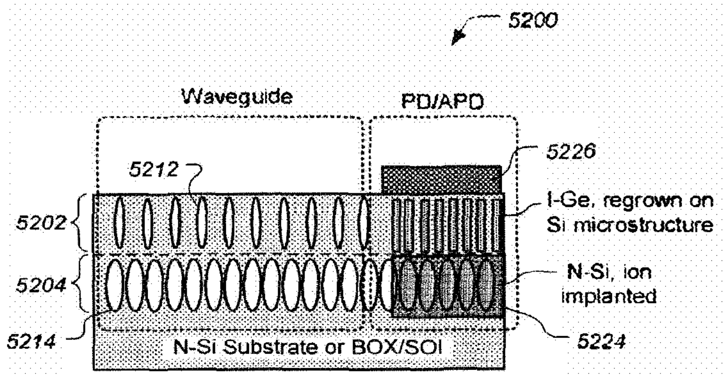
FIGS. 52 and 53 are a cross section and top view, respectively, of a ridge waveguide integrated with a microstructured PD/APD, according to some embodiments.

According to some embodiments, the optical signal can also enter from the edge as shown FIG. 52, infra, either in a guided mode or in free space. In the edge application, TCO 932 and solid anode ohmic contacts may not be used and wafer thinning may not be carried out. Cathode ohmic contacts can instead complete the structure. According to some embodiments, in edge approach, the pillars are arranged such that their density is not uniform to optimize the capture of the optical radiation. It can be arranged in a V pattern for example to reduce optical reflection.

Not shown in FIGS. 9A-9D are mesa etching steps used to define the diameter of the APD 920. According to some embodiments, other methods such as ion implantation may also be used. Note that the microstructures themselves provide good confinement of current in the vertical direction and not in the lateral direction. Other known processing steps that are not shown for sake of simplicity include: thermal oxidation passivation of exposed surfaces; adding guard rings; thinning of the wafer; adding anti-reflection coatings; annealing of ohmic contacts; and creating via holes for removal of filler.

Taking advantage of low absorption constant of bulk Si. High speed photodiodes made with III-V material often are constructed such than the photocarriers are generated only in the i layer of a PiN structure to minimize the photogenerated carriers outside of the high field region that can cause degradation to the frequency response of the device. This can be done easily in III-V material since there are many ternary and quaternary material such as InGaAsP, InGaAs, InAs, that are lattice matched to InP and the bandgap of these alloys can be changed by altering the composition such that the P+ anode 812 and P charge 808 layers are mostly transparent and the i layer is absorbing. However it is not easy for silicon since there are no materials that are lattice matched to silicon. Germanium can be grown on silicon but with the addition of a buffer layer to accommodate for the lattice mismatch.

According to some embodiments, a method to overcome this issue in silicon is to take advantage of the low absorption constant of silicon at radiation near the bandgap of silicon. According to some embodiments, the wafer can be thinned to the insulator of an SOI structure and the 850 nm optical signal will only traverse 1-2 μm of bulk silicon losing approximately 10% or less of the incident radiation. The rest of the radiation continues to the microstructured pillar silicon where the absorption is stronger possibly due to resonance effects. According to some embodiments, the shape of the pillars can be circular, oval, rectangle, chevron, hexagon, double-circle, crescent, star, or any shape to optimize absorption and collection efficiency. The pillar diameter range from 50-1200 nm (smallest dimension can be 50 and largest dimension 1200 nm) and can be spaced uniformly or non-uniformly, periodic or aperiodic, chirped, or a pattern either locally or globally to optimize APD/PD performance and applications. The spacing of the pillars can be 20-2000 nm. The microstructured pillars can be 100 to 10000 nm in length that is optimized for bandwidth and efficiency for a particular wavelength near the silicon bandgap for example 850, 880, 980, 1000 nm.

According to some embodiments, multiple dimensions (both structure and spacing) of the microstructures within a single PD/APD can broaden the resonance bandwidth of the microstructures such that the enhanced absorption coefficient is over a broader optical spectrum.

The substrate becomes less absorbing as the wavelength approaches 1100 nm (1.1 eV Si indirect bandgap).

According to some embodiments, the microstructured pillars/holes/voids can have orientations that are not perpendicular to the surface of the silicon substrate. Other orientations off perpendicular or with multiple orientations or even random or pseudo-random are possible to optimize the QE with respect to the directivity of the optical signal. In multiple and/or random or pseudo random orientations of the microstructures, the device become less sensitive to the direction of light illumination which is beneficial in PV applications. In certain applications, antenna like high directivity of the PD/APD may be desirable to avoid cross talk for example from other optical signal sources or to further improve its QE.

According to some embodiments, microstructured hole arrays, instead of pillar arrays, are used as light traps in silicon. Microstructure hole arrays have similar properties as microstructured pillars. See e.g. Lin et al, Optical absorption enhancement in silicon nanowire and nanohole arrays for photovoltaic applications, Next Generation (Nano) Photonic and Cell Technologies for Solar Energy Conversion, edited by Loucas Tsakalakos, Proc. of SPIE Vol. 7772, 77721G (2010). According to some embodiments, instead of etching microstructured pillar arrays as described herein, microstructured hole arrays are etched using RIE/DRIE and similar processing for the pillars, including thermal oxidation for surface passivation, deep ion implantation for electrical isolation, confinement of optical fields and reduction of capacitance. In the case of the hole arrays, it is possible that the filler need not extend the entire length of the hole. For example, if the surface tension of the filler is high, only partial filling of the holes with filler will be possible and provide support for subsequent layers of TCO, metal, oxide, silicide, alloys to name a few that may be necessary to complete the device structure. According to some embodiments, in the case of microstructured holes, fillers are not used in the PD/APD/PV devices since the surface is contiguous rather than consisting of islands as in the case of microstructured pillars.

According to some embodiments, the microstructured holes can have diameters of 50-3000 nm and can be a square, hexagon, oval, rectangle, chevron, double-hole, with the smallest dimension at 50 nm to the largest dimension of 3000 nm approximately. The spacing between holes (adjacent edges) can be regular or irregular or a pattern at 20-2000 nm. The depth (or length) of the hole can be 100 to 10000 nm and can be uniform depth or non-uniform depth. Dimensions are chosen for optimal absorption, quantum efficiency, bandwidth and radiation collection efficiency for a particular wavelength and application.

Figures 10A, 10B:
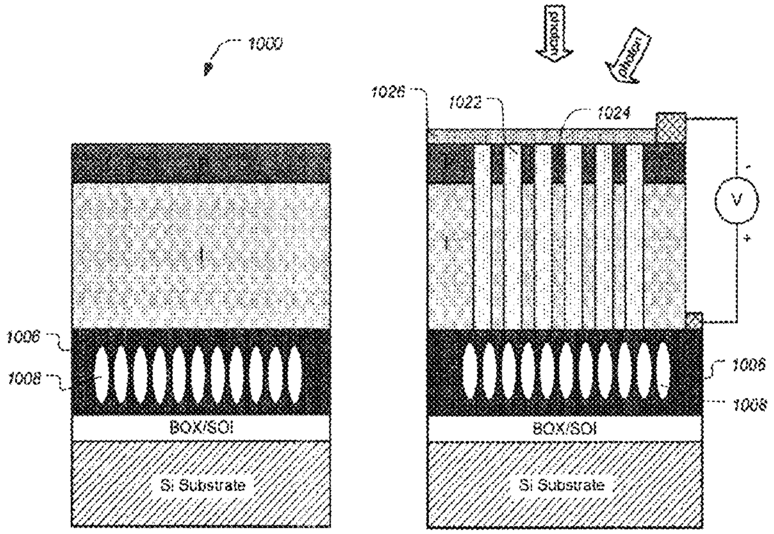
FIGS. 10A-10B are cross sections showing aspects of a top illuminated microstructered photo diodes, avalanche photo diodes and/or photovoltaics (PV) with microstructured voids in N—Si, according to some embodiments.

As discussed earlier, to optimize High Contrast Grating in the Absorption regime of this invention, it may be desirable to have the microstructured enhanced absorption structures on materials of a lower refractive index such as BOX or SOI where the silicon dioxide refractive index is lower than that of Si, Ge or III-V/II-VI material. According to some embodiments, the effective refractive index can be made lower than the refractive index of the microstructures with the inclusion of voids in the substrate. FIGS. 10A-10B are cross sections showing aspects of a top illuminated microstructered photo diodes, avalanche photo diodes and/or photovoltaics (PV) with microstructured voids in N—Si, according to some embodiments. Voids can be included in the substrate or as a microstructure for enhancing absorption coefficient as will be discussed infra. Refractive index in the optical spectrum of Si, Ge, III-V material typically range from 3-3.6, by using silicon dioxide such as SOI and voids that are 50% of the material in volume, the refractive index or effective refractive index can be reduced to approximately 0.5 that of the bulk semiconductors. By adjusting the ratio of the volume of the voids to the material (Si for example) the effective refractive index can also be adjusted from a few percent to more than 90% that of the bulk material. The voids can be filled with other material such that it is not just air, gas or vacuum, but a dielectric such as glass, polymer, dielectric, oxide, or amorphous semiconductor that can be optically and/or electrically passive and or active with optical and/or electrical gain for example.

FIG. 10A shows the layers 1000 including N—Si layer 1006 which contains microstructured voids 1008 that effectively reduce the refractive index of the N—Si layer 1006 as described. FIG. 10B shows a top illuminated PD/APD/PV 1020 that includes microstructured pillars 1024 and/or holes 1022, as well as transparent conducting oxide layer 1026. Microstructered voids 1008 can be random or patterned. The microstructered voids 1008 can be used reflect photons back to the absorbing "I" region if the voids 1008 are patterned to have HCG effects at wavelengths where loss is low such as 950-1100 nm. According to some embodiments, BOX or SOI substrates can also be used together with voids or without voids or without BOX/SOI.

According to some embodiments, the microstructuring techniques described herein are also applied to heteroepitaxial material (III-V on Si, Ge on Si, or II-VI on Si). Ge (bandgap 0.66 eV at 300K) having much smaller bandgap than Si, can be used for detecting optical signals at 850 and 1300 nm. Using the techniques described herein, Ge devices can also be made to detect optical signal with wavelength at 1550-1600 nm which can than replace III-V material based photodetectors. According to some embodiments, microstructures are grown such as nano/microwires or etched from bulk material with or without lithographic masking.

Ge thin film can be grown epitaxially on Si. See, e.g. Kang et al, Epitaxially-grown Ge/Si avalanche photodiodes for 1.3 μm light detection, 23 Jun. 2008/Vol. 16, No. 13/OPTICS EXPRESS 9365 (hereinafter "Kang et al."), where an APD was fabricated for 1310 nm wavelength operation for a 30 μm diameter device. The QE of the device with a 1 μm Ge absorption length is only 56% whereas by using microstructured pillars/holes/voids according to embodiments described herein, QE of approximately 90% or greater can be achieved at 1300-1600 nm wavelength with bandwidths of approximately 30 Gb/s or greater for a 30 micrometer diameter PD/APD. Such devices can find useful applications in datacenters, local area networks, and in metro and long distance optical data/telecommunications. According to some embodiments, integration on silicon is used which results in significant cost reduction in manufacturing and packaging. In comparison, in Kang et al. a 30 μm diameter APD was only able to reach approximately 15 Gb/s bandwidth at 1310 nm and cannot extend the wavelength due to low absorption of the bulk material without sacrificing a significant reduction in bandwidth.

Figure 11A:
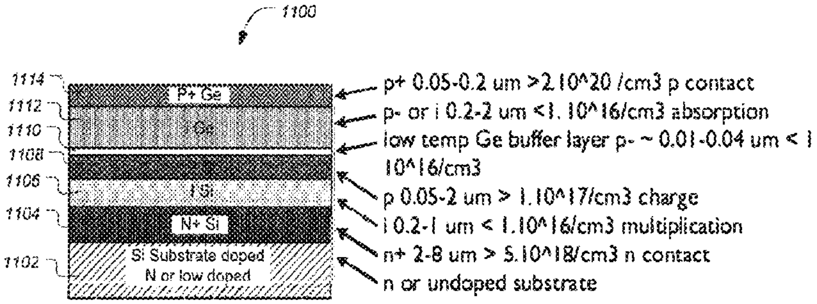
FIGS. 11A and 11B are cross sections showing aspects of an heteroepitaxial APD structure of Ge on Si, according to some embodiments.
Figure 11B:
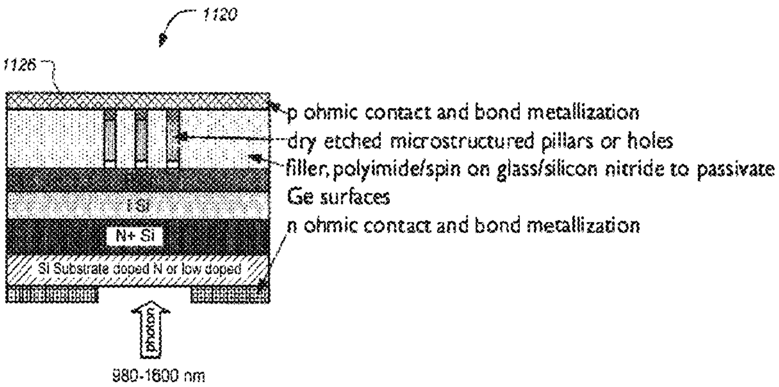

FIGS. 11A and 11B are cross sections showing aspects of an heteroepitaxial APD structure of Ge on Si, according to some embodiments. Layers 1100 and APD device 1120 show a possible heteroepitaxial APD structure of Ge on Si (as opposed to descriptions, supra, of homoepitaxial APD/PD structure where only silicon is used with different doping concentrations). Similar processing methods as in the homoepitaxial Si APD are used to fabricate microstructured pillar/hole arrays. According to some embodiments, the absorption constant of bulk Ge is enhanced by greater than 70×, for example 73-172×. According to some embodiments, APDs and PDs with bandwidths in excess of 30 Gb/s can be achieved in devices with an active diameter of 30 μm or less at wavelengths to 1750 nm and QE of approximately 90% or greater. This is a significant improvement over existing Ge on Si APD with illumination normal or off normal to the surface of the substrates.

According to some embodiments, the microstructured pillar and hole (and variations thereof) arrays can be fabricated in Si, Ge, Ge on Si, SiGe on Si, SiGe on Ge; it can be any combination of Si, Ge and SiGe.

At longer wavelengths 1200-1800 nm, Ge (germanium) photodiodes are often used since Ge has a bandgap of 0.66 eV (whereas Si has a bandgap of 1.1 eV). However, for high bandwidth applications (greater or equal to 20 Gb/s) Ge photodiodes are only good to 1350 nm due to the fact that for transit times to be approximately 30 picosec (electron saturated drift velocity is $6\times10^6$ cm/s at $1\times10^4$ V/cm in order to have a bandwidth of approximately 20 Gb/s (f(3 dB)=0.44/T where T is the transit time through the "I" region) the length of the absorption region or the "I" region is limited to approximately 2 microns. At this length, the QE at 1550 and 1600 nm is less than 10%, which is not generally acceptable for optical receivers for datacom and telecom applications. In a waveguide configuration, the length of the absorption region can be 50-100 microns and still achieve 20 Gb/s or higher with QE equal or greater than 90%. The waveguide Ge on Si photodiode structure have been reported by other research groups however such waveguide photodiodes have excess optical losses due to waveguide losses and coupling loss (coupling of optical signal to the optical waveguide) which can be as high as 3 dB or half of the optical signal is lost. The "free-space" coupling (where the optical signal is directed to the PD/APD using elements such as lens, diffraction elements, light pipes, optical waveguides to name a few) of optical signal to the microstructured photodiode and avalanche photodiode have much less optical losses, typically a few percent or less. One of the reason is the large area of the microstructured PD/APD which is 30 microns in diameter as compared to waveguide photodiodes its dimensions are a few microns, typically 1-2 microns. Not only is coupling loss high in waveguide PD/APD, it often uses active alignment which requires that the waveguide PD/APD is turned on to monitor the coupling of the optical signal into the waveguide PD/APD. This active alignment is slow and time consuming which adds cost to the packaging of the waveguide PD/APD in any optical receiver module. In contrast, the large area microstructured PD/APD, according to some embodiments, uses only passive alignment where it is aligned without turning on the microstructured PD/APD. Such alignment is much faster and easier which reduces the cost of a microstructured PD/APD in any optical receiver module. It should be noted that with the effective capacitance of the microstructured PD/APD significantly lower than bulk PD/APD by 10 to 80% or more, the area of the microstructured PD/APD can be correspondingly larger by 10 to 80% or more.

In FIG. 11B, a microstructured Ge on Si pillars/holes APD structure 1120 with bottom illumination is shown. Epitaxial layers for an APD Ge on Si are used where the optical absorption to generate electron-hole pairs takes place in Ge and the gain/multiplication of the electrical charged carriers takes place in Si. The epitaxially grown layers are similar to Ge on Si bulk (thin film) APD with the following layer compositions ranges (shown in FIG. 11A). N is undoped, or low doped (20 ohms-cm) Si substrate 1102, which can also be SOI or BOX, to allow removal of the Si substrate for bottom illumination and/or to reduce the refractive index. If SOI or BOX substrates are used, the N ohmic contact and bond metal will be on the $N^+$—Si surface adjacent to the multiplication I region. $N^+$ contact layer 1104 which can be 2-8 microns, $N^+>5\cdot10^{18}$ cm$^{-3}$. I multiplication layer (or gain layer) 1106 which can be undoped (not intentionally doped), 0.2-1.0 microns thick and $I<1\cdot10^{16}$ cm$^{-3}$. P charge layer 1108 having a thickness of 0.05-0.2 microns and $P\sim1\text{-}6\cdot10^{17}$ cm$^{-3}$. $P^-$ low temp Ge buffer layer 1110 having a thickness of ~0.01-0.04 microns and $P^-\sim<1\cdot10^{16}$ cm$^{-3}$. I or $P^-$ absorption layer 1112 having a thickness of 0.2-2.0 microns, and I (or $P^-$)$<1\cdot10^{16}$ cm$^{-3}$. Finally, $P^+$ contact layer 1114 has a thickness of 0.05-0.2 microns, and $P^+>2\cdot10^{20}$ cm$^{-3}$, approximately.

Starting with a wafer with all the layers 1100 grown for APD operation, the processing details are left out for simplicity. The basic steps involve first, depositing the p ohmic contact metal layer 1126 using e-beam, thermal or sputtering deposition. The microstructure pattern of either pillars or holes is photolithographically, using positive or negative or image reversal photoresist methods depending on pillars or holes, defined to form the etch mask for either dry or wet etching. According to some embodiments imprint lithography can be used. The microstructure patterns are etched on the $P^+$ and I (or $P^-$) and P Ge layers 1114, 1112 and 1110, respectively, partially or fully to the P Si layer 1108 (e.g. using fluorine, chlorine, bromine based gases such as $SF_6$, $CF_4$, $BCl_2$, $Cl_2$, for selective dry etching using RIE and DRIE). The selectivity of the etch between Ge and Si can be as high as 70, so as to etch Ge 70 times faster than Si by adjusting gases mixtures, pressure, temperature and bias, and power. The sidewalls of the microstructure patterns (pillars or holes) are passivated with dielectric or SiGe and gradually reducing the Ge content such that Si remains on the surface (using for example atomic layer deposition ALD) and subsequently using thermal oxidation to minimize surface recombination of the photogenerated carriers via surface states due to dangling bonds and other surface imperfections. According to some embodiments, other passivation techniques may also be applied such as ALD of Si oxides and Si nitrides. Planarization is performed using either spin on glass, polyimide, or PECVD deposition of dielectrics such as Si oxides and Si nitrides. An etch back is performed to expose the P layer. For microstructured holes and pillars, it may not be necessary to planarize completely, by using polyimide or spin-on glass to partially fill the holes and spaces between pillars. Ohmic and/or bond contacts are formed on the P and N layers. For top illuminated photodetectors, where the optical signal enters on the epitaxial surface where the microstructure patterns are fabricated, a transparent conducting oxide 1126 (the transparent conducting oxide may not be used in the case of microstructured holes) is deposited to connect all the P ohmic metal layers (for pillars). A voltage bias is applied between the $P^+$ Ge layer 1114 (anode) and the $N^+$ Si layer 1104 (cathode) of −2 to −45 V. The APD 1120 is operated in a reverse bias mode to deplete as much as possible both of the "I" layers. Many detailed processing steps are left out such as annealing, surface preparations, deposition of ohmic contacts, bond metal, RIE, DRIE, wet etching, masks for etching, mask removal, antireflection coatings, mirrors such as Bragg reflectors on the microstructured layers, to name a few. Ohmic contact metallization to P and N semiconductors and bond metallizations are well known in the art and details are not mentioned here. Also, holes are used in electron-hole pairs as charged electrical carriers and holes as in a physical void such as the microstructured holes. From context it should be understood if "hole" refers to a charged electrical particle or a physical void.

According to some embodiments, Ge surfaces of the microstructured pillars or holes and any Ge surfaces exposed to an electric field, where electric current can flow and/or where electric charges are formed are passivated to reduce current leakage, minimize surface states that can be a potential sink or recombination centers for carriers, especially photogenerated carriers of electrons and holes (as in Si, thermal oxide or rapid thermal exidation, to create $SiO_2$ and $SiO_x$ used to passivate any silicon surfaces that can cause excessive leakage current or recombination centers for photogenerated carriers, or a carrier sink) and $GeO_xN_y$, which is a native Ge oxynitride that is formed in two stages, where the Ge microstructured pillars and/or holes are first exposed to oxygen and then to ammonia ambient in a rapid thermal annealer to form the Ge oxynitride passivation layer. These passivation methods are well known in the art.

Figure 12:
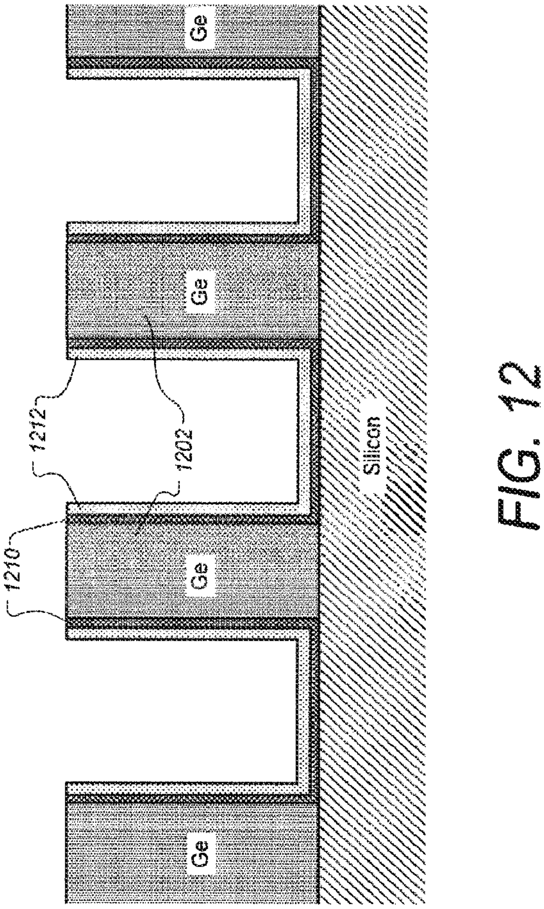
FIG. 12 is a cross section illustrating aspects of a passivation method for Ge surfaces on microstructures, according to some embodiments.

FIG. 12 is a cross section illustrating aspects of a passivation method for Ge surfaces on microstructures, according to some embodiments. Shown are microstructured Ge pillars 1202 (or holes) for a PD and/or APD. On the Ge surfaces is conformally epitaxially grown SiGe layer 1210. Gradually, the Ge content is reduced within layer 1210 until only Si is exposed on the surface. Thermal oxidation of Si is then used to passivate the exposed Si surfaces, forming SiO2 layer 1212, to minimize leakage current and surface states that can be a potential sink for carriers, especially photogenerated carriers (electrons and holes) that can degrade QE.

Figure 13A:
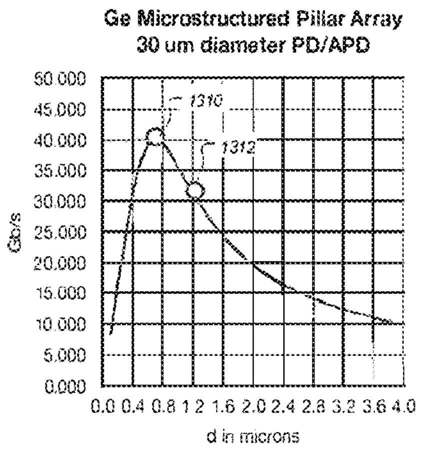
FIGS. 13A and 13B are graphs showing the effects of microstructure enhancement of Ge bulk absorption coefficient for photodiodes and/or avalanche photodiodes based on Ge on Si, according to some embodiments.
Figure 13B:
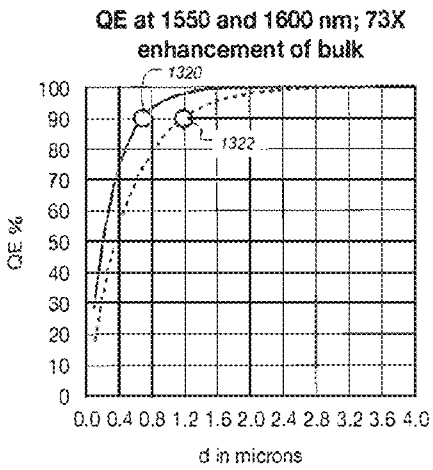

FIGS. 13A and 13B are graphs showing the effects of microstructure enhancement of Ge bulk absorption coefficient for photodiodes and/or avalanche photodiodes based on Ge on Si, according to some embodiments. According to some embodiments, a 73×enhancement of bulk absorption coefficient is gained in PD/APD devices having microstructured pillars/holes at 1550 and 1600 nm. FIG. 13A shows the bandwidth verses "d" or the length of the "I" layer for 1550 nm (point 1310) and for 1600 nm (point 1312) Note that APDs have both a Ge "I" layer and an Si "I" layer; whereas for PDs have just a Ge "I" layer. FIG. 13B shows QE verses "d" or "I" layer length for 1550 nm (point 1320) and 1600 nm (point 1322). It can be seen that for a 30 micron diameter active region PD/APD bandwidths of 40 and 31 Gb/s can be attained at 1550 nm and 1600 nm optical wavelength respectively with 90% QE. This result was not achievable with bulk Ge photodiodes and avalanche photodiodes of conventional design.

The separation of using Ge microstructures to absorb the light generating e-h (electron-hole) pairs and using Si for the avalanche multiplication of the carriers, preferably electrons, results in an APD with very low noise due to the fact that the ionization ratio (defined as hole ionization rate/electron ionization rate) for electrons injected into the multiplication region (gain region which is a function of applied reversed bias voltage) is lower than in III-V material family. This result in a low excess noise factor leads advantageously to a high signal to noise ratio (S/N).

Figure 14A:
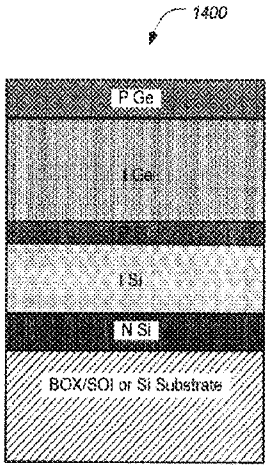
FIGS. 14A-14B are cross sections showing aspects of a top-illuminated Ge on Si avalanche photodiode having microstructured pillars/holes, according to some embodiments.
Figure 14B:
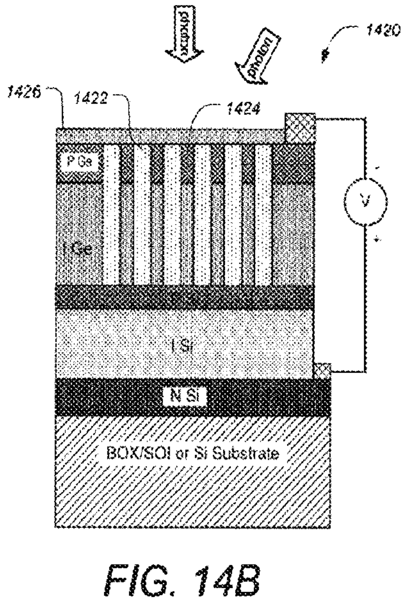

FIGS. 14A-14B are cross sections showing aspects of a top-illuminated Ge on Si avalanche photodiode having microstructured pillars/holes, according to some embodiments. FIG. 14A shows the bulk layers 1400. In FIG. 14B, top illuminated microstructured Ge on Si APD 1420 is shown with a semitransparent conductive oxide 1426 connecting the P-ohmics on the Ge microstructured pillars 1424 (holes 1422) as described supra. Both top and bottom illuminated microstructured Ge on Si share similar epitaxial structures. The processing steps for top and bottom illuminated microstructured APDs are similar. The main differences are that the transparent conductive oxide for top illuminated APD (or PD) is replaced with an opaque ohmic/bond metallization that can act as a mirror to reflect the optical signal back toward the absorption I layer. According to some embodiments, the mirror can also consist of Bragg reflectors either wafer bond to the microstructure or epitaxially or vacuum deposited such as dielectric or conductive metal dielectrics to enhance the reflectivity to greater than 90% of the optical signal. In addition, bottom illuminated PD/APD may require a window or via where most of the Si substrate is removed to reduce optical losses depending on the wavelength of the optical signal.

Figure 15A:
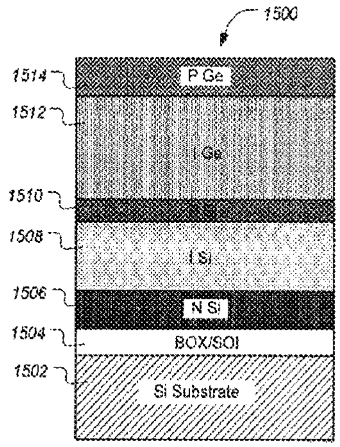
FIGS. 15A-15D are cross sections illustrating aspects of bottom-illuminated Ge on Si avalanche photodiodes having microstructured pillars/holes, according to some embodiments.
Figure 15B:
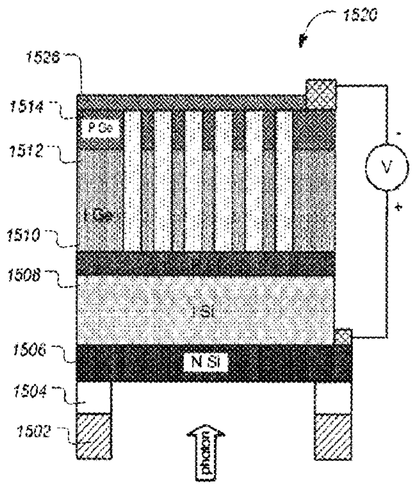
Figure 15C:
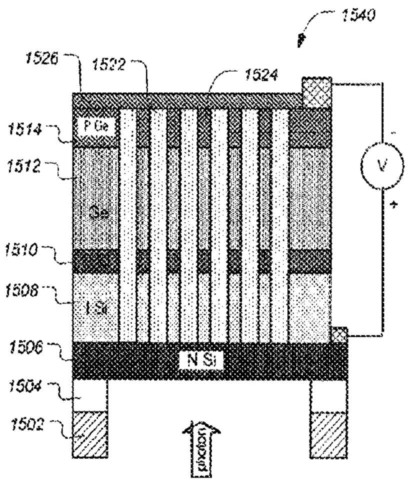

FIGS. 15A-15C are cross sections illustrating aspects of bottom-illuminated Ge on Si avalanche photodiodes having microstructured pillars/holes, according to some embodiments. FIG. 15A shows the bulk layers 1500 prior to forming the microstructures (pillars and/or holes). FIG. 15B shows a Ge on Si microstructured APD 1520 with the optical signal illuminating from the bottom (substrate side) for wavelengths from 1200-1800 nm. Note that Si is basically transparent at these wavelengths. According to some embodiments, to further reduce optical losses, the Si wafer can be thinned just at the area of illumination, for example through a via of 50-500 microns in diameter and thinned to the $N^+$ layer of the Si; or the Si substrate 1502 can include a BOX or SOI layer 1502. The Si substrate 1502 can then be thinned selectively to the BOX or insulator layer 1502 which can be etched away selectively. According to some embodiments, an anti reflection layer (not shown) can be added to minimize reflection. The advantage of this arrangement is that the optical signal will have a double bounce, reflecting off the metallization 1526 on the Ge $P^+$ layer 1514 and traversing the Ge "I" absorber region 1512 once again. For example, as shown in FIGS. 13A and 13B, keeping the same absorption length, Ge "I" length, the QE for both 1550 and 1600 nm would be approximately 90% or higher for a Si substrate side (bottom) illumination by the optical signal assuming negligible reflection loss. According to some embodiments, the Ge "I" absorption length can be further shortened to increase the bandwidth and still maintain acceptable QE.

For Ge epitaxially grown on Si, it is known that the bulk absorption coefficient is greater than that of Ge bulk by itself (not grown on Si); at 1750 nm the Ge on Si absorption coefficient is approximately 100 $cm^{-1}$. According to some embodiments, this can be enhanced by the microstructured pillars and/or holes by 172 times. The resulting enhanced Ge on Si microstructured pillar and/or holes absorption coefficient can be about $1.72 \cdot 10^4$ $cm^{-1}$.

Figure 15D:
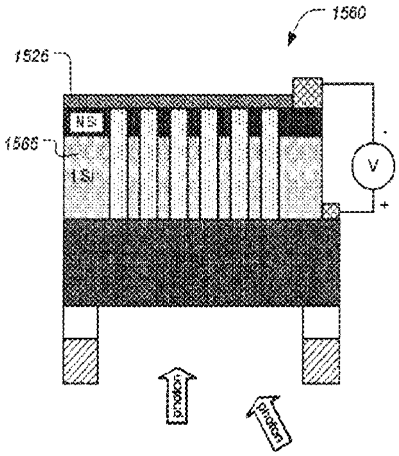

FIG. 15C shows an APD 1540 in which the microstructure extends all the way to the N cathode layer 1506 to further reduce capacitance and refractive index. In this case, the absorbing i layer 1512 is microstructured as is the charge layer 1510 and the i multiplication layer 1508. According to some embodiments, the microstructures can also be formed partially into the charge and multiplication layers 1510 and 1508. Additionally, according to some embodiments, the microstructures in the absorbing layer 1512 and the multiplication layer 1508 need not be the same. In FIG. 15D, photons may generate electron hole pairs in the multiplication region which may contribute to added gain but also may contribute to excess noise. According to some embodiments, the absorption and multiplication region using the microstructure APD is combined in one region without the use of the charge layer. This is possible due to enhanced absorption: the length of absorption and multiplication can be of the order of one micron or less allowing reasonable avalanche voltage.

FIG. 15D shows a microstructered APD 1560 where the absorption and multiplication region are a single region 1566, pillars or holes, according to some embodiments. This is enabled by the microstructure enhancing the absorption coefficient so that less than one micron of the absorbing microstructure length is needed to achieve QE of approximately 90% or more and avalanche multiplication can also occur in this length of material. For example, if 0.5 μm of microstructured Si shown in FIG. 15D is the thickness of layer 1566, a back illuminated APD 1560 allows a double bounce of the optical signal reflecting off the N ohmic contact and bond metallization resulting in an effective length of one micron of absorption length. The Si APD 1560 can operate at 0.5 μm multiplication length resulting in gain of 3 dB or more with a reverse bias ranging from −5 to −50 volts. According to some embodiments, the structure shown in FIG. 15D can be applied to other material systems such as Ge, Ge on Si, III-V, and III-V on Si or not on Si.

Figure 16A:
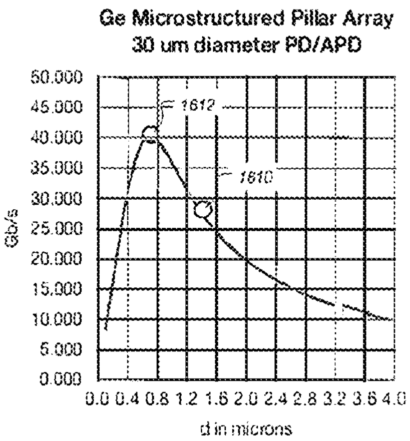
FIGS. 16A and 16B are graphs comparing single pass and double pass photodiodes and/or avalanche photodiodes based on Ge on Si, according to some embodiments.
Figure 16B:
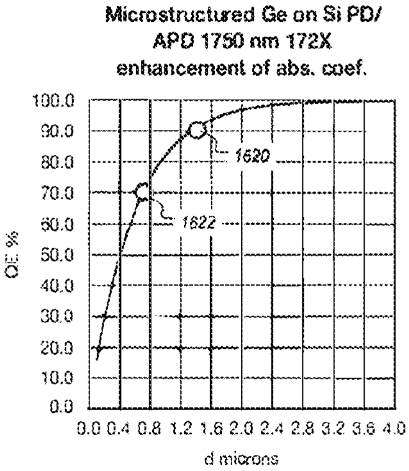

FIGS. 16A and 16B are graphs comparing single pass and double pass photodiodes and/or avalanche photodiodes based on Ge on Si, according to some embodiments. Points 1610 and 1620 show the bandwidth and QE values for single pass with d of approximately 1.4 microns and points 1612 and 1622 show the bandwidth and QE values for a thinner d of approximately 0.7 microns single pass. For double pass the device will have points 1612 for bandwidth and point 1622 for QE. At 1750 nm optical signal wavelength, using absorption coefficient data of 100/cm for Ge on Si and with, for example, 172 times (172×) enhancement factor due to the microstructured Ge on Si photodiode/avalanche photodiode structures, a bandwidth of 27 Gb/s and a QE of approximately as high as 90% can be attained with an "I" (also "d") length of approximately 1.4 microns for a single pass (top illuminated—where the optical signal illuminates the top Ge microstructured side). As mentioned earlier, for photodiodes the "I" or "d" is the absorption length, whereas for avalanche photodiodes the "I" is the combined absorption length and the multiplication length. For example, for an APD to achieve 27 Gb/s the total "I" length needs to be limited to 1.4 microns. A double pass arrangement can be used such that for example the absorption length is 0.9 microns and the multiplication is 0.5 microns, making the absorption length effectively 1.8 microns to achieve QE above 90%. However, if we instead have the optical signal illuminate from the bottom Si substrate side, the Si substrate and Si layers are basically transparent and have minimal optical losses (approximately 1-3 dB/cm) at optical radiation energies that are below the bandgap of Si (1.1 eV or 1127 nm wavelength at 300K) for example for radiation from 1200-1800 nm wavelengths. The advantage of illuminating from the Si substrate side (bottom) is that the optical signal can have a double pass at the Ge "I" absorbing region if the metallization on the $P^+$ contact layer is reflective which it should be since it is metallic composing of Au, Al, Ag, Cr, Zn, Ti, Ta, Ge, or a combination of these metals and semiconductors. Bragg reflectors consisting of material with alternating refractive indices from oxides, nitrides, chlorides, semiconductors, either wafer bonded to the microstructures or deposited on the microstructures can also be incorporated. Reflectivity can be greater than 90%. With double pass, as shown in FIGS. 16A and 16B, a bandwidth of 40 Gb/s can be attained with a QE approximately as high as 90% or more.

Figure 17A:
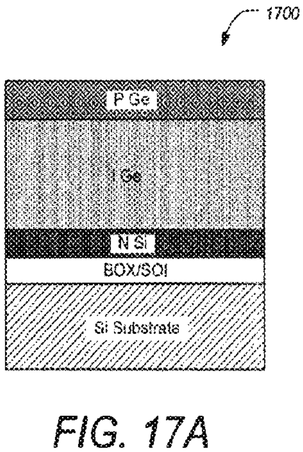
FIGS. 17A-17B are cross sections showing aspects of a top-illuminated Ge on Si photodiode structure having microstructured pillars/holes for applications with signal wavelengths ranging from 700 to 1800 nm, according to some embodiments.
Figure 17B:
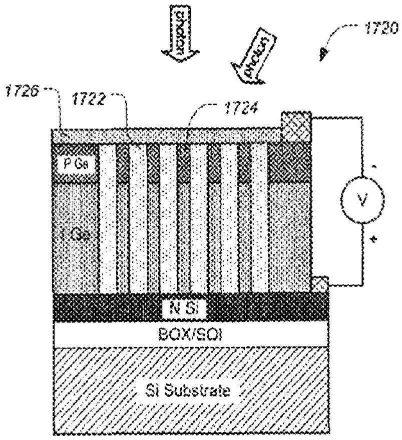

FIGS. 17A-17B are cross sections showing aspects of a top-illuminated Ge on Si photodiode structure having microstructured pillars/holes for applications with signal wavelengths ranging from 700 to 1800 nm, according to some embodiments. FIG. 17A shows the bulk layers 1700. In FIG. 17B, Ge on Si microstructured pillars 1724 and/or holes 1722 are in a configuration for photodiode 1720. This is essentially a P-I-N structure where the "P" and "I" are Ge with microstructured pillars 1724 and/or holes 1722 to enhance the bulk absorption coefficient of Ge grown on Si. The increase in the absorption coefficient of Ge grown on Si (Ge on Si) could be due to the stress build in the Ge epitaxial layer due to lattice mismatch with the Si host substrate that it is grown on. Optical signal as in the case for Ge on Si APD can be illuminated from either the microstructured side (as in FIG. 17B) or the substrate side (as in FIG. 18B).

Figure 18A:
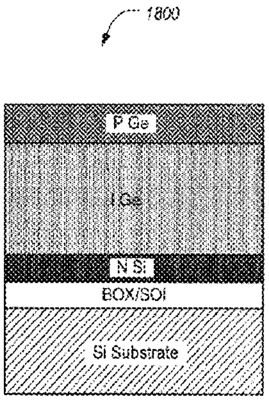
FIGS. 18A-18B are cross sections showing aspects of a bottom-illuminated Ge on Si photodiode structure having microstructured pillars/holes for applications with signal wavelengths ranging from 1200 to 1800 nm, according to some embodiments.
Figure 18B:
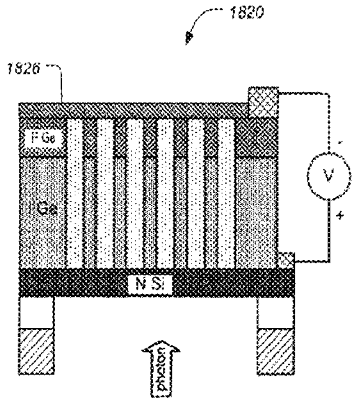

FIGS. 18A-18B are cross sections showing aspects of a bottom-illuminated Ge on Si photodiode structure having microstructured pillars/holes for applications with signal wavelengths ranging from 1200 to 1800 nm, according to some embodiments. FIG. 18A shows the bulk layers 1800. FIG. 18B shows photo diode 1820 configured for signal illumination from the Si substrate side (bottom illumination) with photo energies that are less than the Si bandgap of 1.1 eV at 300K. The corresponding wavelength range is 1200 to 1800 nm. Ohmic contact 1826 can also act as a mirror such that the light makes a double pass of the Ge absorbing microstructures where the metal contact layer on the P Ge can reflect the optical signal back toward the Ge "I" absorbing layer.

It should be noted that in all the discussions of the P-I-N structures, according to some embodiments the P and N are interchanged such as with an N-I-P structure formed on a P substrate or on a low doped P substrate or undoped substrate. According to some embodiments, the N and P for the APD structures are also interchanged and the substrate can be P, low doped P or undoped. However, in an Si multiplication layer, to achieve the lowest noise and the best S/N, electrons are injected into the multiplication region as dominantly as possible since the ionization rate of electrons is higher than the ionization rate of holes in Si; the ionization ratio for Si can range from 0.06 to 0.002 where as compared to Ge and InGaAs it is 0.9 and 0.45 respectively. This is why in many of the embodiments described herein the enhanced absorption is in Ge microstructures and the gain or multiplication which is dependent on the field strength and therefore on the applied reverse bias voltage which for the described devices can range from −10 to −60 V, is in Si.

According to some embodiments, the microstructured pillars and or holes for Si and Ge on Si photodiodes (PD) and avalanche photodiodes (APD) are used to replace relatively expensive III-V photodiodes. The Si microstructured pillars and holes PD/APD can operate from 500 to 1100 nm at bandwidths of 20 Gb/s or higher and QE of 90% or higher. In particular, the datacom wavelengths of 730-980 nm. The microstructured pillars and or holes on Ge epitaxially grown on Si PD and APD can operate from 500-1800 nm with bandwidths of 20 Gb/s or more and QE of 90% or more. In particular, the telecom wavelengths of 1250-1600 nm and possibly to 1750 nm. The techniques described herein thus extends the wavelengths, bandwidth and QE of conventional Si and Ge on Si free space coupled photodiodes and avalanche photodiodes.

According to some embodiments, the microstructured pillars can also be fabricated using VLS (vapor-liquid-solid epitaxy) growth of Ge nanowires on an Si substrate. Others have demonstrated the growth of vertical Ge nanowires on Si (111) orientation for example, with Au nanoparticles as catalysts for the VLS epitaxial growth using chemical vapor deposition (CVD) or metal organic chemical vapor deposition (MOCVD). Crystal orientations other than (111), or with materials with multiple orientations such as in polycrystalline may be used. Materials such as Si, Ge, III-V, glass, quartz, metal, to name a few can also be used as substrates. According to some embodiments, a thin Ge buffer layer of approximately 2 nm on Si (111) substrate is formed together with Au nanoparticles as catalysts for VLS growth in a CVD reactor. The Au catalyst can be deposited using a lithography mask to expose photoresist that is coated on the Si substrate. The Au is evaporated onto the Si substrate with patterned photoresist. Using standard processing methods such as lift-off, the Au pattern is left behind on the Si substrate which is then the catalyst for Ge VLS growth on Si substrates. According to some embodiments, it can also be grown using selective area growth where a dielectric mask is deposited on the Si substrate with a pattern of voids that allow Ge to grow in the void using CVD.

The microstructure of pillars and holes on the surface of a bulk photodiode not only enhance the absorption coefficient by factors ranging from 10-200 over the absorption coefficient of bulk material (material without any microstructured features and grown on lattice matched substrates so that stress due to lattice mismatch is minimal) but also significantly reduce the capacitance of devices such as PDs and APDs. The reduction in capacitance allows the PD or APD to have a shorter absorption length, which in turns result in a faster transit time for the photogenerated carriers to be swept out of the high field region. The absorption region typically is depleted as much as possible by the reverse bias voltage that is applied externally with an electric field strength approaching 10,000 V/cm or higher. If the microstructured pillars or holes can result in removing half or more of the semiconductor material, which for silicon has a dielectric constant of 11.9 and germanium have a dielectric constant of 16, replacing the removed material with either air (dielectric constant of 1) or polyimide (dielectric constant of 3.5) or other dielectrics with low dielectric constants, then the overall capacitance can be estimated to be the sum of the capacitance due to the total area occupied by the semiconductor and the capacitance due to the area occupied by air or polyimide. C(total)=C(semiconductor)+C(air or polyimide) where C=εA/d where ε is the dielectric constant times the free space permittivity ($8.854\ 10^{-14}$ farads/cm), A is the area occupied by the semiconductor or air/polyimide and d is the length of the "I" region which can be the absorbing region or the absorbing and multiplication region as in the case for APD. From the equation for C (total), the more semiconductor material which has a high dielectric constant removed and replaced by low dielectric material such as air/polyimide/SiOx/spin on glass the lower the overall capacitance and the faster the RC time. This reduction of capacitance for PD and APD invention can be extended to other PD and APD such as those of III-V material, microstructures can be fabricated on its surfaces and extend into and pass the optical signal absorbing regions to remove half or more of the semiconductor material to reduce its capacitance and can effectively make a larger area PD/APD and have the same bandwidth as before etching microstructures on the device. The larger area allows for easier coupling of the optical signal to the photodetector. A simple formula for the increase in radius for example by replacing semiconductor material with low dielectric material is: $r=(\varepsilon_1/((\varepsilon_1-\varepsilon_2)x+\varepsilon_2)))^{1/2}\ r_o$ where x is the fraction of semiconductor area left, $\varepsilon_1$ is the dielectric constant of the semiconductor, $\varepsilon_2$ is the low dielectric material such as air or polyimide or spin on glass, and $r_o$ is the radius of the active area of the PD/APD before etching microstructured pillars and or holes. As an example, for a 20 micron diameter Ge photodiode with $\varepsilon_1=16$ and for simplicity $\varepsilon_2=1$ (air) and x=0.5 (half of the semiconductor material is removed in the microstructured pillar or holes), the increase in the new radius with the same capacitance as the non-microstructured Ge PD is 13 microns or a diameter of 26 microns which is significantly larger than 20 microns and can significantly reduce the cost of coupling the optical signal into the microstructured large area photodetector. This reduces the cost of passive packaging of the optical receiver module and increase the yield.

Figure 19A:
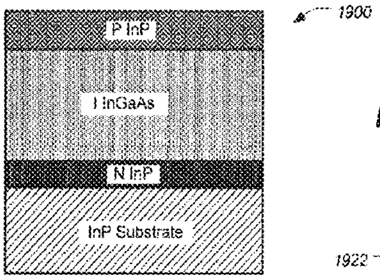
FIGS. 19A-19C are diagrams illustrating how microstructures can reduce capacitance of a photodiode such that a larger area photo diode can be fabricated with the same bandwidth and QE, according to some embodiments.
Figure 19C:
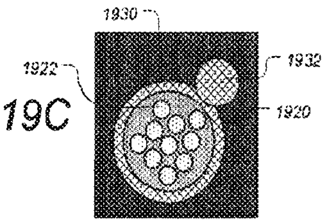
Figure 19B:
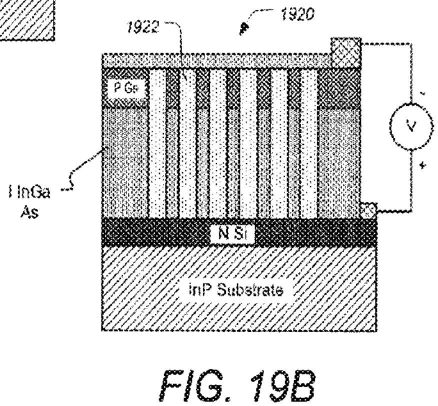

FIGS. 19A, 19B and 19C are diagrams illustrating how microstructures can reduce capacitance of a photodiode such that a larger area photo diode can be fabricated with the same bandwidth and QE, according to some embodiments. FIG. 19A shows the bulk layers 1900 in an InP—InGaAs—InP structure. In FIG. 19B, the InP—InGaAs—InP layers with microstructured holes 1922 effectively reduce the capacitance of the photodiode 1920 to allow a larger area photodiode to be fabricated with the same bandwidth and QE. FIG. 19C is a top view showing PD 1920. The microstructured holes 1922 can be 100-1000 nm in diameter with depth of 0.1 to 3 microns. Also visible in FIG. 19C is contact ring 1930 and bond pad 1932. According to some embodiments, a complementary microstructured pillars can also be fabricated. According to some embodiments, the sidewalls of InP and InGaAs can be passivated with SiOx, SiNx (silicon oxide and silicon nitride via ALD or PECVD), polyimide or spin-on-glass that can be spun on using standard processing methods. The absorption coefficient of the bulk material can be enhanced by up to two orders of magnitude or more.

According to some embodiments, III-V material such as InP, InGaAs, InGaAsP, InAs, InSb, GaSb, InGaSb on Si, Ge on Si, is epitaxially grown in a sub micrometer selective area growth (SAG) or vapor liquid solid (VLS) (See, e.g. Sarkar et al, Heteroepitaxial growth dynamics of InP nanowires on silicon, Journal of Nanophotonics, Vol. 2, 021775 (12 Feb. 2008); Roest, et al, Position-controlled epitaxial III-V nanowires on silicon, Nanotechnology 17 (2006) S271-S275) heteroepitaxy using metal organic vapor epitaxy with or without catalyst which can consists of Au, Cu, Al, Ti, W, Fe, Cr to name a few. Also for vertical oriented microwires grown on silicon, wafers with surface orientation (111) are selected. It is not necessary that the microwires be normal to the surface, it can be off normal and even have a mixture of orientations.

In VLS growth, the silicon wafer that has the layer structure for APD or PD just prior to heteroepitaxial growth is photolithographically (or e-beam or nanoimprint lithographically) patterned with aperture ranging from 10-5000 nm, and spaced between 10-3000 nm. An Au deposition (e-beam, or thermal evaporation) follows with thickness of 0.1-10 nm, followed by a lift-off, VLS epitaxial growth in a MOCVD reactor.

For SAG growth (See, e.g. Chu et al, Wurtzite InP nanowire arrays grown by selective area MOCVD, Phys. Status Solidi C 7, No. 10, 2494-2497 (2010)), a 50 nm $SiN_x$ is PECVD (or sputtered or ALD) deposited on a (111) oriented Si wafer with the necessary APD or PD epitaxial layers grown on it ready for heteroepitaxial growth. Using lithography (photo, e-beam or nanoimprint) apertures are defined with dimensions ranging from 10-5000 nm and spaced between 10-10000 nm followed by dry etching (RIE) to open a via to the silicon surface. The wafer is then ready for SAG of Ge, III-V microwires in a MOCVD reactor.

Detailed processes such as surface treatments, surface preparations, annealing, plasma etching, are not described for simplicity. These processes can be found in the literature.

Figure 19D:
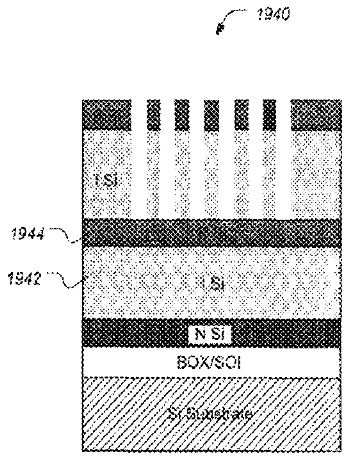
FIGS. 19D-19E are cross sections showing aspects of fabricating an APD device having a III-V absorbing layer grown on a P-I-N silicon multiplication layer, according to some embodiments.
Figure 19E:
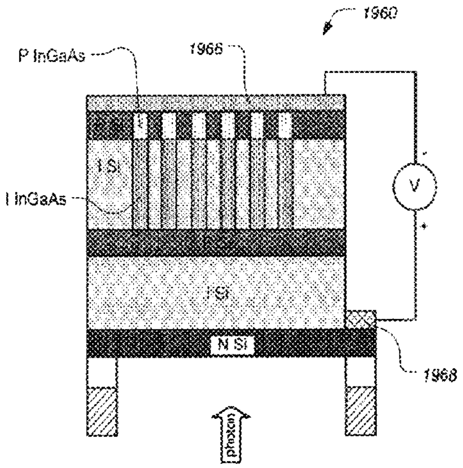

FIGS. 19D and 19E are cross sections showing aspects of fabricating an APD device having a III-V absorbing layer grown on a P-I-N silicon multiplication layer, according to some embodiments. In FIG. 19D, a Si APD structure 1940 is etched as shown for v epitaxial growth of the III-V material. In FIG. 19E a III-V absorbing layer is grown on P-I-N silicon multiplication layer for APD device 1960. As in the III-V on Si for a PD device, the III-V nanowires or microwires can be grown on Si using VLS process with or without catalyst. Since the footprint of the nano/microwires on Si is of the order of a micron, defects due to stress from lattice mismatch are not a significant issue and high quality III-V nano/microwires can be grown on Si. According to some embodiments, SAG is used for fabricating III-V microstructures on Si electronic gain layers.

From FIGS. 19D and 19E it can be seen that the InGaAs on Si APD 1960 starts with a Si APD structure 1940 where microstructures of holes or pillars are etched to the charge layer 1944 or just before the charge layer 1944. According to some embodiments, the microstructure holes and/or pillars can be etched into the multiplication layer 1942. Then using a process, for example SAG, with or without silicon oxide on the Si microstructure's sidewalls, I-InGaAs is grown, ending with P—InGaAs at the surface. Surface growth can use a process such as epitaxial lateral overgrowth (ELOG) to form a continuous P—InGaAs film of high quality. P ohmic alloy and bond metal 1966 are formed and annealed on the P—InGaAs. The back side processing consist of thinning the Si wafer using for example a BOX layer for selective etch stop and removing the BOX layer. Anti reflection can be coated on the backside silicon to reduce reflection. N ohmic 1968 is fabricated on the N Si layer. The optical signal is illuminated from the bottom. A reverse bias of −5 to −50 volts is applied to the cathode and anode. As mentioned earlier, the small footprint of the InGaAs on Si microstructure of the order of 10 square microns allows for high quality InGaAs material to be grown where lattice mismatch causing crystal defects are not significant.

According to some embodiments, the integration of Ge, III-V with Si PDs, PVs (See, FIG. 25C, infra.) and APDs allow the absorption spectrum of Ge and III-V material on a mature Si electronic platform. It allows integration of III-V with Si CMOS ICs for example for photodetector, optical light source such as light emitting diodes (LED) and laser diodes (LD) and III-V electronics such as transistors.

Multiple absorbing material and voids as microstructures. According to some embodiments, the microstructured pillars and/or holes are regrown with Ge such that both Si and Ge are microstructured to enhance the bulk absorption coefficient. According to some embodiments, voids can also be buried or embedded to generate a buried/embedded microstructure such that the surface is more planar. The microstructured voids can also enhance the absorption coefficient, by being patterned so as to enhance reflection and also to reduce the effective refractive index of a material (e.g. Si), reduce the weight of the device, and increase mechanical flexibility. The microstructured voids can be random, pseudo-random or patterned typically with dimension and spacing that are approximately the order of a wavelength or subwavelength. According to some embodiments, instead of combining Ge with Si, others combinations can be used for example III-V with Si or other semiconductor material, polymers, or other non semiconductor absorbers, which can significantly broaden the absorption spectrum over that of a single absorber.

Figure 29:
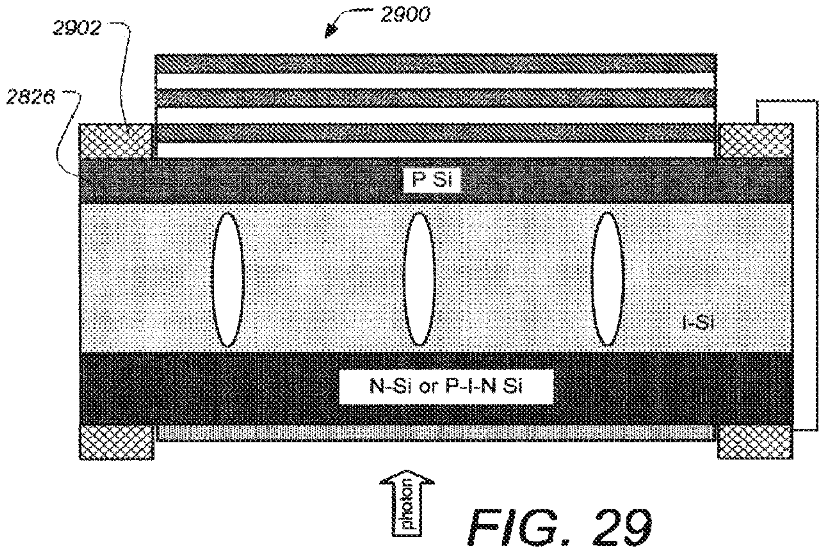
FIG. 29 is a cross section showing Bragg reflectors formed on the P—Si surface to provide a highly reflective mirror, according to some embodiments.

The enhancement using nanowires (See, e.g. Garnett et al, Light trapping in silicon nanowire solar cells, Nano Letters, 2010, 10, 1082-1087; Kelzenberg et al, Enhanced absorption and carrier collection in Si wire arrays for photovoltaic applications, Nature Materials, vol. 9, March 2010, 239-244) and nanoholes (See, e.g. Lin et al, Optical absorption enhancement in silicon nanowire and nanohole arrays for photovoltaic applications, Proceeding of SPIE, Vol. 7772, 77721G-1, 2010) have been reported by various groups. The known use of nanowire for light trapping are for photovoltaic applications where the photogenerated carriers diffuse to the anode or cathode of a P-N junction with zero external bias, operating at DC (direct current). According to many of the embodiments described herein, the photogenerated carriers are swept out with an external reverse bias in the absorbing "i" region of a P-I-N diode (PD) or P-I-P-I—N diode (APD) for high modulation bandwidth (e.g. greater than or equal to 10 Gb/s bandwidth) and high quantum efficiency and for APD for high current gain (e.g. gain greater than 3 dB). In addition, according to some embodiments, multiple absorbing materials can be used to broaden the absorption spectrum. The multiple absorbing materials are connected in parallel as current sources whereas in known technology the absorbing materials are connected in series. In addition, the use of voids as microstructures to enhance the absorption of the material according to many embodiments described herein allows the surface to be more planar and simplify processing since fillers may be avoided. Also, the more planar surface allows the epitaxial growth of semiconductor Bragg reflectors to enhance reflection for double or multiple pass absorption in the I absorption layer of the PD/APD. According to some embodiments, Dielectric Bragg reflectors can also be used in a more planar surface since the surface can be highly N or P doped and the ohmic contact can be made on the periphery such as a ring ohmic contact and the dielectric Bragg reflectors deposited on the photosensitive area such as shown in FIG. 29, infra. Chemical mechanical polishing (CMP) can be used to smooth the surface of the epitaxial layer with buried voids.

Figure 20:
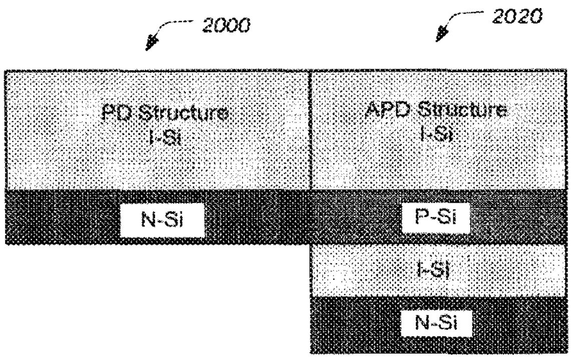
FIG. 20 shows bulk layers without a final P—Si layer for devices having microstructured Ge buried or embedded in an Si microstructure, according to some embodiments.

Further aspects of fabricating devices having microstructured Ge that is buried or embedded in Si microstructure will now be described. FIG. 20 shows bulk layers without a final P—Si layer for devices having microstructured Ge buried or embedded in an Si microstructure, according to some embodiments. The final P—Si layer, according to some embodiment will be the last layer grown in the epitaxial structure where the first layer grown is the layer adjacent to the substrate, followed by the second layer that is adjacent to the first layer, and so forth to the last layer grown. Shown in FIG. 20 is P-I-N PD structure 2000 and a P-I-P-I—N APD structure 2020 both without the final P—Si layer. In many of the embodiments described herein, N can refer to N (mid N type doping of $5\cdot10^{16}$ cm$^{-3}$ to $8\cdot10^{17}$ cm$^{-3}$, low N doping less than $1\cdot10^{17}$ cm$^{-3}$, and high N doping greater than $5\cdot10^{17}$ cm$^{-3}$, with the same for P doping. I (or i) doping is commonly defined as intrinsic, or not intentionally doped or low doping back ground doping of less than $5\cdot10^{16}$ cm$^{-3}$. The "I" region is configured such that the field of a P-I-N junction is developed across the "I" region usually with an external reverse bias. In PD and APD applications, the absorbing material is in the "I" region so that the photogenerated carriers can be quickly sweep to anode (P) and cathode (N) layers. For APDs, the carriers (electrons in most cases shown here, since this gives the lowest noise APD) are swept to the second "I" region for multiplication (current gain) before transiting to the cathode layer). In the Figures herein, P-I-N, P-I-P-I—N structures are shown and the top Player(s) that are in contact to external circuits are referred to as the anode and the N layer(s) that are in contact to external circuits are referred to as the cathode; the layers can be interchanged from P to N and N to P with P or low dope substrates to also fabricate PD's and APD's.

Figure 21:
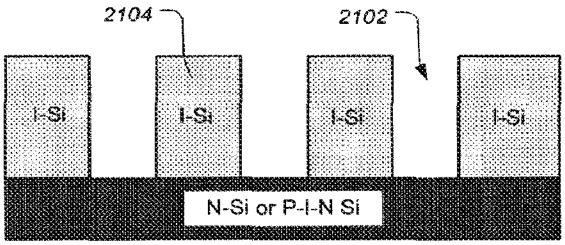
FIG. 21 is a cross section showing etching of microstructured pillars and/or holes for devices having microstructured Ge buried or embedded in an Si microstructure, according to some embodiments.
Figure 22:
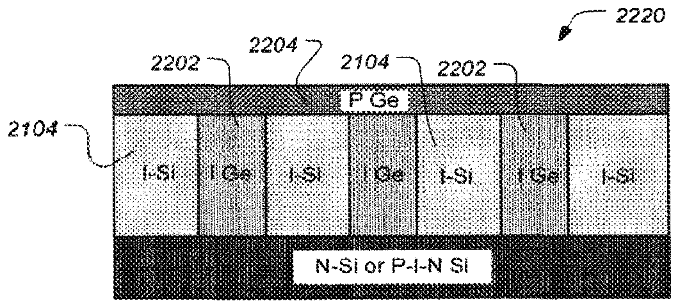
FIG. 22 is a cross section showing a device having microstructured Ge buried or embedded in an Si microstructure, after the Ge "I" layer is grown in the etched region and planarized, according to some embodiments.
Figure 23:
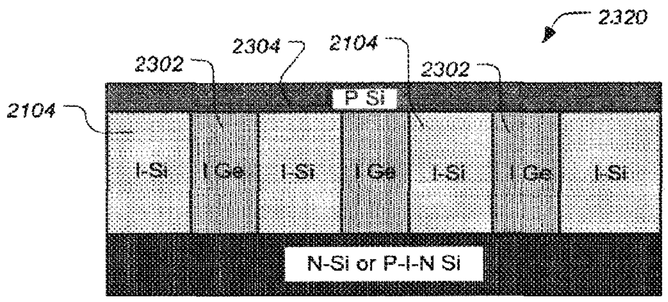
FIG. 23 is a cross section showing a device having microstructured Ge buried or embedded in an Si microstructure, after I—Ge regrowth and planarization, and a cap layer of P—Si, according to some embodiments.

FIG. 21 is a cross section showing etching of microstructured pillars and/or holes for devices having microstructured Ge buried or embedded in an Si microstructure, according to some embodiments. The microstructure pillars 2104 and/or holes 2102 are etched into the I—Si layer, partially or entirely or to/into the N (PD structure) or P (APD structure) Si layer. The etching process can be one of the following: wet chemical etching, dry etching using reactive ion etching (RIE), a deep reactive ion etching (DRIE), ion milling, and/or focused ion beam milling. The etching can be isotropic or anisotropic or a combination of isotropic and anisotropic. As shown in FIGS. 22 and 23, infra, Ge is then regrown in the etched region (i.e. the area around the pillars and on the sidewalls of the pillars in the case of pillars, or area in the holes, sidewalls of the holes in the case of holes) isotropically, anisotropically, or by selective area growth (SAG) where a dielectric layer such as SiOx, SiNx, cover area where regrowth of Ge is not desired which in some embodiments can include the sidewalls. During etching if a dielectric mask material such as SiOx, SiNx, SiCx is used and left in place during epitaxial growth, the epitaxy layers may not grow on the dielectric mask in a crystalline film and may be amorphous in nature or may not grow on the dielectric layer other than some dendrites. Note that the isotropic or anisotropic growth rate often depends on the crystal plane it is growing on and any etched structures may expose multiple crystal planes resulting in different growth rates at those planes that can lead to anisotropic growth in the etched regions with 3D microstructures.

Growth of Ge on Si is well documented in the literature where a thin buffer Ge layer is first epitaxially grown at a lower temperature followed by a higher temperature Ge epitaxial growth using chemical vapor deposition (CVD), molecular beam epitaxy (MBE), atomic layer deposition (ALD), low pressure-CVD, and or a combination of growth techniques, for example the thin Ge buffer layer can be grown by MBE and the high quality thicker Ge film grown by CVD. The thin Ge buffer layer is to allow lattice mismatch stress to be accommodated between Si and Ge, (see, e.g. Feng et al, High-speed Ge photodetector monolithically integrated with large cross-section silicon-on-insulator waveguide, APPLIED PHYSICS LETTERS 95, 261105, 2009).

The Ge regrowth may have voids or non-planarities and, where useful, the surface can be planarized using polishing such as chemical mechanical polishing (CMP) or etching. FIG. 22 is a cross section showing a device having microstructured Ge buried or embedded in an Si microstructure, after the Ge "I" layer is grown in the etched region and planarized, according to some embodiments. Note that according to some embodiments, planarization is not needed and is omitted. After the Ge "I" layer 2202 is grown and planarized, a P$^{+}$ Ge capping layer 2204 is grown to complete the P-I-N structure of a PD or P-I-P-I—N structure of an APD. Optical signal or photons with wavelengths ranging from 400 to 1800 nm can illuminate the PD/APD 2220 from the anode (top) side (P$^{+}$ side) 2202 and optical signal or photons with wavelength ranges 950-1800 from the substrate side (bottom) since Si is mostly non-absorbing at these wavelengths. According to some embodiments, it is advantageous to configure the device 2220 for illumination from the substrate side since this will allow a double bounce of the optical signal or photons within the absorbing Ge microstructures embedded in Si. Shown in these figures are only the basic epitaxial layer structures. Structures and layers not shown for simplicity include: anti-reflection coatings, passivations, ohmic metals, bond metallization, any metal interconnect to CMOS, via's for electrical connectivity, arrays of PD/APD for multichannel optical interconnects, to name a few. Optical signal/photons can illuminate either normal to the surface or at any angle off normal, including rotation angles for optimal PD/APD performances; optimizing QE and bandwidth of the PD/APD.

FIG. 23 is a cross section showing a device having microstructured Ge buried or embedded in an Si microstructure, after I—Ge regrowth and planarization, and a cap layer of P—Si, according to some embodiments. In the case of FIG. 23, the buried Ge microstructures 2302 are capped with a P$^{+}$ Si layer 2304. The Si P$^{+}$ cap layer (anode) 2304 has low optical loss at optical wavelengths of 950-1800 nm and therefore generates minimal photocarriers that are not in the high field "I" region of the PD/APD 2320 and contribute minimal diffusion photocurrent which can lead to a degradation of the frequency response of the PD/APD 2320 and the QE of the PD/APD.

Some dimension doping ranges for the buried or embedded Ge and capping layers shown in FIGS. 20-23 will now be provided in greater detail, according to some embodiments. The dimension of the microstructured Ge (e.g. 2202 and/or 2302) can range in depth from 0.1 to 5 micrometers, have a lateral dimension range from 10-5000 nm, and a spacing between adjacent microstructure structures (the structures can be identical or non-identical) in contact (overlapping) to 5000 nm. The "I" doping for both Ge (2202 and/or 2302) and Si (2104) is less than or equal to $5\cdot10^{16}$/cm$^{3}$. "I" is often called intrinsic or not intentionally doped and can have either a p or n background doping, the doping level is low enough that a reverse bias voltage of −2 to −45 volts can fully deplete the "I" region of mobile holes or electrons (carriers). The capping layer, Si (2304) or Ge (2204) thickness can range from 0.1 to 5 μm with doping level greater than or equal to $6 \cdot 10^{17}/cm^3$. These parameters can be adjusted to other values, but the goals are to increase or optimize the QE and bandwidth of the PD/APD for a given application. Series resistance, photogenerated diffusion current, ohmic contacts, capacitance, transit time, depletion of the "I" absorption region all contribute to the performance of the PD/APD. In addition for double/multiple bounce within the "I" region for optical signal illuminating from the bottom substrate side, a reflective metal or dielectric stack such as a Bragg reflector/mirror consisting of alternating dielectric layers of different refractive indices or HCG can be used to reflect the optical signal back into the microstructured absorbing region at the top anode side. With the Si cap layer as in FIG. 23, the optical signal can illuminate the Si $P^+$ cap layer (anode) 2304 and, since Si has minimal losses at 1100-1800 nm (below bandgap radiation), it can also have double bounce of the optical signal within the microstructured buried/embedded Ge 2302 by providing a reflector such as a Bragg reflector epitaxially grown at the Si $N^+$ layer or at the Si substrate to reflect the light back into the absorption region.

According to some embodiments, all the discussions of microstructured layers herein, light can additionally impinge from top and bottom surfaces, as well as on the sides of the microstructures, either directly or from scattering, near field effects, interferences, or resonance, which can vastly improve the QE of the microstructured photosensors since photogenerated carriers are generated directly in the high field absorbing "I" ("I") layer(s).

According to some embodiments, dopant choices for Si and Ge (group 4 elements) include the following: (1) for donors (n-type) from group 5 elements—antimony, phosphorus, and arsenic; and (2) for acceptors (p-type) from group 3 elements—boron, aluminum, and gallium.

It is also noted that in the structure shown in FIG. 23, the I—Ge microstructures 2302 buried in Si 2104 are completely surrounded by Si which has a lower refractive index than Ge. At 1000-2000 nm wavelength range, the refractive index of Si is approximately 3.49 and for Ge is 4.1. The index ratio of Ge/Si is 1.17 so according to Chang-Hasnain reference, HCG effects will exist. The resonance and field concentration in the absorbing Ge microstructures can further enhance the absorption coefficient from that of the bulk absorption coefficient value anywhere from greater than 1× to several orders of magnitude. The index difference also causes light to be confined and concentrated in the high index material, in this example, Ge; further improving QE.

The silicon (Si) microstructure can detect photons with wavelength ranging from 300-1100 nm and the germanium (Ge) microstructure can detect photons with wavelengths ranging from 300-1800 nm. According to some embodiments, for high bandwidth and high QE, the shorter wavelengths, 300-600 nm, may generate photocarriers outside the "I" region resulting in a diffusion current that can result in non-optimal bandwidth and or QE. Where bandwidth is not an issue, the degradations may not be very significant.

Figure 24A:
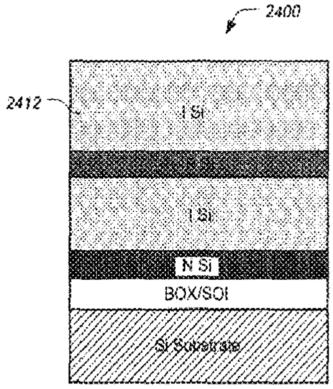
FIGS. 24A-24B are cross sections showing aspects of a microstructured APD with buried/embedded I—Ge absorbing microstructures in I—Si microstructures, according to some embodiments.
Figure 24B:
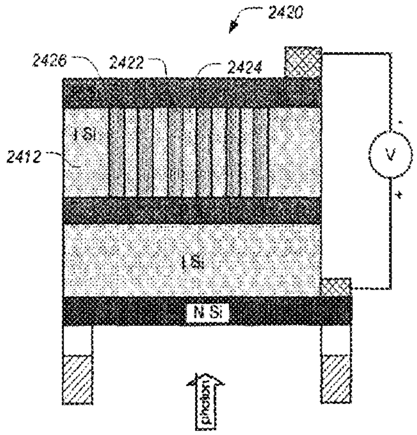

FIGS. 24A and 24B are cross sections showing aspects of a microstructured APD with buried/embedded I—Ge absorbing microstructures in I—Si microstructures, according to some embodiments. FIG. 24A shows the bulk layers 2400. In FIG. 24B, the etched pillars 2424 and/or holes 2422 are filled with I—Ge (intrinsic-Ge, non-intentionally doped or undoped or low doped Ge) and finished with a capping layer 2426 of $P^+$ Ge or Si to complete the anode of the APD 2420. The microstructured Ge 2422 is buried/embedded in Si 2412. Optical signal of wavelength 950-1800 nm (or photons from 300-1800 nm where the shorter wavelengths, 300-900 nm, may not have as high a bandwidth) can illuminate the APD 2420 from either top or bottom at various angles to the normal and/or normal to the surface. According to some embodiments, the starting layers prior to the I—Ge regrowth into the etched regions can also include the $P^+$ Si layer 2426, such as shown in FIG. 7 with layer 726, supra. In the case shown in FIG. 24B, the starting layer was removed to minimize P dopant diffusion during I—Ge regrowth. The buried or embedded Ge microstructure in Si microstructure allows the APD (or PD) 2420 to operate in two regimes. A first regime is at wavelengths where Si is low loss and Ge is absorbing or high loss (950-1800 nm). In this Si low loss regime, the Ge microstructures 2422 with a Si $P^+$ anode cap layer 2426 is completely buried in Si which has a lower refractive index than Ge. The Ge microstructure arrays can have HCG low Q with Q ranging from 1 to 3000 approximately (or other resonant, scattering, near field, linear and non-linear optical effects) or high enhancement of the absorption coefficient. A second regime is where both Si and Ge are absorbing, 300-945 nm, and both Si microstructures 2424 and Ge microstructures 2422 work in parallel (parallel current generators) absorbing the photons with enhancement of the absorption coefficients of both Si and Ge. This is particularly advantageous for examples in photovoltaic applications.

Figure 25A:
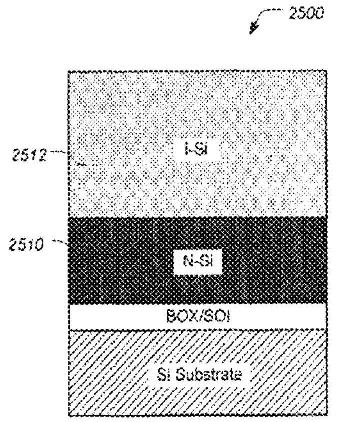
FIGS. 25A-25C are cross sections showing aspects of a photodiode having buried/embedded Ge microstructures in a Si microstuctured pillar and/or hole array, according to some embodiments.
Figure 25B:
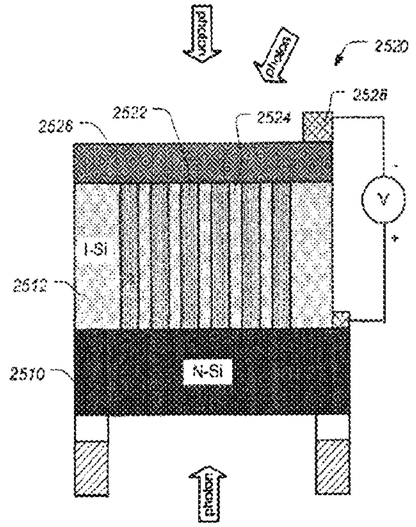
Figure 25C:
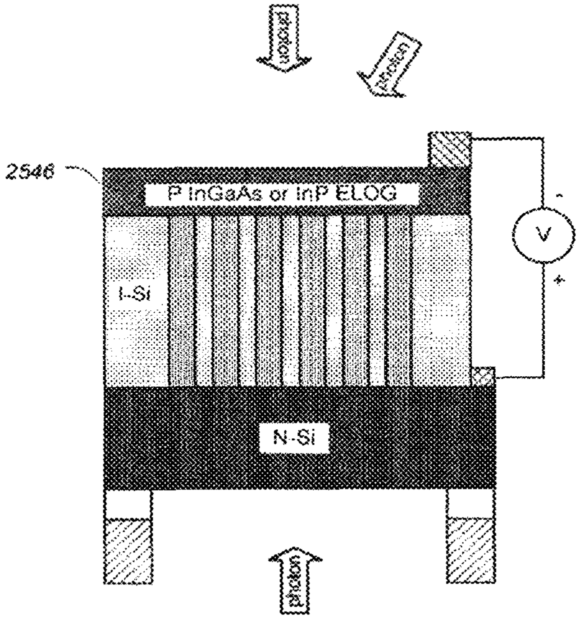

FIGS. 25A-25C are cross sections showing aspects of a photodiode having buried/embedded Ge microstructures in a Si microstuctured pillar and/or hole array, according to some embodiments. Starting with a Si PD epitaxial layer structure 2500 with or without the P layer 2526, microstructures of holes 2522 and/or pillars 2524 are etched into the Si P layer 2526 and I layer 2512 and can extend into the N layer 2510. Regrowth of Ge 2522 (or III-V material such as InGaAs, InAs, InSb, GaN, InGaN to name a few) using a process such as SAG with our without silicon oxide on the sidewalls of the Si microstructure 2524 or using a process such as VLS with or without catalysts, the I—Ge layer 2522 is grown followed by P Ge 2526 (or a P—Si layer which may be more suitable for top illuminated devices) at the surface where a process such as ELOG can be used to form a continuous P—Ge film. P ohmic alloy, annealed, followed by bond metallization completes the contact 2528 for the anode. The back side processing as discussed earlier is deposited on the silicon surface to reduce reflection. See, e.g. FIGS. 19A-19C, supra, where the silicon is thinned and etched to the BOX layer selectively. The BOX layer is etched selectively and an anti reflection N ohmic alloy is formed on the N—Si layer, annealed and followed by bond metallization, which completes the cathode contact. Reverse bias of −2 to −10 volts is applied between the anode and cathode for high bandwidth PD applications. In PV applications, 0 bias is applied.

According to some embodiments, the dimensions and doping are similar to the Si microstructured PD shown in FIGS. 5A-5B, supra, with the I—Ge doping level less than $5 \cdot 10^{16}$ $cm^{-3}$, and dimensions ranging in thickness of 0.1 to 5 micrometers, and lateral dimension of the microstructure ranging from 10 to 5000 nm with adjacent structures that can touch/overlap to 5000 nm separation. Optical signal/photons can either illuminate from the anode top side or cathode bottom side with wavelength range of 300-1800 nm and normal to the surface or at an angle to normal which can also include rotation. For bottom side illumination, the Si is thinned down to a few micrometers thickness for illumination at wavelength ranges of 300-900 nm. Only the basic layers are shown for simplicity. For example, the following structures are not shown: isolation mesa or diffusion or ion implantation, passivation, anti-reflection, ohmic metal, guard rings (e.g. for an APD). Both Si microstructures and Ge microstructures can detect the optical signal/photons in parallel for wavelengths where both are absorbing, 300-1100 nm, and only the Ge microstructure at wavelength ranges 900-1800 nm. The cap layer 2526 and 2546 in FIGS. 25B and 25C respectively can be either $P^+$ Si or $P^+$ Ge. For broad modulation bandwidth (sometimes just referred to as bandwidth) of greater than 10 Gb/s (gigabits per second), $P^+$ Si cap layer is preferred for wavelengths ranges from 950 to 1800 nm, since at these wavelengths Si has low optical losses (also referred to low loss). According to some embodiments, the structure shown in FIGS. 25B and 25C can also be use for photovoltaic applications where no external bias is purposely applied in the reverse direction.

According to some embodiments, for all the structures shown, the P and N can be interchanged to form for example N-I-P structures for the PD and PV (photovoltaic) and N-I-N-I—P structures for the APD.

The regrowth of Ge microstructures in Si also have applications in photovoltaic devices where the device is operated without external reverse bias. The P-I-N PD structure for example with Ge microstructures embedded or buried in Si microstructures effectively have two bandgaps, Si bandgap and Ge bandgap that is exposed to the solar radiation. The combination of two bandgaps widen the absorption spectrum of the photovoltaic device and therefore can collect a broader spectrum of the solar energy. The two bandgaps can have a higher QE and or short circuit current over that of single bandgap photovoltaic devices or multiple devices connected in series. The microstructures also have enhanced absorption that can further improve the QE and or short circuit current of the photovoltaic device. The solar spectrum at AM 0 and AM 1.0, with a photovoltaic device with a spectrum width of 300-1800 nm, at least approximately 90% of the solar spectrum is captured. In addition, in the PV device with Ge and Si microstructures are adjacent laterally to each other (i.e. in parallel) rather than being vertically adjacent (i.e. in series) as in prior art PVs. This allows the Si and Ge to be exposed to solar photons equally and are parallel current generators that are additive; $I_{Si}+I_{Ge}=I_{total}$ where $I_S$ is the photocurrent generated by the Si microstructures and $I_{Ge}$ is the photocurrent generated by the Ge microstructure and $I_{total}$ is the total photocurrent.

Although according to some embodiments the use of Si and Ge are described, according to some other embodiments, other materials are used. According to some embodiments, Si is used with an InP microstructure embedded or buried. According to some embodiments, more than two materials are used such as Si, Ge, InGaAs, InP, GaAS, GaN, InGaN, InSb, to name a few. The microstructures, in addition to pillars and holes, can be embedded and or buried to use the effects of HCG to enhance the absorption coefficient over that of bulk absorption coefficient to further improve QE and minimize the use of material in order to reduce cost of manufacturing.

FIG. 25C is a cross section showing grown Ge, InP, InGaAs to name a few, within silicon microstructures. SAG can be used where the sidewalls of the microstructures are oxidized or coated with a conformal dielectric and where the oxide/dielectric is removed at the bottom of the microstructure surface where it is approximately parallel to the silicon substrate where it can provide crystalline information for the growth of Ge, InP, InGaAs microstructures. The area where the Ge, InP, InGaAs will epitaxially grow with or without catalysts using various growth methods such as VLS, MOCVD, CVD to name a few, is approximately 100 square microns or less; more typically around 0.3-3 square microns. Because of the small area, crystalline defects due to lattice mismatch are not significant. The sidewalls with the silicon dioxide that can be thermally grown or deposited using ALD, provide an electrical insulation between the Si and the Ge, InP, InGaAs SAG grown layer. It should be noted that SAG growth can continue until the Ge or InP or InGaAs (to name a few) can merge above the silicon microstructure and with lateral over growth (LOG) epitaxial process, the microstructures of Ge or InP or InGaAs can form a continuous epitaxial thin film layer that can be doped P type for the anode layer.

Figure 25D:
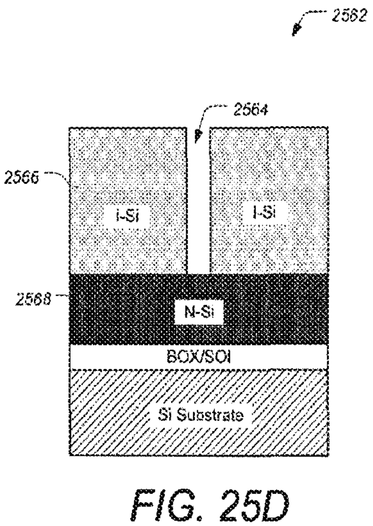
FIGS. 25D-25E are cross sections showing aspects of a forward biased device such as a vertical cavity surface emitting laser (VCSEL), according to some embodiments.
Figure 25E:
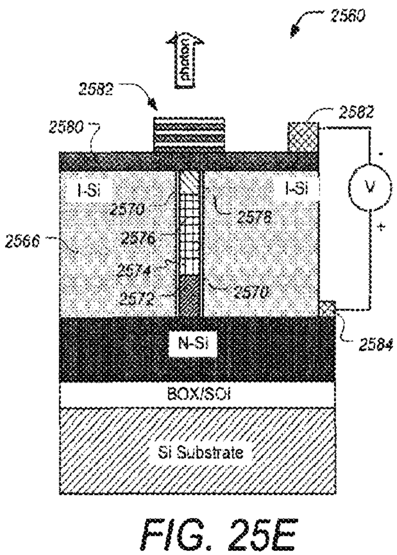

FIGS. 25D and 25E are cross sections showing aspects of a forward biased device such as a vertical cavity surface emitting laser (VCSEL), according to some embodiments. VCSEL 2562 can also be fabricated using similar processing as described supra for the PDs, PVs and/or APDs. Starting with a Si PIN structure 2562, Si microstructure hole(s) 2564 are etched through I—Si layer 2566 to the N—Si layer 2568. According to some embodiments, the etching of hole 2564 can extend into the N—Si layer 2568. An SAG process is followed with or without silicon oxide on the Si microstructure sidewalls (oxide 2570 is shown). First, a GaAs/AlGaAs distributed Bragg reflector 2572 (DBR) all N type is grown, follow by N—GaAs 2574, The active layer 2576 is undoped InGaAs/GaAs multiple quantum well (MQW) of 1-5 wells, followed by P—GaAs 2578 to the surface and using ELOG which can form a continuous film at the surface of the I—Si 2566. Dielectric DBR 2582 on the P—GaAs 2580 completes the optical cavity. P ohmic alloy with anneal and bond metal 2584 on P—GaAs 2580 completes the anode contact and N ohmic alloy with anneal and bond metal 2582 on N—Si 2568 completes the cathode contact. Forward bias of 1 to 20 volts to the anode and cathode will result 1200-1300 nm light to be emitted from the VCSEL 2560.

The design and growth of VCSELs at 1200-1300 nm and other wavelengths are known. See, e.g. "High-performance 1200-nm InGaAs and 1300-nm InGaAsN quantum-well lasers by metalorganic chemical vapor deposition", Tansu et al; Selected Topics in Quantum Electronics, IEEE Journal of (Volume: 9, Issue: 5), 2003.

According to some embodiments, longer wavelength are selected when embedding InGaAs, InGaAsN and other III-V material, because at wavelengths greater than 1000 nm silicon is mostly transparent and does not introduce excess additional optical losses. Accordingly, Si is a good heat sink for the VCSEL 2560. According to some embodiments, the GaAs/AlGaAs DBR 2572 is replaced with a silicon/air or a dielectric DBR on the bottom by thinning the Si wafer and etching to the BOX layer, removing the BOX layer and depositing a dielectric DBR. Design of DBR, dielectric and semiconductors are well known. The silicon/air DBR will require further processing, using sacrificial layers such as Ge that can later be selectively etched away via etch trenches.

According to some embodiments, an LED is fabricated by applying minor variations, including removing the DBRs and adding multiple Si microstructures. The LED can use MQW or just a simple heterojunction of P—GaAs/I-InGaAs/N—GaAs for example. Other semiconductors can also be used such as InGaAsN, InGaAsP, GaAsN, to name a few. The substrate can be another material such as sapphire, SOI, insulator on Si (IOS), ceramic, glass, quartz, GaN, crystalline or non-crystalline. Additionally, other material for blue/UV LEDs such as GaN, AlGaN, GaInN, AlN, can be grown using epitaxial reactors and methods of fabrication described above.

According to some embodiments, voids are formed, that are buried or embedded in Si or Ge on Si or Ge. As used herein "buried" refers to cases when the void is beneath the surface, and "embedded" refers to cases when the void can intersect or be slightly above the surface. As described supra, during regrowth of Ge on a microstructured Si with pillar and/or hole arrays, voids can develop due to the fact that growth rate during epitaxial growth often depends on the crystal orientation of the surface. Since etching microstructured pillars and/or holes in Si can expose different surface orientation of the side walls, asymmetric growth rate of Ge on these different Si surface orientation can result in void formation. According to some embodiments, the void formation is exploited to generate a buried and/or embedded microstructured void arrays that can behave as HCG and or light trapping structures that concentrate the optical field and/or resonance through interference of the optical field (amplitude and phase), scattering, near field, linear and non-linear optical effects to enhance the bulk film absorption coefficient by one to several orders of magnitude. In addition, the voids can be used to reduce the effective refractive index of a material (e.g. Si with voids) since the optical field sees an average or effective refractive index. At dimensions on the order of a wavelength or less, the refractive index of voids and Si, for example, can be approximated with an effective refractive index which is the average of the volume occupied by Si and the volume occupied by the void. For example, if Si occupies ½ the volume and voids occupy ½ volume, the Si index is 3.49 and the void is 1.0 (for air), then the average effective index is approximately 2.25.

The voids also reduce capacitance of the device if the voids are generated in the "I" region, as discussed supra; where the space between microstructured pillars or the microstructured holes can reduce the capacitance of the P-I-N PD diode or the P-I-P-I—N APD diode. The voids according to some embodiments are either buried (buried holes) or embedded (space between pillars) and the total capacitance is approximately the capacitance of the total area occupied by the voids plus the capacitance of the total area occupied by the semiconductor. In the case where the voids do not occupy the full thickness of the "I" layer (i.e. only occupy part of the thickness), then the effective dielectric constant can be estimated by taking into account a volume that contains both the void and the semiconductor extending through the thickness of the "I" layer, the volume of the void and the volume of the semiconductor in a given volume; for example if the voids occupy ½ of a given volume of the thickness of the "I" layer and the semiconductor material occupies ½, and if the semiconductor material is Si with dielectric constant of 11.9, then the average effective dielectric constant is approximately 6.5, where the void is assumed to be air with dielectric constant of 1 for that given volume. The total area occupied by this effective dielectric constant, consisting of both voids and semiconductor material, is used in the capacitance calculation plus the area occupied only by semiconductor in the "I" region to give the total capacitance of the P-I-N or P-I-P-I—N diode. Reduction of capacitance leads to a reduction in RC time constant for the diode which improves the bandwidth of the PD and APD.

Although buried voids in semiconductor material are known, such voids are conventionally regarded as detrimental and as such are to be avoided. According to some embodiments, such voids are intentionally created and form useful features in the semiconductor material.

Figure 26:
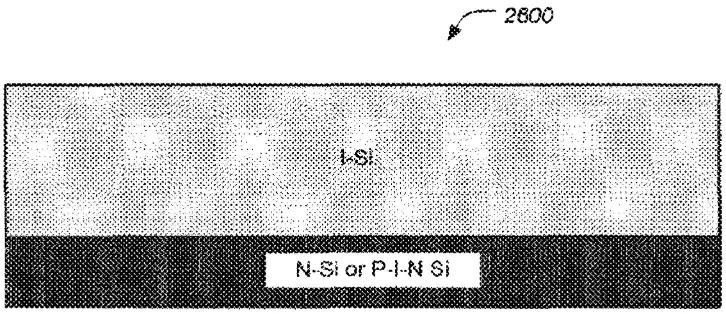
FIG. 26 is a cross section showing starting epitaxial layers in which microstructured voids are fabricated, according to some embodiments.

FIG. 26 is a cross section showing starting epitaxial layers in which microstructured voids are fabricated, according to some embodiments. To generate voids in PD, PV and APD structures start with a structure 2600. The starting material can be a Si PD or APD structure with or without the Si $P^+$ anode layer. Details of the layers are not shown for simplicity.

Figure 27:
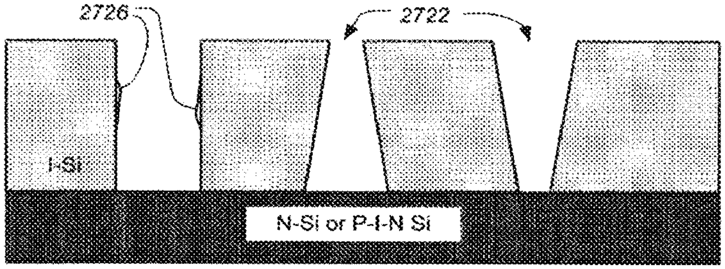
FIG. 27 is a cross section showing microstructured holes/pillars etched into the I—Si layer, according to some embodiments.

FIG. 27 is a cross section showing microstructured holes/pillars etched into the I—Si layer, according to some embodiments. The microstructered holes 2722 (or space around pillars) are etched into the Si "I" layer and can extend pass the "I" layer or can be partially into the "I" layer. Wet and/or dry etching can be used or a combination of wet chemical and dry etching (RIE, DRIE for example) where the wet etching can be used to remove damage due to dry etching or wet etching in combination with dry etching and oxidation to form a certain shape or surface smoothness. As shown in FIG. 27, the etch can be isotropic or anisotropic, the sidewall can have negative or positive slope (slope defined with respect to the plane of the substrate). For anisotropic etching both negative and positive slope can exist at the same time for an etched feature such as a pillar or hole. Anisotropic epitaxial growth can result in void formation, with the shape of the void being determined by many factors including: side wall slope, crystal orientations of the side wall, growth conditions, pressure, temperature, flow rate, growth technique (CVD, MBE, ALD or a combination of growth methods), surface preparation, and surface oxidation. According to some embodiments, surface oxide, partial oxide or other dielectric 2726 can be intentionally deposited on the side walls, which can also influence the regrowth of Si or Ge (or any other semiconductor such as InP, GaAs, InGaAs, GaN, InGaN, to name a few) and can be used to form voids.

Figure 28:
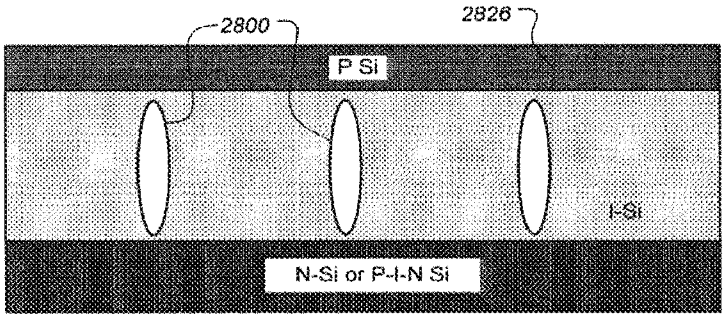
FIG. 28 is a cross section showing microstructured voids buried or embedded in Si with a Si capping $P^+$ anode layer 2826, according to some embodiments.

FIG. 28 is a cross section showing microstructured voids buried or embedded in Si with a Si capping $P^+$ anode layer 2826, according to some embodiments. The buried voids 2800 can be uniformly spaced, or with chirped spacing, or any complex patterns with a combination of periodic and aperiodic spacing or it can be random or pseudo-random. The buried voids 2800 can have a length ranging approximately from 0.1 to 10 micrometers and lateral dimension ranging from 10-5000 nm. The voids can also be overlapping one another. Although FIG. 28 shows buried voids in Si, according to some embodiments buried voids can be formed in Ge. For example, in a Ge epitaxial layer on Si, or any other semiconductors, such as InP, GaAs, InGaAs, GaN, InGaN, InGaAsP, and other semiconductors in the III-V material family. The voids can be non-uniform is size and shape within the void and adjacent voids. The voids may also have non-uniform spacing and/or orientation. However, with proper process control uniformity in size and shape, patterning, random and pseudo-random placements of the voids can be attained. For simplicity the voids are shown to be uniform.

FIG. 29 is a cross section showing Bragg reflectors formed on the P—Si surface to provide a highly reflective mirror, according to some embodiments. With a more planar surface, high reflectivity Bragg reflectors 2900 may be deposited or grown using dielectrics or semiconductors on the P silicon layer 2826 surface. The ohmic contact and the bond metallization 2902 can be on the peripheral in a ring configuration as shown in FIG. 29. Optical signal illuminating from the bottom will have a double/multiple pass through the absorbing I region thereby improving QE and the bandwidth of the PD/APD. In PV where bandwidth is not an issue, then the QE will be improved. According to some embodiments, Bragg reflectors 2900 can be configured for wavelength selectivity so as to reflect the optical signal back into the absorbing I region.

According to some embodiments, voids are not only in the I region but are also formed in the P and/or N region of a PIN PD or PV, in the P charge region, in the I multiplication region and/or the P anode and N cathode region of an APD. According to some embodiments, voids can also be formed in the substrate. The density, shape and material (voids can be filled with different material from vacuum, gas, helium to dielectrics with or without doping with rare earth elements for optical gain for example, carbon/graphene/diamond, copper, ceramics for thermal conductivity for example) of the voids in each layer can be different or the same, or different/same within the same layer.

According to some embodiments, voids are also used to make the material more mechanically flexible and bend and or conform to different surface contours. For example, in PV applications where large sheets of the device are fabricated, the sheets can conform to contours in for example the roof, or the sheets of semiconductor PV can be rolled for compactness in storage prior to deployment. According to some embodiments, voids sized between 0.01 microns and 1000 microns are introduced into semiconductor and/or glass material for use with photo voltaics for purposes of increasing flexibility and/or resistance to physical damage and/or damage propagation.

High-density voids in semiconductors are also resistant to crack propagation since the crack will terminate at a boundary, in this case the boundary of the void. This is advantageous for large devices such as solar cells where if an object such as hail or stone strikes the solar cell, only the point of contact will be damaged and perhaps a small adjacent area (5-50% of the diameter of impact for example) where the damages are localized to area of impact and cracks will not propagate across the entire cell. A device may survive such small damage events with minimal degraded performance without taking the entire solar panel down.

According to some embodiments, the voids are also formed in other materials also such as glass, ceramics, polymers, metal, plastics, to name a few, to avoid crack propagation in case of foreign object impacts since cracks will terminate at a boundary, in this case the boundary at the void.

Figure 30:
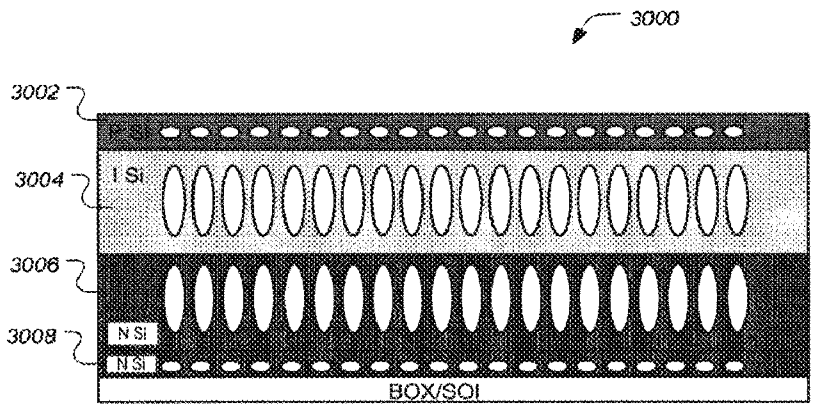
FIG. 30 shows an example of a PIN PD/PV structure with microstructured voids to enhance absorption, reduce bulk refractive index, reduce capacitance and increase mechanical flexibility of large sheets of PV on semiconductor material, according to some embodiments.

FIG. 30 shows an example of a PIN PD/PV structure 3000 with microstructured voids to enhance absorption, reduce bulk refractive index, reduce capacitance and increase mechanical flexibility of large sheets of PV on semiconductor material, according to some embodiments. The Si substrate is removed leaving only the BOX/SOI layers together with the PIN epitaxially grown layers. Ohmic contacts, bond metallizations, antireflection coatings, passivations, are not shown for simplicity. In addition to PV, the techniques are also applicable to PD, APD, light emitters such as light emitting diodes and diode lasers, and to electronic integrated circuits such as CMOS and ASIC (application specific integrated circuits) where voids can not only make the material more flexible and lighter but also as mentioned earlier more resistant to cracking. The voids, according to some embodiments can be filled with a gel that can repair impact damage and seal exposed cracked edges to prevent further deterioration due to moisture for example to the semiconducting surfaces. The gel can be spin on glass for example. According to some embodiments, the voids can be filled with material to enhance thermal conductivity for example, reduction of optical or microwave losses by removing the silicon and replacing with material that is not lossy such as Ar, He, Xe, $N_2$, Ne gas, or vacuum for example. The voids can have different sizes and shapes and densities and can be random, pseudo random, aperiodic, periodic, chirped, single or multiple patterns. The voids can also be in a single layer or in multiple layers of the device. FIG. 30, for example, shows the voids in P—Si layer 3002, I—Si layer 3004, and N—Si layers 3006 and 3008. According to some embodiments the index of refraction near the uppermost surface can be altered to more effectively index "match" with surrounding air so as to reduce reflections of incident light. For example, in PV applications near surface voids can be used to index match such that less incident sunlight is reflected from the PV surface. According to some embodiments, the index of refraction at lower surfaces can be altered so as to increase internal reflections that may, for examples, increase the number of passes light makes through an absorbing region.

According to some embodiments, random voids can also be generated by dry etching/electrochemical etching the surface of the semiconductor without any mask. Generating semiconductor nanowires followed by epitaxial regrowth on these random nanowires will result in buried voids. As discussed in Frajtag et al, Growing thin films that contain embedded voids, 23 Jun. 2011, SPIE Newsroom; DOI: 10.1117/2.1201105.003750, this method can be used in GaN light emitting diodes to minimize defect formation due to lattice mismatch of the GaN epitaxial layer with the substrate which can be sapphire, Si, SOI, IOS to name a few. The random formation of semiconductor nanowires by dry etching of the surface of the semiconductor (which can be Si, Ge, III-V material family such as InP, GaAs, InGaAs, InGaAsP, GaN, InGaN, InSb, to name a few) without any mask and subsequently regrowing on the nanowires epitaxially using CVD for example, to form random buried voids can also be used to reduce the effective refractive index of the semiconductor and reduce the effective capacitance of the P-I-N, P-I-P-I—N diodes if the voids are formed in the "I" absorption layer and/or P, N layers, and/or charge, multiplication layers of the PD, APD, in any combination to optimize the performance of the device in bandwidth, QE, and energy consumption.

Figure 31:
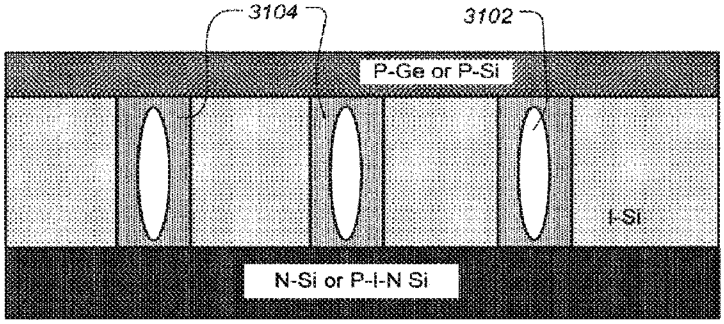
FIG. 31 is a cross section showing regrown I—Ge with a buried/embedded voids, according to some embodiments.

FIG. 31 is a cross section showing regrown I—Ge with a buried/embedded voids, according to some embodiments. The regrowth of Ge 3104 epitaxially on Si microstructured pillars and/or holes results in voids 3102 in the Ge layer that can be intrinsic or non-intentionally doped or low doped using the method shown in FIGS. 27-28, supra. In addition, selective masking with dielectric such as SiOx, SiNx for example can be used to generate nanowires only in the selected areas such as the Ge regrowth, for example, and with additional regrowth of Ge, random voids can be buried only in the selected Ge areas. The random voids can be combined with patterned voids to optimize a device performance in terms of bandwidths, quantum efficiencies and power consumption. The microstructures shown in FIG. 31 combine the Ge microstructure and void microstructure to enhance to bulk absorption coefficient and reduce the effective capacitance of the diode.

Figure 32:
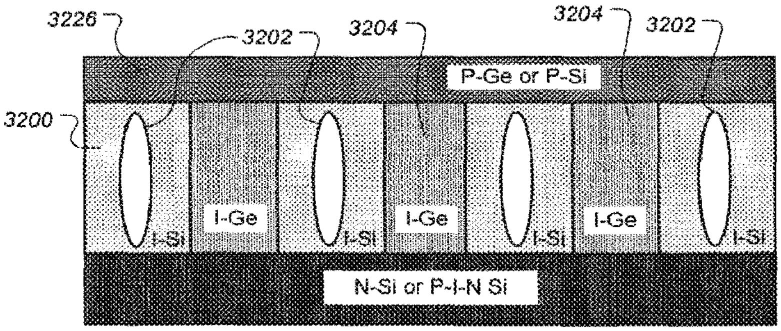
FIG. 32 is a cross section showing a device having buried microstructured voids in I—Si with regrown I—Ge and capped by a epitaxial layer, according to some embodiments.

FIG. 32 is a cross section showing a device having buried microstructured voids in I—Si with regrown I—Ge and capped by an epitaxial layer, according to some embodiments. As can be seen in FIG. 32, the buried/embedded microstructure voids 3202 can be in I—Si layer 3200 while the Ge microstructure 3104 is also buried/embedded in Si layer 3200 using a few additional processing steps. First the voids 3202 are buried/embedded as in FIG. 28 with or without the P—Si anode layer 3226. Microstructures are then again etched into the I—Si layer 3200 with the voids and then Ge 3104 is regrown resulting in a microstructure with voids 3202 in the Si layer 3200 and a Ge microstructure 3104 to enhance the bulk absorption coefficient and reduce the capacitance of the diode. Not shown is that the microstructured voids can also be buried/embedded entirely in Ge for Ge on Si layers, such that in FIG. 28, if the I—Si layer 3200 is replaced with I—Ge followed by a $P^+$ Ge capping anode layer 3226.

The buried/embedded microstructure voids is an inverse HCG structure with absorption, or a lossy HCG structure, and can have resonance, constructive and destructive optical interference effects of both phase and amplitude that can result in the enhancement of the bulk absorption coefficient. The period of the microstructure pillar, hole, void, buried/embedded Ge arrays can fall in the near-wavelength regime of the HCG effect or it can fall in the subwavelength regime where the grating period is much less than a wavelength and the diffraction regime where the period is greater than a wavelength. The HCG characteristics of the microstructure array and the input optical signal can be coupled to in-plane optical modes. The microstructured arrays can also behave as a lens to mode match the incoming optical signal. Good coupling efficiency also improves the overall QE of the PD/APD. According to some embodiments, a lossy HCG is provided where the absorbing region is a part of or included in the HCG structure (other effects such as scattering, near field, plasmonic, resonance, linear and non-linear optical effects to name a few, can also play a significant role in absorption enhancements), and where Si can be the HCG for photon energies that are below the Si bandgap and the Ge microstructures are buried or embedded within the Si that is absorbing to the photons with wavelength ranging from 950-1800 nm (where Si has relatively low optical losses).

Figure 33:
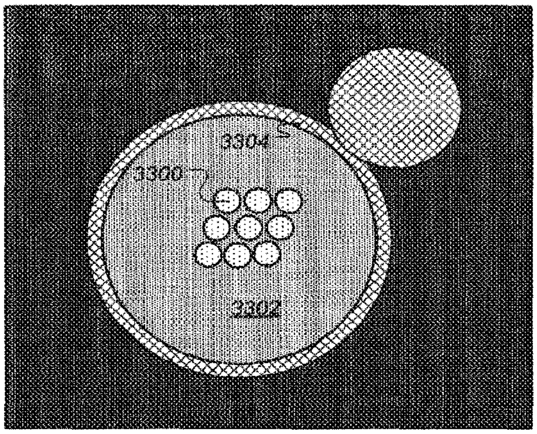
FIG. 33 is a top view showing distribution of microstructured pillars, holes and/or buried voids in an PD/APD, according to some embodiments.

According to some embodiments, the microstructures of holes, pillars, and voids can be arranged in any pattern or no pattern in the active area, including any parts of the P-I-N structure of a PD or P-I-P-I—N structure of an APD; the active area includes the absorbing "I" region and the P and N regions. According to some embodiments, to simplify manufacturing and to improve yield, the microstructures can extend outside the active areas of a PD/APD if it does not interfere with the PD/APD operations and performance. FIG. 33 is a top view showing distribution of microstructured pillars, holes and/or buried voids in an PD/APD, according to some embodiments. The microstructure array 3300 consists of pillars, holes, and/or voids, and buried/embedded Ge in Si or Si in Ge or any combination of multiple semiconductors, can be distributed over the entire active area 3302 of the photodiode or avalanche photodiode or just partially for example in the center where the optical intensity is the highest. The active area can be defined as any area that contributes to the generation of electrical signal upon illumination with optical signal, or in the case of a PV, the generation of electricity upon illumination with photons. In FIG. 33, the active area 3302 is commonly the area within the metal ohmic contact/bond metal ring 3304. The distribution of the array 3300 can be non uniform, non periodic, non uniform is size of the microstructure, or in shape.

Figure 34:
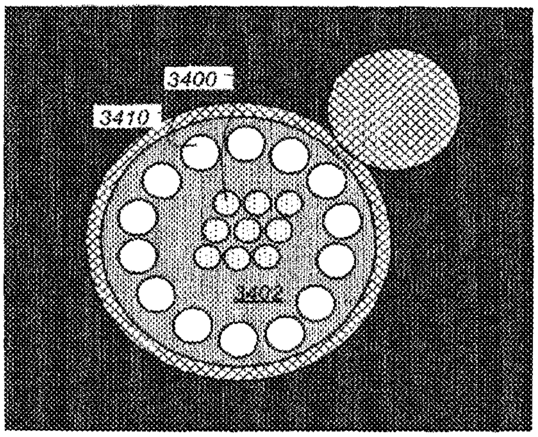
FIG. 34 is a top view showing distribution of microstructured pillars, holes and/or buried voids in an PD/APD, according to some other embodiments.

FIG. 34 is a top view showing distribution of microstructured pillars, holes and/or buried voids in an PD/APD, according to some other embodiments. In FIG. 34, the QE is optimized at the center of the active area where the optical intensity is the highest and away from the center, more semiconductor material is removed in the microstructure pattern to reduce the capacitance of the active area in order to decrease the RC (resistance, capacitance) time constant to achieve higher bandwidth for the PD/APD and or to increase the active area to allow passive alignment of the optical signal to the PD/APD thereby reducing the cost of packaging and assembly. Microstructured pillars/holes/buried voids 3400 near the center of the PD/APD optimize QE while the microstructured pillars/holes/buried voids 3410 at the periphery of active area 3402 minimize capacitance while still maintaining good QE.

Buried voids in the N (or P if P and N are switched) part of the P-I-N or P-I-P-I—N diode structure can reduce the effective refractive index of the semiconductor in the N layer. This is useful in increasing the refractive index contrast for HCG structures (to include other possible optical effects that may be significant in absorption enhancements such as scattering, plasmonic, near field, linear and non-linear optical effects to name a few), for example in Si the refractive index is approximately 3.5 (for wavelengths 950-1800 nm) and if half of the volume of the material is air, then the effective refractive index (½ air and ½ Si) would be approximately 1.8 for the air-Si composite material. Any semiconductor microstructures of pillars or holes fabricated on top of this composite air-Si material will have a index contrast of, for example Si pillars on the composite air-Si layer, approximately 2. The high index contrast would enhance the performance of the HCG. According to some embodiments, this is used to enhance the lossy HCG performance (where loss can be as high or higher than −1 dB/cm) and enhance the absorption coefficient with its resonance, light concentration and in-plane light coupling effects to name a few. There is an advantage in having the voids in the N and or $N^+$ layers since it will have a minimal effect on the electrical properties and characteristics of the diode since once electrons are swept into the N and or $N^+$ layer, they are majority carriers.

The microstructured voids in the N and or $N^+$ layer can be patterned, non-patterned or random or pseudo-random, and can be defined using lithography, masking and etching or just etching followed by a regrowth of Si, or Ge or any other material. The voids can range in length approximately from 0.01 to 10 micrometers and lateral dimensions can range approximately from 10-5000 nm with spacing between adjacent voids ranging approximately from overlapping to 5000 nm.

Figure 35:
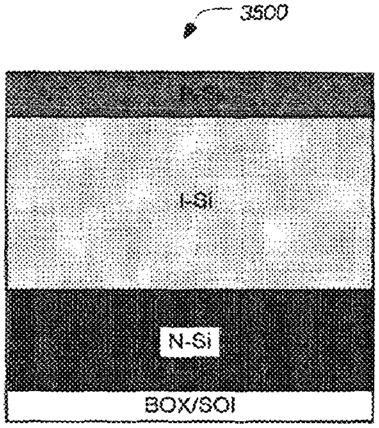
FIG. 35 (prior art)
FIG. 35 shows the basic epitaxial structure for a conventional Si PV/PD diode on N Si substrate.
Figure 36:
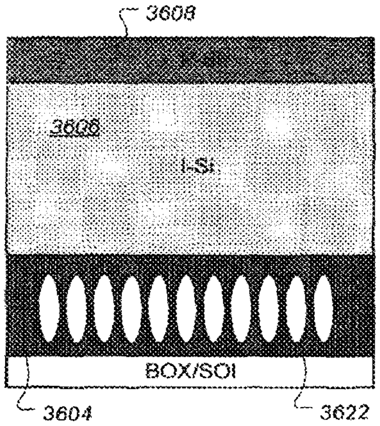
FIG. 36 shows microstructured voids incorporated into an N—Si layer, according to some embodiments.

FIG. 35 shows the basic epitaxial structure 3500 for a conventional Si PV/PD diode on N Si substrate. FIG. 36 shows the structure of FIG. 35 with microstructured voids incorporated into the N—Si layer, according to some embodiments. The doping and thickness of the layers are dependent of the applications. For high bandwidth PD applications the "I" Si thickness ranges from 0.1 to 3 micrometers whereas for PV applications the "I" Si thickness ranges from 1 to 20 micrometers with doping range of intrinsic or not intentionally doped, background doping of $<5\cdot10^{16}\ cm^{-3}$. Device size to define the area of the capacitance for high bandwidth PD (for circular apertures) ranges from 5 to 100 micrometer diameter whereas for PV, the lateral dimension can range from 0.1 to >50 cm (centimeters) limited only by the size of the wafer or substrate. The doping ranges and layer thicknesses for non "I" layers are similar for PV, PD and APD; P or $P^+$ layer thickness ranges 0.1 to 3 micrometers P doping $>5\cdot10^{18}\ cm^{-3}$, N or $N^+$ layer(s) thickness ranges of 0.1 to 10 micrometers N doping $>1\cdot10^{17}\ cm^{-3}$. The Si substrate can be N doped, low N doped or undoped.

After growing the $N/N^+$ layer(s) on the Si substrate, microstructures of pillars and or holes and or nanowires are etched into the $N/N^+$ layer(s) 3604 and followed by a $N/N^+$ layer(s) regrowth resulting in buried voids 3622 as shown in FIG. 36. The regrowth surface may or may not need further planarization such as using chemical mechanical polishing (CMP). Some applications may have more optimal performance with a non-planar surface, for example PV that can couple sun light in multiple angles with minimal reflections (a rough surface reflect less light). Subsequent "I" Si layer 3606 and $P/P^+$ layer 3608 are grown on the $N/N^+$ layer(s) 3604 with the buried voids 3622. In addition to reducing the effective refractive index, at wavelengths where Si has low loss (approximately −1 dB/cm or less), 950-1800 nm, the buried voids 3622 can be patterned into a reversed HCG and behave as a very reflective (close to 100% reflectivity) broad spectrum mirror for any photons illuminating from the top (P side) and not absorbed in the "I" microstructured pillar/hole region on the first pass, the photons can be reflected back toward the absorbing "I" region. In addition, with the voids, the substrate may be more flexible and lightweight such that it can be more adaptable to contoured surfaces and/or for use where weight is an issue such as a solar panel, or for mobility.

Figure 37:
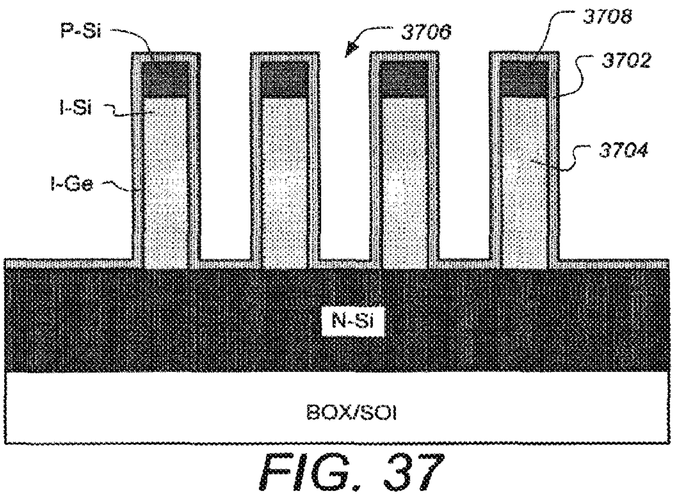
FIG. 37 is a cross section showing etched Si microstructured pillars/holes with regrown Ge covering the Si, according to some embodiments.

FIG. 37 is a cross section showing etched Si microstructured pillars/holes with regrown Ge covering the Si, according to some embodiments. The starting structure is the same as layers 3500 in FIG. 35. The Si microstructure pillar and/or hole arrays are etched with a depth ranging from 0.1 to 10 micrometers and subsequently regrown with a I—Ge layer 3702 of thickness 0.01 to 4 micrometers including according to some embodiments a 1-10 nm low temperature buffer Ge layer to account for lattice mismatch between the Si and Ge. Note that the Ge buffer may not be included for pillar hole lateral dimensions of approximately 1000 nm or less since the lattice mismatch strain at that small area may not be significant to cause extensive defects to form. The lateral dimensions of the microstructured pillars 3704 and holes 3706 range from 10 to 5000 nm and spacing of adjacent elements from overlapping to 5000 nm. The $P/P^+$ Si layer 3708 is left on in FIG. 37 as it may be useful in making good P ohmic contact with the ohmic metals of Ti, W, Al silicide that are 1-50 nm thick to be semitransparent or transparent transition metal silicide.

Figure 38:
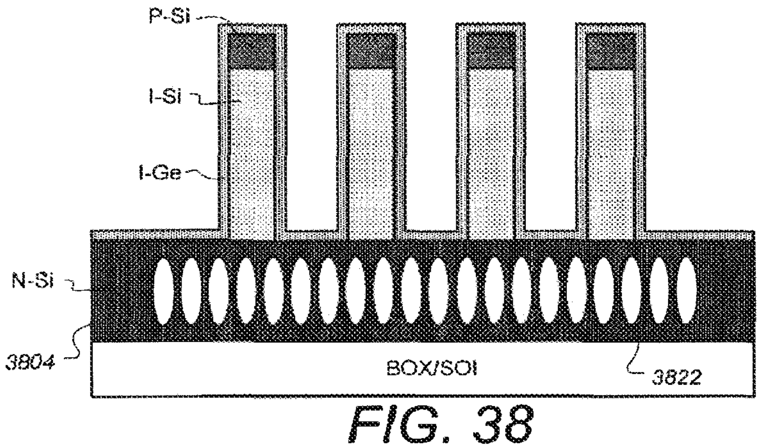
FIG. 38 is a cross section showing microstructured Si pillars/holes with Ge regrowth on an N—Si layer having embedded microstructured voids, according to some embodiments.

FIG. 38 is a cross section showing microstructured Si pillars/holes with Ge regrowth on an N—Si layer having embedded microstructured voids, according to some embodiments. The structure shown in FIG. 38 is similar in starting material as shown in FIG. 36. The buried voids 3822 in the $N/N^+$ layer 3804 act to reduce the effective refractive index of layer 3804. The voids spacing and lateral dimensions can be subwavelength ($<\lambda$) or even deep subwavelength ($<<\lambda$) to minimize optical scattering loss such as Rayleigh scattering which is proportional to $\lambda^{-4}$ where $\lambda$ is the wavelength. The wavelength of interest range from 300 to 1800 nm.

Figure 39:
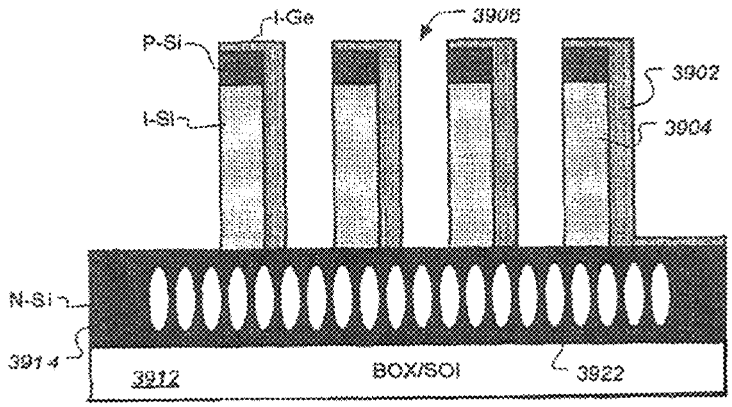
FIG. 39 is a cross section showing partial coverage I—Ge on microstructured Si pillars/holes, according to some embodiments.

FIG. 39 is a cross section showing partial coverage I—Ge on microstructured Si pillars/holes, according to some embodiments. In the variation of the microstructure shown in FIG. 39, instead of regrowing I—Ge over the entire Si microstructured pillars and holes, it is only grown on part of the Si microstructures. Part of the Si microstructure is without I—Ge and the other part has regrown I—Ge. The partial regrowth of Ge can be accomplished by partially covering the Si microstructure with a dielectric such as SiOx or SiNx by directional deposition such as electron beam evaporation deposition, or directional laser ablation deposition or other directional methods such as ion milling to remove native oxide of Si selectively or ALD thin layer of oxides/nitrides and removing selectively and directionally with ion beam milling. Once the Si microstructure is partially coated with an oxide or nitride (or other dielectric such as CaFx, TaOx, TiOx, to name a few) Ge epitaxial regrowth will predominantly occur where there is lattice information such as a Si surface. The I—Ge regrowth 3902 thickness can range from 0.1 to 4 micrometers or more. The Si microstructure of pillars 3904 or holes 3906 can have a depth of 0.1 to 10 micrometers and a lateral dimension of 10 to 5000 nm and spacing between adjacent microstructures of overlapping to 5000 nm. Both Si and Ge microstructures are exposed to photons with wavelengths ranging from 300-1800 nm from photons impinging from the anode surface and impinging on the sidewalls of the microstructure directly, scattered, near field, resonance, HCG effect, linear and non-linear optical effects, and with enhanced absorption coefficient. Both Si and Ge will generate photocurrent due to the incident photons. The Si current generator and Ge current generator are in parallel and the total photocurrent generated by this PD/PV is the sum of the Si and Ge photocurrent generators. The buried voids 3922 reduce the refractive index of the $N/N^+$ layer 3914 and improve the index contrast of the microstructure and the substrate thus improving the performance of the lossy HCG for enhancing the absorption coefficient. The voids 3922 in the Si 3914 can also behave as a good reflector to reflect photons back toward the "I" absorbing layer for a double pass (for photons illuminating from the top side). BOX or SOI 3912 can also be used in addition with the buried voids or without the buried voids, as the refractive index of $SiO_2$ is approximately 1.54, roughly half that of silicon at infrared and near infrared wavelengths.

Figure 40:
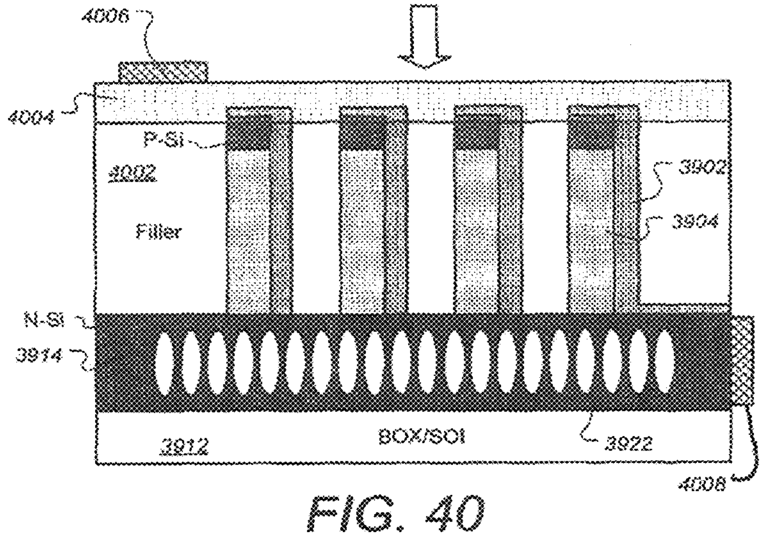
FIG. 40 is a cross section sowing the basic components for the a microstructured Si—Ge pillar hole array PD/PV and/or APD, according to some embodiments.

FIG. 40 is a cross section showing the basic components for a microstructured Si—Ge pillar hole array PD/PV and/or APD, according to some embodiments. Note that the APD multiplication layers are not shown for simplicity. Only the very basic parts of the device is shown. After processing steps shown in FIG. 39 are completed, surface passivation is carried out using thermal oxide or ALD or PECVD or CVD deposition of oxide or nitride to passivate or SiGe as a passivation layer on Ge. A filler 4002 is spun on or deposited such as spin-on-glass, or $SiO_x$, $SiN_x$ by PECVD or CVD. Using RIE to etch back to expose either the Ge or $P/P^+$ Si (during i-Ge epitaxial growth, the P dopant in the $P/P^+$ Si may diffuse into the Ge layer to also result in a $P/P^+$ Ge layer). Ge and or Si P-ohmic material may be Al, W, AuGe, Au, Au/Ti and Al, TiN, Pt, transition metal-silicide respectively; ohmic contacts to P and N semiconductors are well known in the literature and art and these are only a few examples of possible ohmic contacts. A transparent conducting oxide (TCO) 4004 such as indium tin oxide (ITO) may be used to further reduce the series resistance of the anode. For microstructured holes, since the $P/P^+$ layers are contiguous, TCO 4004 may not be used and only a perimeter (ring for circular apertured PD/APD/PV) border ohmic contact and metallization 4006 may be used instead to reduce series resistance of the ohmic contact, such as Al, Au/Ti. Cu, to name a few. Anti-reflection layers are not shown for simplicity. N ohmic material can be used on the substrate or on the $N/N^+$ layer together with metallization. Al, Pt, transition metal silicide, followed with Al or Au deposition (e-beam, sputter, thermal evaporation) on the ohmic contacts reduce series resistance. Ohmic contacts normally use an annealing process that is well known in the art. Bond and/or connecting metallization 4006 is deposited (using standard processing methods) to complete the PD/APD/PV device. Sunlight/optical signal is illuminated from the top (anode) of the device normal to the surface or at any angle off normal and may be rotated to optimize the QE. At wavelengths where Si is low loss (950-1800 nm or more) the buried voids can both reduce the effective refractive index of Si and act as a reflector to reflect photons that are not absorbed back toward the absorbing region. The surface of the N/N+ layer 3914 can be non-planar to help diffuse the reflected photons to optimize its absorption in the microstructured Si and Ge array. A contact pad 4008 can be provided, for example, on the side of layer 3914 as shown. Although many of the embodiments show the microstructures of Si and Ge, Si, Ge are normal to the surface (vertically aligned) and straight, according to some other embodiments if the N/N+ surface is non-planar, subsequent layers may also be non-planar. Etching (wet chemical or dry RIE, DRIE) may result in microstructures that are off normal and not straight (with bends) which may further improve the absorption of photons. Due to the non-planar topology of the surface, the microstructures may have various orientations depending on the orientation of the crystal within the same device. The different orientations of the microstructures are advantageous to capturing photons that may be illuminating the surface of the device at different angles, for example for PV as the sun changes position in the sky and for PD/APD for applications where multiple optical signal may illuminate the PD/APD from different angles/directions.

Microstructured Si pillar and/or hole arrays/pattern/random PD shown in FIG. 5, supra, can also have buried voids in the N/N+ layers as shown in FIG. 10 to both reduce the refractive index of Si so that the microstructures of Si pillars/holes are more optimized as lossy HCG by increasing the refractive index contrast and also as a HCG reflector in Si for wavelengths where Si has low loss, 950-1100 nm for this application as a wide bandwidth (>5 Gb/s) PD or as a PV.

The Si substrate in all the embodiments described herein can be either Si with doping, not intentionally doped, low doping, or buried oxide (BOX) or silicon on insulator (SOI) where the silicon layers again can be doped, heavily doped, lightly doped or not intentionally doped. The BOX and SOI layers allow the removal of the all or almost all of the Si substrate to reduce optical losses, increase mechanical flexibility and also the refractive index of $SiO_2$ in BOX and SOI have refractive index of approximately 1.54 in the infrared and near infrared wavelengths which is roughly half of silicon refractive index. The low index of $SiO_2$ also improves the performance of HCG, or the silicon dioxide layer can be removed for bottom illuminated PD/APD/PV.

Figure 41A:
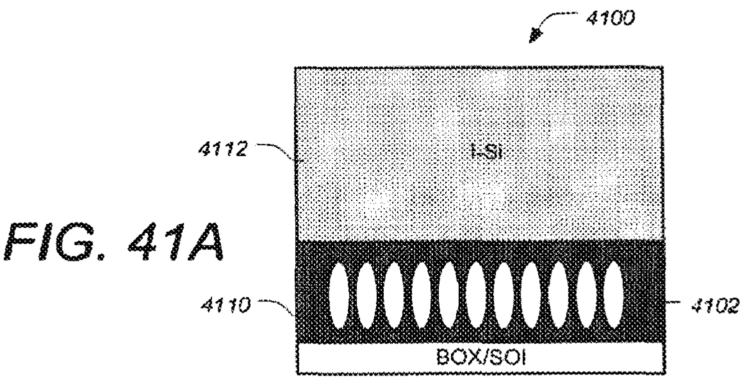
FIGS. 41A-41B are cross sections showing aspects of a microstructured pillar/hole array device above a N—Si layer having buried microstructured voids, according to some embodiments.
Figure 41B:
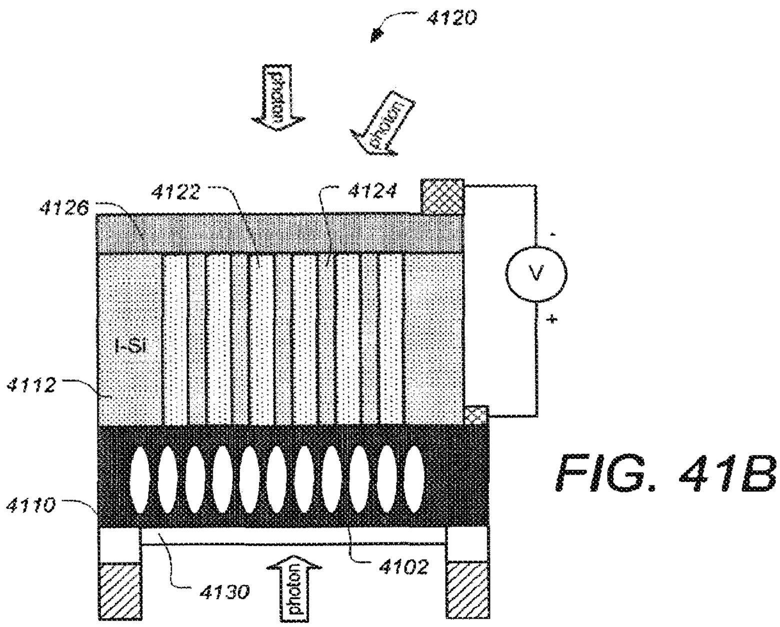

FIGS. 41A-41B are cross sections showing aspects of a microstructured pillar/hole array device above a N—Si layer having buried microstructured voids, according to some embodiments. The bulk layers 4100 shown in FIG. 41A include I—Si layer 4112 and N—Si layer 4110. Microstructured voids 4102 are formed in the N—Si layer 4110 using techniques such as described herein supra. The structures in FIGS. 41A and 41B are a version of the PDs/PVs shown in FIGS. 25A-B but with buried voids 4102 in the N/N+ layer 4110 to improve the refractive index contrast for lossy HCG (microstructures of Si and Ge) and to provide a reflector low loss HCG for photons. Pillars 4124 and/or holes 4122 arrays are formed in I—Si layer 4112. I—Ge is regrown in the etch region 4122 resulting in a buried/embedded Ge "I" layer with microstructure voids 4102 in the N Si layer 4110 to reduce the effective refractive index of Si and/or to reflect photons entering from the anode surface at wavelength where Si is low loss (950-1800 nm). Cap layer 4126 can be P-GE or P—Si regrowth. In the case of bottom illumination, an anti-reflection coating 4130 may be provided.

Figure 42C:
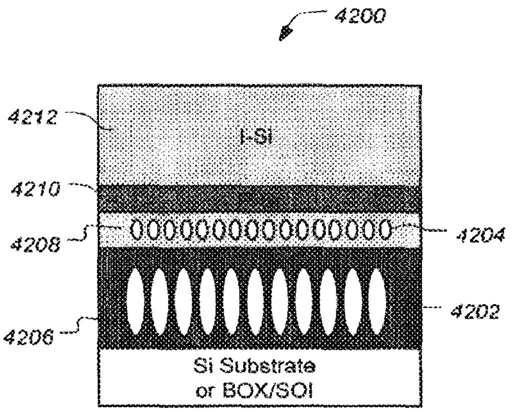

FIGS. 42A-42D are cross sections showing aspects of an APD with microstructured pillar/hole arrays above an N—Si layer having buried microstructured voids, according to some embodiments. The APDs shown in FIGS. 42A-42D are versions of the APD shown in FIGS. 24A and 24B, supra, except that buried voids 4202 are included in the N/N+ layer 4210 to improve the refractive index contrast for lossy HCG (microstructures of Si and Ge) and to provide a reflector low loss HCG for photons. According to some embodiments, BOX/SOI Si wafers can also be used with or without buried voids to improve refractive index contrast for optimal HCG lossy operation. Only the basic structures are shown for simplicity. Electrical isolation, passivations, ohmic metallization, anneal, anti reflections, bond/interconnect metallization, guard rings, to name a few are not shown. FIG. 42A shows the bulk layers 4200, which include N—Si layer 4206, I—Si layers 4208 and 4212 and P—Si layer 4210. Microstructured voids 4202 are formed in the N—Si layer 4206 using techniques such as described herein supra. As in the case of FIG. 41B, I—Ge is regrowth in the etched area 4222. The voids 4202 are to reduce the effective index of the N—Si since the optical field will be an average effective refractive index composing of air and Si. If the voids 4202 are patterned for HCG effect, photons can be reflected that are not absorbed in the first pass through the "I" absorbing region 4212 for photons illuminating the APD 4220 from the top or anode surface. The APD can also be illuminated from the bottom or cathode side.

Figure 42D:
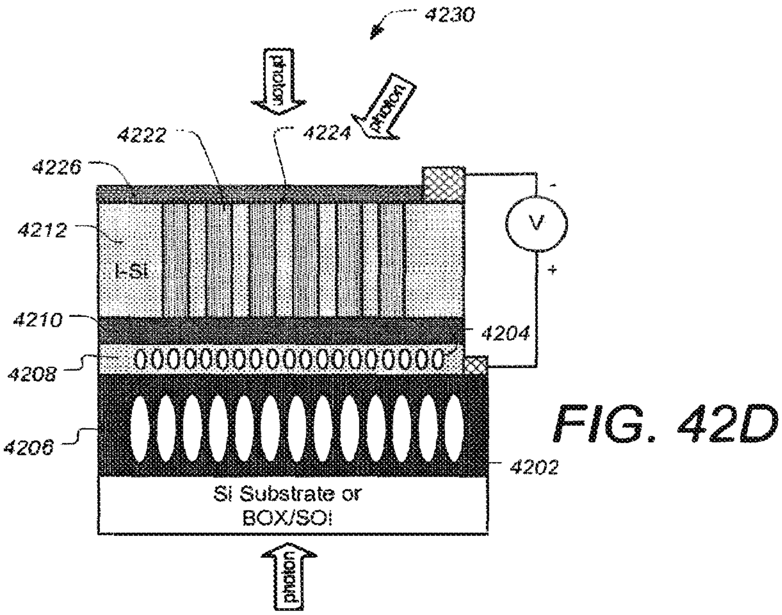

FIGS. 42C and 42D show another variation of an APD 4230 in which voids 4204 are formed in the I—Si multiplication layer 4208 as well as in N+ layer 4206 to reduce the effective refractive index and capacitance of those layers. Note that the elongated nature of the microstructured voids will have a minimal effect on charged carrier transport in the semiconductor materials. According to some embodiments, voids of various shapes and densities can be formed in the P anode, N cathode, P charge, and/or I multiplication layers of the APD in addition to the absorbing I layer. The addition of voids in the I multiplication layer 4208 and the I absorption layer 4212 can reduce the effective capacitance resulting in a short RC time constant for the device. The voids 4204 in the multiplication I Si layer 4208 also reduce the effective refractive index, which is helpful in enhancing the absorption coefficient in a HCG absorbing mode.

Epitaxial growth/regrowth/overgrowth/selective area growth/epitaxial lateral over growth of Si, Ge, SiGe, III-V such as InP, GaAs, GaN, InGaN, InGaAs, InGaAsP, InSb, heteroepitaxy, homoepitaxy, heterogeneous epitaxy to name a few, using chemical vapor deposition (CVD), metallic organic chemical vapor deposition (MOCVD), atomic layer deposition (ALD), molecular beam epitaxy (MBE), gas source molecular beam epitaxy (GSMBE) plasma enhanced chemical vapor deposition (PECVD), laser ablation deposition (LAD) to name a few, are well known in the art.

According to some embodiments, material other than Si and Ge on Si are used. For example, the techniques described herein can be applied to all combinations of Si, Ge, III-V and II-VI material families and substrates.

Figure 43:
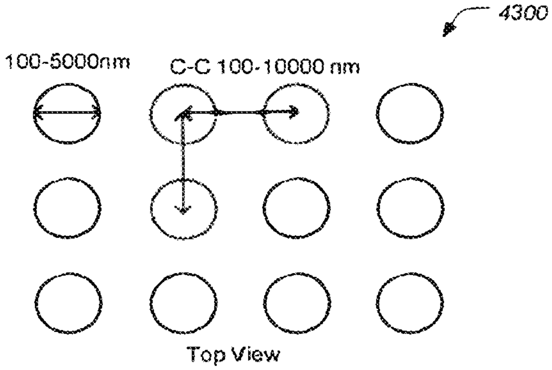
FIGS. 43-46 are top views illustrating various dimensions, spacings and shapes for microstructured elements, according to some embodiments.

FIGS. 43-46 are top views illustrating various dimensions, spacings and shapes for microstructured elements, according to some embodiments. FIG. 43 shows a microstructured pillar and/or hole array 4300 (also applicable to embedded or buried voids) that is uniformly spaced with a fixed diameter ranging from 100-5000 nm and a spacing ranging from 100-10000 nm. The pillars and or holes can be formed in or using: Si, Ge, SiGe, or other materials such as III-V or II-VI material family. Examples includes: GaAs, InP, InGaAs, InGaAsN, InGaAsP, InAs, GaN, InGaN, ZnTe, CdS, ZnSe, and HgTe. According to some embodiments, the microstructures can also be formed in or using absorbing polymers, glass, and/or ceramics.

Figure 44:
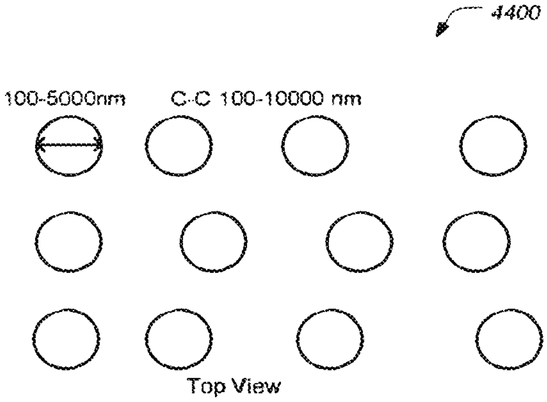
Figure 45:
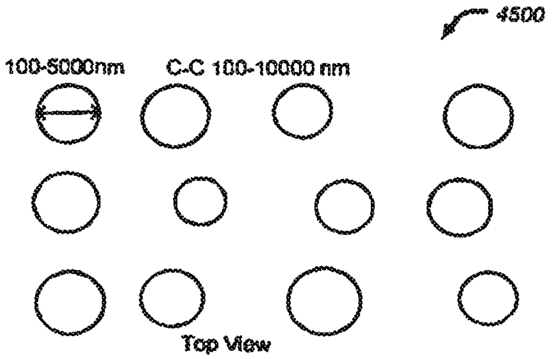
Figure 46:
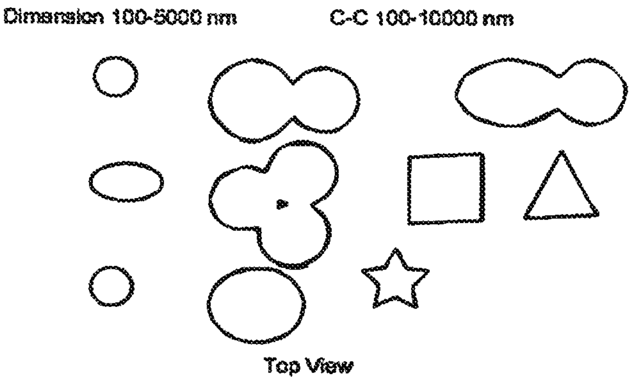

FIG. 44 shows a microstructured pillar and/or hole array 4400 having a fixed diameter but with non-uniform spacing such as aperiodic or a mixture of periodic and aperiodic or random/pseudo random spacing or a mixture of random/pseudo random, periodic and aperiodic. According to some embodiments, the arrays can also be uniformly spaced periodic but with varying diameter. FIG. 45 shows a microstructured pillar and/or hole array 4500 having both variable diameters (ranging from 100 nm to 5000 nm) and variable spacing (ranging from 100 nm to 10000 nm). According to some embodiments, the variations can be random/pseudo random, or a pattern or a mixture of patterns or any combinations thereof. FIG. 46 shows a microstructured pillar and/or hole array 4600 having various shapes such as oval, circular, rectangle, doublets, triplets, and stars. In general, any shape that can be generated using a photolithographic mask, or e-beam direct write or that can be generated with a mold for imprint lithography, can be used. The pillar/hole arrays can also have a combination of different shapes and spacings, as well as variations in the depth of the microstructured holes or lengths of the microstructured pillars/mesas. The variations can be periodic, aperiodic, or random (or a mixture of periodic, aperiodic and random) within a single array.

According to some embodiments, for some applications an array dimension of Si or Ge or III-V microstructured pillars or holes of length 2 μm approximately (or depth of 2 μm approximately) with diameter of pillar/hole of 390 nm approximately and center to center spacing of 1060 nm approximately has been found to be suitable for enhancement of the absorption coefficient of greater than 50×.

According to some embodiments, the material can be Si, Ge, SiGe, Ge on Si, III-V, II-VI, III-V on Si, polymer, glass, ceramic and any combination thereof. Examples of III-VI and II-VI are InP, GaAs, AlGaAs, AlAs, AlInAs, InGaAs, InGaAsP, InAs, InGaAsN, InN, GaN, InSb, ZnSe, ZnTe, HgTe, and CdS. Also III-V, II-VI and group IV material such as Ge can be embedded in Si microstructures using SAG, VLS, ELOG growth methods in MOCVD, CVD, MBE, reactors.

Figure 47:
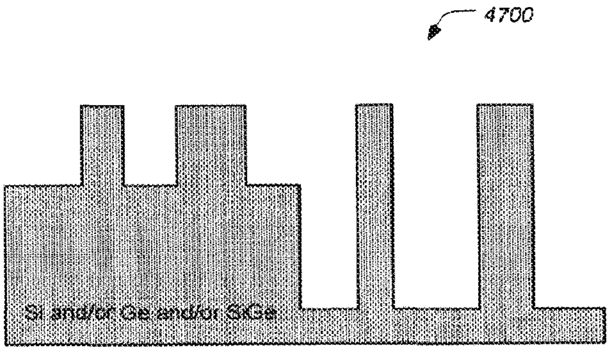
FIGS. 47-48 are cross sections showing microstructured pillar and hole arrays having varying lengths and depths, according to some embodiments.
Figure 48:
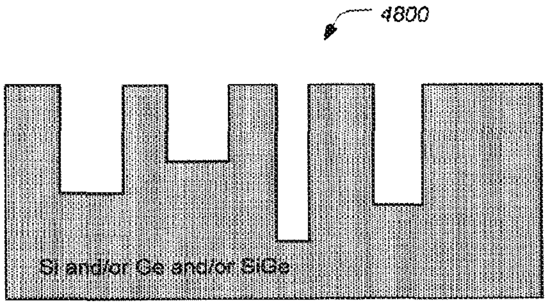

FIGS. 47-48 are cross sections showing microstructured pillar and hole arrays having varying lengths and depths, according to some embodiments. FIG. 47 shows a microstructured pillar array 4700 having different lengths, diameters and spacing. According to some embodiments, the pillar diameters range from 10 nm to 5000 nm and the pillar heights range from 0.1 to 10 microns. FIG. 48 shows a microstructured hole array 4800 having different depths, diameters and spacings. According to some embodiments, the holes have diameters ranging from 10 nm to 5000 nm and depths ranging from 0.1 to 10 microns. The variation in lengths and etched depths can be accomplished by additional lithographic masking steps where regions are masked for longer etch or shorter etch to vary the length of the pillars and the depth of the holes. The lengths and depths can be gradually or sharply varied. A patterned grating effect can be used to further optimize the optical path lengths and increase the enhancement factor for absorption coefficient. Other uses include forming a light trap by using constructive and destructive optical interference, generating a fresnel lens, matching the mode of the optical signal, forming a filter in wavelength selectivity in wavelength division multiplexing for example, or as a wavelength selector for spectroscopy and sensor applications. It should be noted that by varying the dimensions and spacing of the microstructured pillars and holes in an array can also result in constructive and destructive optical interferences that can also increase the enhancement factor of the absorption coefficient, improve light trapping, create fresnel lens, mode matching of radiation patterns of the optical signal.

FIG. 49 shows a microstructured surface having a combination of both pillars and holes, according to some embodiments. Microstructure array 4900 includes pillars and holes co-existing on the same microstructured surface either globally or locally. Both pillars and holes can exist in a single array (such as shown in FIG. 49) for the microstructured photodetector, or holes and pillars can exist on separate arrays for different microstructured photodetectors. In addition, hole(s) can exist in a pillar and pillar(s) can exist within a hole and these also can be global or local. The pillars, holes, hole(s) in pillar and pillar(s) in holes can have any shape, for example a rectangular pillar within a round hole, can have any mixture thereof to optimize enhancement of the absorption coefficient, light trapping, constructive and destructive optical interference, scattering, near field effects, linear and non-linear optical effects, subwavelengths effects, fresnel lens, wavelength selection, optical mode matching, diffraction, high contrast grating, blazed grating, high Q resonator, highly reflective mirrors using high contrast grating.

The microstructured pillar and hole (and variations thereof) arrays can be fabricated in Si, Ge, Ge on Si, SiGe on Si, SiGe on Ge. The array structure can be any combination of Si, Ge and SiGe. The array can be entirely Si or Ge or SiGe, or Ge on Si, or Si on Ge, or Ge on Si with SiGe on both. The structure can also include III-V and II-VI material systems together with Si, Ge and SiGe and any combination of Si, Ge, and III-V, II-VI material systems. According to some embodiments, the array structure can also include polymer, glass, oxides, nitrides, sulfides and chlorides of transition metals, ceramics, quartz, SOI, IOS, organic conducting and non conducting polymers, carbon based material such as graphene to name a few.

The microstructures pillars, holes, voids, and any other shapes such as pyramids, microwires, nanowires, multiple materials, SAG microstructures, can have orientations that are not perpendicular to the surface of the substrate. They can have a single or multiple orientations that can be perpendicular and or off perpendicular to the surface. They can be random or pseudo random, single pattern or multiple pattern orientations at any angle where angle can range from 0 to 90 degrees with respect to the normal to the silicon substrate, and they can be on sidewalls and on all three dimensions. With the microstructures at certain orientations, the photosensor can have a higher sensitivity to certain direction of illumination. Conversely, with multiple orientations and or random or pseudo random orientations the photosensor can be mostly insensitive to direction of illumination.

Figure 50:
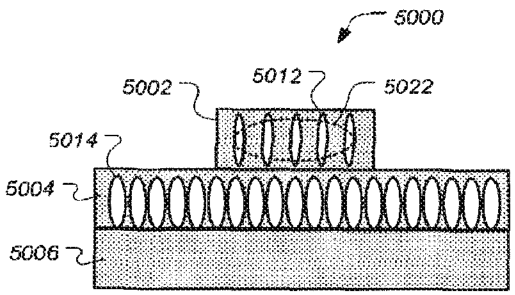
FIG. 50 is a cross section of an optical ridge waveguide, according to some embodiments.

Reducing the effective refractive index with buried voids in semiconductor has applications beyond PD/APD and PV devices. It also, for example, has applications in optical waveguides. FIG. 50 is a cross section of an optical ridge waveguide, according to some embodiments. Waveguide 5000 uses the density of voids to alter the effective refractive index of Si. According to some embodiments materials other than Si are used, for example other semiconductors such as Ge, SiGe, any of the III-V semiconductor family, or other material such as ceramics, glass, polymer. In Si photonic optical waveguide 5000, the ridge 5002 and slab 5004 are made of Si on a BOX (buried oxide) Si substrate 5006. Due to the high refractive index of Si. 3.49 at 1100-1800 nm wavelengths, the dimensional tolerance of the solid Si waveguide is very critical. Known Si photonic components are difficult to manufacture and have low yield and are temperature sensitive. According to some embodiments, voids are buried in the Si layers. By varying the density of the voids, the refractive index of the composite Si-voids can be adjusted. In the schematic diagram of FIG. 50, a ridge waveguide 5000 has voids 5014 on slab 5004, as well as voids 5012 on ridge 5002. The density of voids 5012 in the ridge 5002 is less than the density of voids 5014 in the slab 5004. The refractive index in the ridge 5002 is therefore higher than the refractive index in the slab 5004 resulting in a ridge optical waveguide. The optical mode of the waveguide 5000 is indicated by the dotted oval 5022. The lower refractive index helps in reducing the dimensional tolerance and the optical waveguide can have a larger dimension. Thus, according to some embodiments, the refractive index can be varied by varying the void density making other components such as couplers easier to manufacture. The dimensions of the voids can be subwavelength ranging from 10 nm to 1000 nm depending on optical wavelengths.

According to some embodiments, voids are also buried in a silicon wafer (including BOX/SOI silicon wafers) to adjust the effective refractive index of the Si wafer. The Si wafer with buried voids can then be the starting platform for silicon photonic circuits. It can also be the platform for large area PV cells that allow mechanical flexibility but still retain the high quality of silicon and its electrical characteristics. This can also be the platform for flexible displays and other electronics that require mechanical flexibility and or light weight. According to some embodiments, burying or embedding voids is not limited to just Si, but can include Ge, GeSi, amorphous semiconductors, III-V, II-VI material families, polymers, glass, quartz, metal, alloys, ceramics and any other material that requires flexibility. In some embodiments, the voids can be filled with gas, liquid or solid for specific applications. Gel such as spin on glass that does not require anneal for example can be used for impact/crack situations where the integrity of the device is compromised such as a crack due to impact, to seal surfaces such as semiconductors or any surfaces sensitive to environment such as moisture, water, oxygen to name a few to prevent further deterioration. Voids are also excellent in preventing crack propagation.

Figure 51:
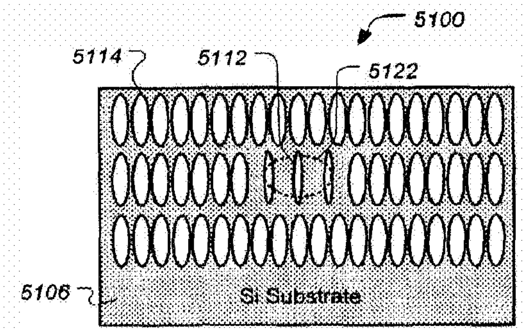
FIG. 51 is a cross section of a buried optical waveguide in silicon using voids, according to some embodiments.

FIG. 51 is a cross section of a buried optical waveguide in silicon using voids, according to some embodiments. A composite waveguide 5100 is formed in Si substrate 5106 using Si-voids to selectively alter the effective refractive index in certain locations. The effective refractive index of Si can be adjusted precisely by adjusting the total volume of the voids in a given volume of Si. In the example shown in FIG. 51, the higher density voids 5114 surround a central region of lower density voids 5112. The optical mode of the waveguide 5100 is indicated by the dotted oval 5122.

According to some embodiments, the dimension and spacing of the voids are optimized to reduce scattering losses and to provide ease of manufacturing. Also, the void dimensions and spacing can be adjusted for certain applications. For example, in HCG the dimensions and spacings are selected to satisfy the near field regime where the dimensions and spacing lie approximately between the wavelength in the high refractive index material and the wavelength in the low refractive index material. In most cases, in the applications to reduce the effective refractive index, the void and the surrounding material dimensions and spacing are in the subwavelength regime where the microstructures containing the voids are less or much less than the wavelength in either the high or low index material. For coupling applications, the diffraction regime may be the microstructure (voids and material) dimensions and spacing. It can also be a mixture of two or more regimes to optimize a device performance.

Array patterns can include microstructure ensembles whose distribution of individual microstructures can be periodic, aperiodic, chirped, random, pseudo-random, uniform, or non-uniform in all three dimensions, orientations and spacings, (including overlapping). According to some embodiments, the patterns can include microstructures within microstructures. The terms "array" and "pattern" are used herein interchangeably.

The PD/APD are biased between the anode and cathode, to extract a broadband modulation signal greater than a gigabit per second (Gb/s) at a typical transmission line impedance is 25-50 ohms. According to some embodiments, the external bias is provided with a bias-tee connected to the transmission line to block the RF signal from reaching the DC power supply and to block the DC from biasing the transmission line away from the PD/APD. The bias-tee basically consists of an inductor and capacitor, the inductor to block the RF and the capacitor to block the DC away from the PD/APD. External bias of −2 to −30 volts is applied depending on the application, PD or APD and performance desired.

In PV mode, no external bias is applied and the PV is basically a current generator. All the electrical connections are for DC current from the PV which then connects to a converter that converts the DC current/voltage to AC current/voltage.

PV devices are in DC mode whereas PD/APD for data and tele communication are all RF with modulation bandwidth ranging from 1 to 100 Gb/s. Transit time of carriers and capacitance are critical in PD and APD but not so much for PV.

The terms "modulation bandwidth" and "bandwidth" are interchangeable as used herein. Both terms refer to the modulation (e.g. of a laser or LED) where an RF signal is impressed on the light. When this modulated light (also referred to as "optical signal") illuminates the PD/APD, the RF modulated signal is extracted and converted from light to electrical signal. For example, a bandwidth or modulation bandwidth of a PD/APD of 20 Gb/s means that an RF signal impressed on the laser light beam at a data rate at 20 Gb/s can be converted by the PD/APD from optical to electrical with good signal integrity or signal replication. The laser/LED is the transmitter and the PD/APD is the receiver where the electrical signal can be further processed by an amplifier such as a transimpedance amplifier and the signal sent for further analysis and processing in application specific integrated circuits (ASIC) computers (CPU central processing unit), routers, memories, to name a few.

According to some embodiments the applications for the microstructured pillars and or holes in Si and Ge and Si regrowth with Ge, Ge on Si, with and or without buried or embedded voids photodiodes and avalanche photodiodes, are in data and tele communications. According to some embodiments, these applications include: fiber to home, local area network, data center optical interconnects board to board, on the board, rack to rack, and chip to chip, between data centers, metro area network, and optical communication for distances from less than a centimeter to over 10 kilometers or more. The applications in consumer space also includes: game box, personal computers, tablets, mobile devices such as smart phones, animations studios, and anywhere that benefits from a bandwidth of more than one gigabit per second. Other applications of the microstructured PDs and APDs, according to some embodiments, are in sensors where broadband communication is important, such as sensors for infrastructures, health, environment, oil exploration, where the sensors communicate with a remote receiver that is connected to data centers for data analysis.

Other applications of the microstructured PD and APD, according to some embodiments, are in analytical instruments and optical tests and measurement instruments where high sensitivity and bandwidth are important.

According to some embodiments, the microstructured PV have applications in energy harvesting for power generation all the way from gigawatts to watts, to power cities and homes to powering sensors. Since the microstructured PV is lightweight and high efficiency it can be used in mobile applications, space, solar transportation, recycling of photons in home, offices and factories. The PV can also be used on windows and can be semi-transparent.

The described microstructures in Si, Ge, Si regrowth with Ge, Ge on Si, pillars, holes, and voids can be any shape and form, and are not limited to the schematics shown. According to some embodiments, the dimensions range from 10-10000 nm (nanometers). The microstructures can be within each other such as pillar(s) in hole(s), hole(s) in pillar(s) and void(s) can be in the pillar, and buried and or embedded in any layer of the semiconductor heterogeneous or homogeneous. The material used includes semiconductors such as Si, Ge, GeSi, Ge on Si, and the III-V group material family of InP, GaN, InGaAsP, GaAs, and other semiconductors such as ZnO, CdTe, CuInGaSe (CIGS), amorphous Si, or any amorphous semiconductor and or microcrystalline and crystalline semiconductor. The material can be a combination of amorphous, microcrystalline, crystalline heterogeneous and or homogeneous. The material used is also not limited to semiconductors, but also include polymers, electrically conducting, semiconducting, non conducting polymers, organic and or inorganic polymers, glass, conducting, semiconducting, non conducting glass. Nanoparticles of semiconductors and or metal can also be buried in the polymer and glass. Semiconductors, polymer and glass can exist within the same microstructure, separately or in any combination.

Figure 53:
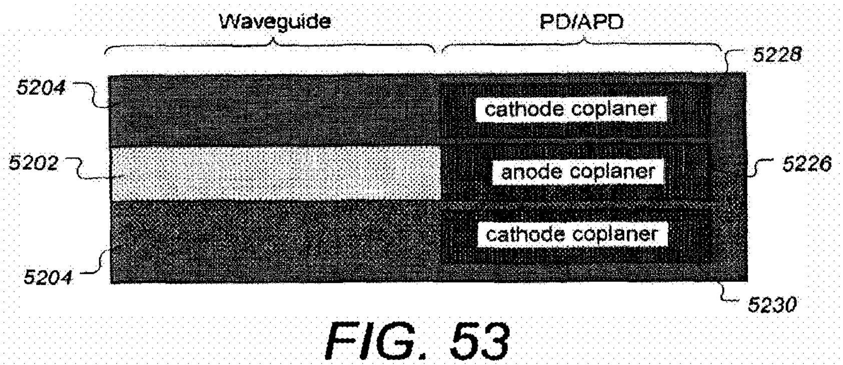

According to some embodiments, in silicon photonic circuit applications, optical waveguides such as shown in FIG. 50, supra, can be integrated with optical sources and optical detectors such as photodiodes, avalanche photodiodes and photoconductors. FIG. 52 is a cross section of a ridge waveguide integrated with a microstructured PD/APD, according to some embodiments. Device 5200 includes a ridge waveguide that is edge coupled to a microstructered Ge on Si photodiode or avalanche photodiode (with multiplication layers added). In the ridge wave guide portion, as shown in FIG. 50, a ridge 5202 has lower density voids 5212 and slab 5204 had higher density voids 5214. Ion implantation is used to increase the N doping (region 5224) for the PD and a coplanar transmission line is fabricated on the photodiode to extract the electrical signal as shown in FIG. 53, infra. Anode contact 5226 is made of P—Ge, according to some embodiments. The cathode contact is made to layer 5224 (cathode contact not shown for simplicity and clarity of drawing.)

FIG. 53 is a top view the integrated ridge waveguide and microstructured PD/APD shown in FIG. 52, according to some embodiments. The device 5200 is in a coplanar transmission line configuration. Ridge portion 5202 is 0.5 to 10 μm wide and 0.1 to 10 μm deep, according to some embodiments. Slab portion 5204 has higher density voids, as shown in FIG. 52, to vary the refractive index as a platform for silicon photonic circuits. Coplaner cathodes 5228 and 5230 are in contact with the N—Si ion implanted region 5224 shown in FIG. 52. According to some embodiments, the optical field can also be coupled evanescently by placing the PD/APD above the optical waveguide such that the optical field overlaps the absorbing I microstructures.

Figure 54A:
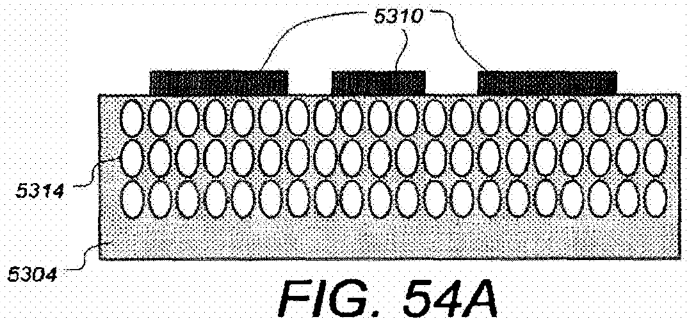
FIGS. 54A and 54B show a microwave transmission line on Si with voids, according to some embodiments.
Figure 54B:
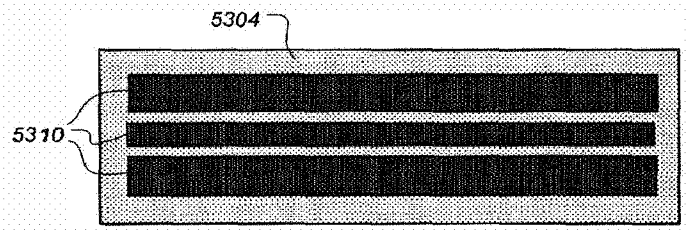

FIGS. 54A and 54B show a microwave transmission line on Si with voids, according to some embodiments. High bit rate transmission lines on silicon suffers from a multitude of effects, from slow wave to dispersion to loss. However by removing most of the silicon material with the addition of high-density voids according to some embodiments, the dispersion and loss can be alleviated and signal integrity restored. An advantage is that silicon can be the substrate for both microwave transmission line and for ICs without the use of intermediate ceramic such as alumina for transmission line to connect various IC chips. FIG. 54A is a cross section showing high density voids 5314 buried in silicon 5304 which reduce the effective dielectric constant of the silicon, and disrupt lateral electrical conductivity which in turn can result in lower microwave loss and dispersion which are important as bit rate increases into the multi Gb/s range (e.g. 40-60 Gb/s). Coplanar microwave metallic transmission lines 5310 are provided as means to move the electrical signal to/from electronic devices (e.g. processors, storage devices, input-output devices, ASICs, CPUs, and memories) on the same substrate. FIG. 54B is a top view. Conventional techniques use multi chip carriers that need additional packaging. According to some embodiments, having many devices all on the same silicon substrate greatly reduces the cost since it can be all fabricated at once and requires no additional packaging for each chip. According to some embodiments, the voids 5314 are arranged in a fashion where the path length in silicon laterally is significantly increased in order to increase lateral resistivity. According to some embodiments, Ion implantation of protons and or oxygen can be used to further increase electrical resistivity. Although FIGS. 54A and 54B show a co-planar arrangement, according to some embodiments other microwave transmission line arrangements (e.g. microstrip, slotline, and stripline) are used with a semiconductor substrate having high-density buried voids. According to some embodiments, the positioning and/or other properties (e.g. size, shape, and filling material) of the high-density voids can be selected such that the slow wave effect can be manipulated or "tuned" in a way that is suitable for the application at hand.

Figure 55:
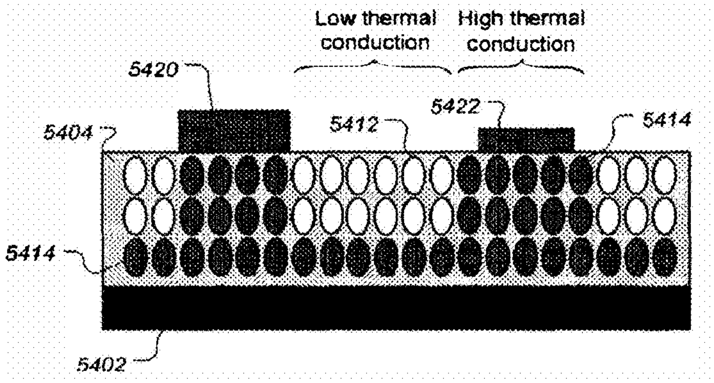
FIG. 55 is a cross section of voids for thermal conduction and thermal isolation of heat producing ICs and light emitters, according to some embodiments.

FIG. 55 is a cross section of voids for thermal conduction and thermal isolation of heat producing ICs and light emitters, according to some embodiments. The buried voids in silicon 5404 can be filled with thermal conductors such as helium gas, metal such as copper, aluminum, tungsten, or ceramic such as boron nitride, or carbon, graphene, diamond like carbon, or heterogeneous material/ceramic doped with metal nanoparticles, carbon nanotubes. The voids 5414 underneath the heat producing elements such as ICs and CPUs 5422, and light emitters 5420 such as laser diodes and bipolar drivers, can be filled with enhanced thermal conductors to extract the heat from the hot components and direct it to a heat sink 5402. Voids 5412 between hot elements are kept at a low thermal conducting state that are either in partial vacuum or filled with a gas such as nitrogen, argon, carbon dioxide, for example to prevent thermal cross talk between the hot components or to any other components where heat is not desirable. According to some embodiments, the voids are arranged in a fashion such that the path length in silicon is vastly increased to maintain low thermal crosstalk. According to some embodiments, the techniques of FIG. 55 are used to keep PVs cool when exposed to the sun. According to some embodiments, thermoelectric devices can be integrated together with the voids to generate electricity from the excess heat.

Figure 56:
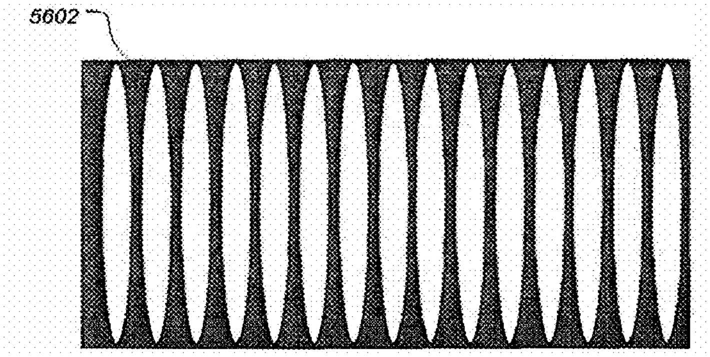
FIG. 56 is a cross section showing a distribution of voids to increase lateral path length for increasing lateral electrical resistivity and decrease lateral thermal conduction, according to some embodiments.

FIG. 56 is a cross section showing a distribution of voids to increase lateral path length for increasing lateral electrical resistivity and decrease lateral thermal conduction, according to some embodiments. The buried voids 5602 configured for microwave transmission lines and/or for thermal management can be arranged in a randomly, pseudo randomly, or in a pattern in areas where lateral electrical and thermal conductance is significantly reduced and vertical electrical and thermal conductance is significantly enhanced. There may be areas where lateral electrical and thermal conductance enhancement is desired, in which case the voids can overlap to form a conducting channel.

Figure 57A:
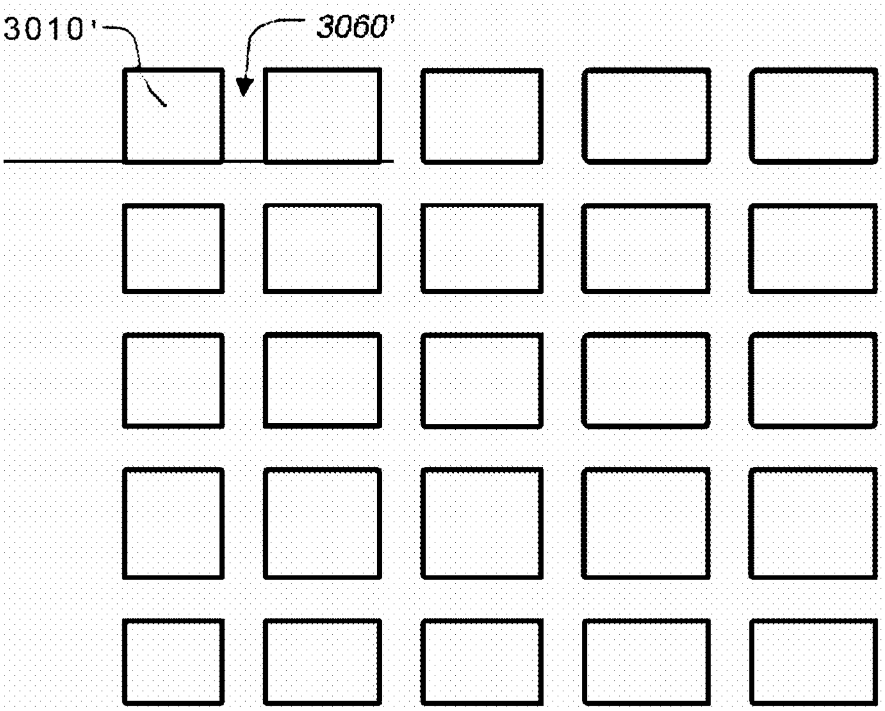
FIGS. 57A and 57B are simplified partial schematic top views of a semiconductor surface having holes configured as trenches, according to some embodiments.
Figure 57B:
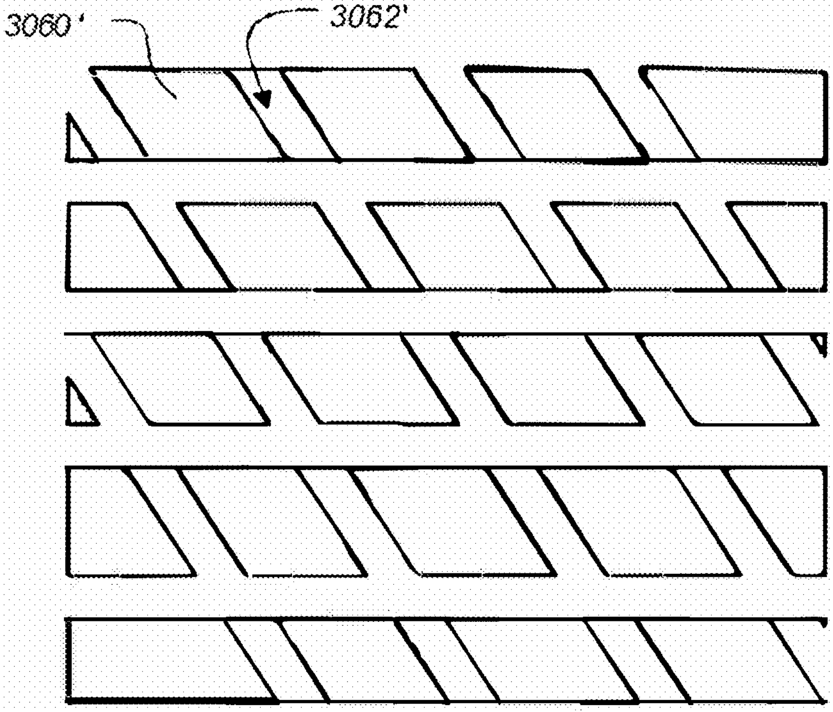

FIGS. 57A-B are simplified partial schematic top views of a semiconductor surface having holes configured as trenches, according to some embodiments. The semiconductor 3010' and 3008' can be: Si, Ge, GeSi and/or 111-V material such as InP, GaAs, GaN to name a few. In this case the microstructure "holes" are "connected" to form trenches 3060' and 3062'. The microstructure hole/trenches 3060' and 3062' are further configured to crisscross the surface of the semiconductors 3010' and 3008', respectively. Although the trench-shaped holes in FIGS. 57A-B are shown in straight lines, they could alternatively be formed in curved lines or a combination of straight and curved lines. The width of each trench is approximately one wavelength, and in some cases can be less than a wavelength, and in some cases wide ranging from 600 nm to 1600 nm, and can run the length of of the photosensitive area. The depth of the trench can range from 100 nm to 1000 nm or more, and in some cases 50 nm to 1000 nm or more, and in some cases 100 nm-600 nm.

This patent application refers to certain theories in explaining the nature and operation of devices, but it should be clear that such theories are based on current understanding and do not affect the actual operation of the disclosed devices even if future developments prove the theories incorrect. This patent specification also refers to numerical ranges of parameters, and it should be understood that insubstantial departures from such ranges are still within the spirit of the disclosed advancements.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered as illustrative and not restrictive, and the body of work described herein is not to be limited to the details given herein, which may be modified within the scope and equivalents of the appended claims.

What is claimed is:

1. A structure comprising:

an array of elongated pillars of semiconductor material in which each of at least some of the pillars has:

(i) a respective light-receiving surface, (ii) respective sides, (iii) width of 50-2000 nm, (iv) height of 100-10000 nm, and (v) at least one photodetector of Si, Ge, and/or alloyed SiGe semiconductor material formed in the pillar;

wherein each of the photodetectors:

(i) has P-doped and N-doped regions of the semiconductor material, (ii) is configured to generate electrical charge carriers in the semiconductor material of the photodetector in response to light that (a) is in the visible and infrared wavelengths, and (b) illuminates along a light direction the light-receiving surface of the pillar in which the photodetector is formed;

one or more in-pillar holes each of which:

(i) is fabricated as a recess in each of the pillars in which at least one of the photodetectors is formed, and (ii) extends along the light direction into the semiconductor material of the pillar in which the in-pillar hole is fabricated;

side-isolation comprising solid dielectric material between at least portions of the sides of at least some of the pillars;

electrical contacts configured to provide electrical pathways coupled to at least some of the photodetectors, including for selected reverse-biasing at least some of the photodetectors;

wherein the presence of the in-pillar holes increases by a factor of at least 1.1 the absorption of the light by at least some of the photodetectors relative to like photodetectors in pillars lacking said holes.

2. The structure of claim 1, in which the array is monolithically integrated with Si electronic devices.

3. The structure of claim 1, in which at least one of the in-pillar holes in each of at least some of the pillars is elongated in the light direction.

4. The structure of claim 1, in which each of at least some of the holes is elongated in a direction along the light-receiving surface of the pillar in which the hole is fabricated.

5. The structure of claim 4, in which the array is monolithically integrated with Si electronic devices.

6. The structure of claim 4, in which each of at least some of the pillars has a plurality of the elongated holes.

7. The structure of claim 4, in which each of at least some of the pillars has only one of the elongated holes.

8. The structure of claim 4, in which each of at least some of the elongated holes has at least one closed contour remote from side edges of the light-receiving surface of the pillar in which the hole is fabricated.

9. The structure of claim 1, in which each of at least some of the pillars includes only one of the photodetectors.

10. The structure of claim 1, in which two or more of the photodetectors are connected electrically in parallel.

11. The structure of claim 1, wherein the array of pillars is monolithically integrated with Si electronic devices for transmitting electrical signals related to accumulations of the charge carriers in at least some of the photodetectors.

12. The structure of claim 1, in which at least some of the holes extend 100 to 10000 nm in the light direction into the semiconductor material of the pillars in which the holes are formed.

13. The structure of claim 1, in which the pillars in which the photodetectors are formed are elongated in the light direction.

14. The structure of claim 1, in which each of at least some or the pillars is elongated in an up-down direction, and each of the one or more holes is elongated in an up-down direction and is filled with an oxide of the Si, Ge and/or SiGe alloyed semiconductor material.

15. The structure of claim 14, in which the side-isolation between at least portions of the sides of at least some of the pillars comprises an oxide of the Si, Ge and/or SiGe alloyed semiconductor material.

* * * * *